(12) United States Patent
Wang et al.

(10) Patent No.: US 11,239,235 B2
(45) Date of Patent: Feb. 1, 2022

(54) TRANSISTOR AND LOGIC GATE

(71) Applicant: Chen-Chih Wang, New Taipei (TW)

(72) Inventors: Chen-Chih Wang, New Taipei (TW); Li-Wei Ho, New Taipei (TW)

(73) Assignee: Chen-Chih Wang, New Taipei (TW)

( * ) Notice: Subject to any disclaimer, the term of this patent is extended or adjusted under 35 U.S.C. 154(b) by 120 days.

(21) Appl. No.: 16/828,939

(22) Filed: Mar. 24, 2020

(65) Prior Publication Data

US 2020/0227411 A1 Jul. 16, 2020

Related U.S. Application Data

(63) Continuation-in-part of application No. 16/053,823, filed on Aug. 3, 2018, now Pat. No. 10,644,024.

(60) Provisional application No. 62/574,758, filed on Oct. 20, 2017.

(51) Int. Cl.
| | |
|---|---|
| *H01L 27/11582* | (2017.01) |
| *H01L 27/11556* | (2017.01) |
| *H01L 27/06* | (2006.01) |
| *H01L 21/8238* | (2006.01) |
| *H01L 27/092* | (2006.01) |
| *H01L 27/118* | (2006.01) |
| *H01L 29/423* | (2006.01) |
| *H01L 29/06* | (2006.01) |

(52) U.S. Cl.
CPC ...... *H01L 27/092* (2013.01); *H01L 27/11807* (2013.01); *H01L 29/0657* (2013.01); *H01L 29/42364* (2013.01); *H01L 29/42376* (2013.01); *H01L 2027/11816* (2013.01)

(58) Field of Classification Search
CPC ............. H01L 27/092; H01L 27/11807; H01L 29/42364; H01L 29/0657; H01L 29/42376; H01L 2027/11816; H01L 27/11582; H01L 27/11556; H01L 27/11565; H01L 27/11519; H01L 27/0688; H01L 21/8221; H01L 21/823871; H01L 21/823885

See application file for complete search history.

(56) References Cited

U.S. PATENT DOCUMENTS

| | | | |
|---|---|---|---|
| 9,406,692 | B2 | 8/2016 | Lee |
| 10,192,878 | B1 | 1/2019 | Tsutsumi et al. |
| 2002/0028541 | A1 | 3/2002 | Lee et al. |
| 2011/0169067 | A1 | 7/2011 | Ernst et al. |
| 2015/0380419 | A1 | 12/2015 | Gunji-Yoneoka et al. |
| 2017/0133389 | A1 | 5/2017 | Yun et al. |
| 2017/0294445 | A1 | 10/2017 | Son et al. |
| 2019/0066818 | A1 | 2/2019 | Lee et al. |

FOREIGN PATENT DOCUMENTS

| | | |
|---|---|---|
| CN | 102157568 A | 8/2011 |
| CN | 102986028 A | 3/2013 |
| CN | 103871892 A | 6/2014 |
| CN | 104969351 A | 10/2015 |
| JP | H05291583 A | 11/1993 |
| JP | 2014140054 A | 7/2014 |
| JP | 2017050527 A | 3/2017 |

*Primary Examiner* — David Vu
(74) *Attorney, Agent, or Firm* — CKC & Partners Co., LLC

(57) ABSTRACT

A transistor includes a substrate having a plurality of source/drain regions and a channel region between the source/drain regions, a gate, and a gate dielectric layer between the gate and the substrate. The substrate tapers in a direction away from the gate dielectric layer in top view. The gate is embedded in the gate dielectric layer. The transistor structure density can be improved.

20 Claims, 51 Drawing Sheets

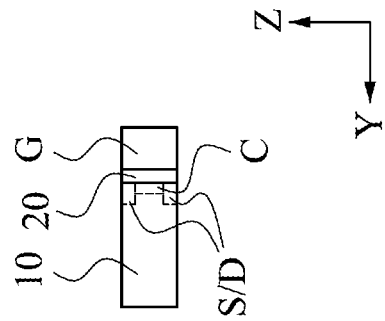
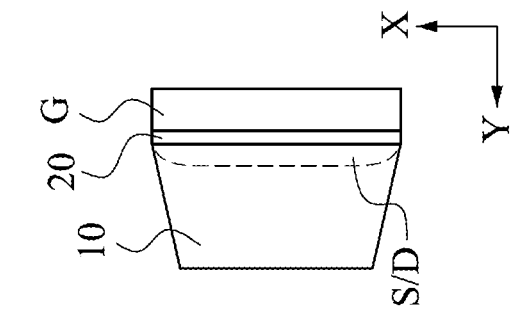
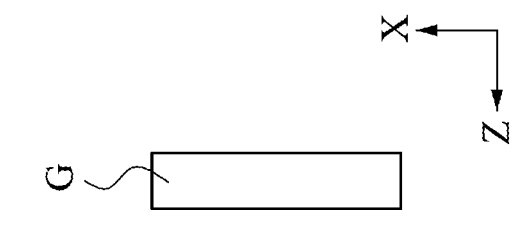

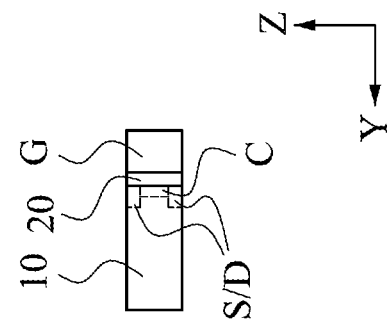
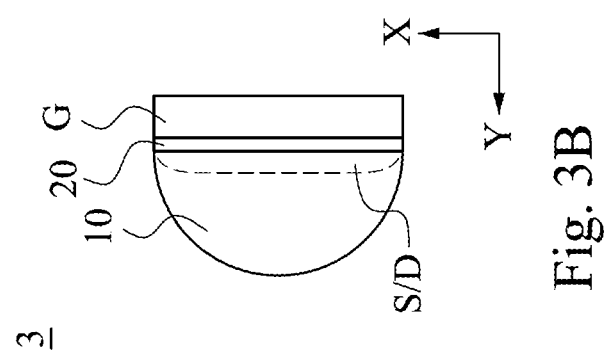
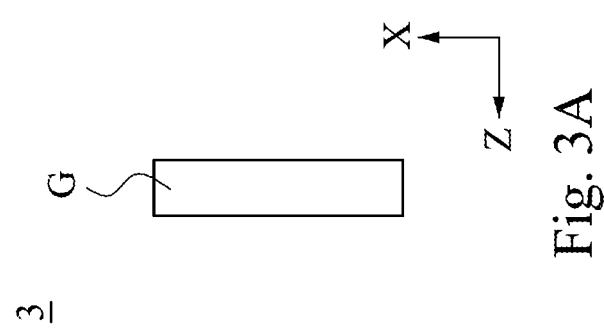
Fig. 3C
Fig. 3B
Fig. 3A

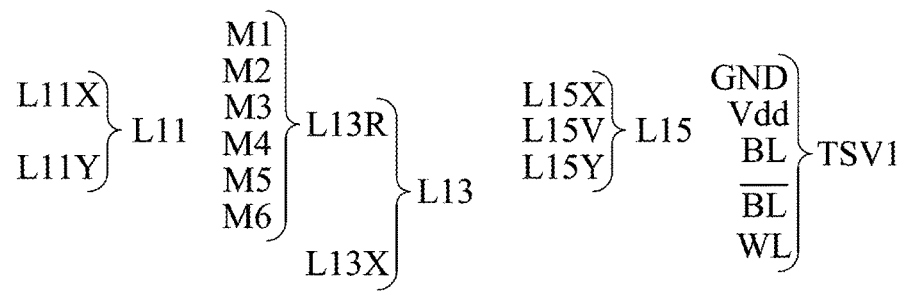
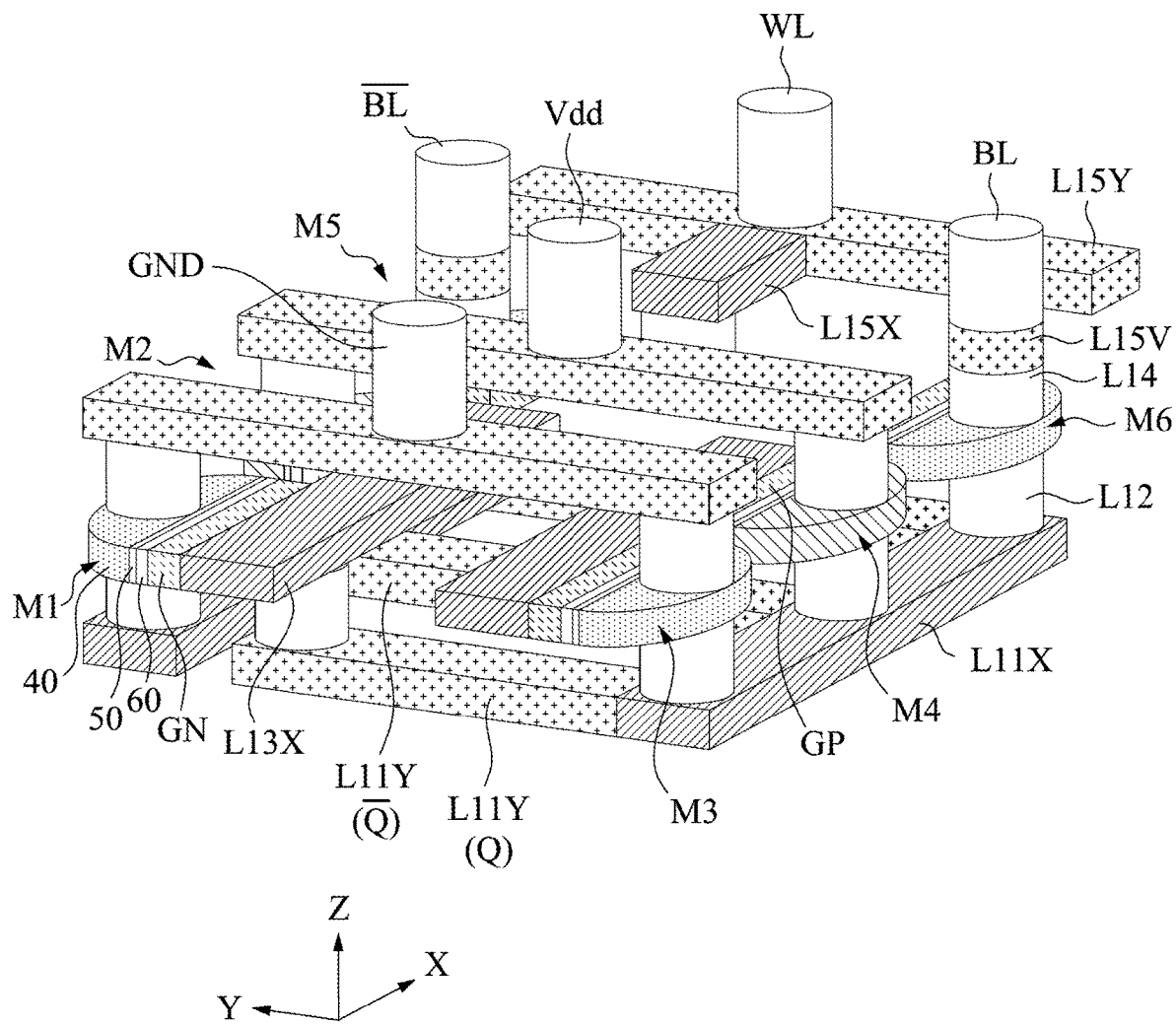
Fig. 9D

TRANSISTOR AND LOGIC GATE

RELATED APPLICATIONS

This application is a Continuation-in-part of U.S. application Ser. No. 16/053,823, filed on Aug. 3, 2018, which claims priority of U.S. Provisional Application Ser. No. 62/574,758, filed on Oct. 20, 2017, the entirety of which is incorporated by reference herein in their entireties.

BACKGROUND

Technical Field

The present disclosure relates to a transistor and a logic gate.

Description of Related Art

Semiconductor memory devices may be classified into two categories, volatile memory devices and nonvolatile memory devices. In contrast to volatile memory devices, nonvolatile memory devices are widely used in solid state devices (SSD) and cloud storage because nonvolatile memory devices do not require power to retain data. Flash memory is a type of nonvolatile memory devices and has various advantages, such as high integration, fast access speed, easy to program, erase and read. In order to further increase the bit density in flash memory and to lower bit cost, a 3D-NAND flash memory has emerged as a promising candidate in a future nonvolatile memory device.

SUMMARY

According to some embodiments, a transistor includes a substrate having a plurality of source/drain regions and a channel region between the source/drain regions, a gate, and a gate dielectric layer between the gate and the substrate. The substrate tapers in a direction away from the gate dielectric layer in top view. The gate is embedded in the gate dielectric layer.

In some embodiments, the gate dielectric layer, the substrate and the gate form a semi-elliptical profile in top view.

In some embodiments, the gate dielectric layer is embedded in the substrate.

In some embodiments, the gate includes a convex surface interfaced with the gate dielectric layer.

In some embodiments, the substrate comprises a concave surface interfaced with the gate dielectric layer.

In some embodiments, the gate and the substrate respectively comprise a convex surface and a concave surface, and the gate dielectric layer is between the convex surface and the concave surface.

In some embodiments, the transistor further includes a first isolation layer in which the substrate is embedded, wherein the first isolation layer has a serpentine shape in top view.

In some embodiments, the transistor further includes a second isolation layer, wherein the gate is between the second isolation layer and the gate dielectric layer, and the second isolation layer has a different shape from the first isolation layer in top view.

In some embodiments, the second isolation layer has a stripe shape in top view.

In some embodiments, the substrate tapers to a point.

According to some embodiments, a logic gate includes a first sub-layer, a second sub-layer, a third sub-layer, a fourth sub-layer, a fifth sub-layer and a through-silicon via. The first sub-layer includes a first conductive connection element. The second sub-layer via is disposed over the first sub-layer. The second sub-layer includes a first via vertically connected to the first s conductive connection element. The third sub-layer is disposed over the second sub-layer and includes a transistor region and a second conductive connection element horizontally connected to the transistor region. The first via is vertically connected to the transistor region. The transistor region includes a plurality of above-mentioned transistors. The fourth sub-layer includes a second via vertically connected to the third sub-layer. The fifth sub-layer is disposed over the fourth sub-layer and includes a third conductive connection element. The second via is vertically connected to the third conductive connection element. The through-silicon via is vertically connected to the third conductive connection element.

In some embodiments, the first sub-layer, the second sub-layer, the third sub-layer, the fourth sub-layer, the fifth sub-layer and the through-through silicon via are stacked in sequence.

In some embodiments, the third sub-layer further includes an input terminal that is horizontally connected to the second conductive connection element.

In some embodiments, the transistors include a PMOS transistor and a NMOS transistor, a gate of the PMOS transistor is connected to a gate of the NMOS transistor through the second conductive connection element. The gate of the PMOS transistor and the gate of the NMOS transistor are as inputs.

In some embodiments, the first sub-layer includes an output terminal horizontally connected to the first conductive connection element. A drain region of the PMOS transistor and a drain region of the NMOS transistor are as outputs.

In some embodiments, the transistors include at least two PMOS transistors and at least two NMOS transistors. The PMOS transistors are electrically connected in parallel and the transistors are electrically connected in series.

In some embodiments, the first sub-layer includes an output terminal horizontally connected to the first conductive connection element.

In some embodiments, the transistors include at least two PMOS transistors and at least two NMOS transistors. The PMOS transistors are electrically connected in series and the NMOS transistors are electrically connected in parallel.

In some embodiments, the fifth sub-layer includes an output terminal horizontally connected to the third conductive connection element.

In some embodiments, the transistors of the third sub-layer include a first transistor, a second transistor, a third transistor, a fourth transistor, a fifth transistor, and a sixth transistor. The first transistor and the second transistor define to a first inverter, and the third transistor and the fourth transistor define a second inverter. The first inverter and the second inverter are cross-coupled. The first inverter and the second inverter are electrically connected to the sixth transistor and the fifth transistor through the first sub-layer and the second sub-layer, respectively.

Embodiments of the present disclosure offer advantages, though it is understood that other embodiments may offer different advantages, not all advantages are necessarily discussed herein, and no particular advantage is required for all embodiments.

It is to be understood that both the foregoing general description and the following detailed description are by examples, and are intended to provide further explanation of the invention as claimed.

BRIEF DESCRIPTION OF THE DRAWINGS

Embodiments of the present disclosure can be more fully understood by reading the following detailed description of the embodiment, with reference made to the accompanying drawings as follows.

FIG. 2A is a side view of another FanFET in accordance with some embodiments of the present disclosure, FIG. 2B is a top view of the FanFET as shown in FIG. 2A, and FIG. 2C is a cross-sectional view of the FanFET as shown in FIG. 2A.

FIG. 3A is a side view of another FanFET in accordance with some embodiments of the present disclosure, FIG. 3B is a top view of the FanFET as shown in FIG. 3A, and FIG. 3C is a cross-sectional view of the FanFET as shown in FIG. 3A.

FIG. 9D and FIG. 9E are schematic views of a SRAM.

DETAILED DESCRIPTION

Figure 1C:
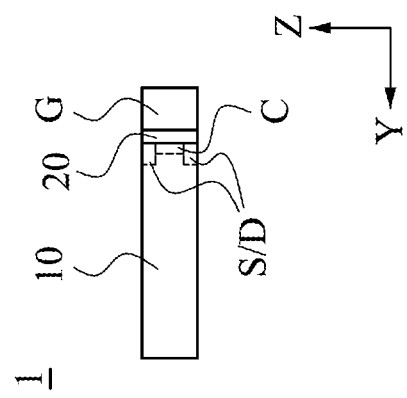
FIG. 1C is a cross-sectional view of the FanFET as shown in FIG. 1A.

Reference will now be made in detail to the present embodiments of the invention, examples of which are illustrated in the accompanying drawings. Wherever possible, the same reference numbers are used in the drawings and the description to refer to the same or like parts.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
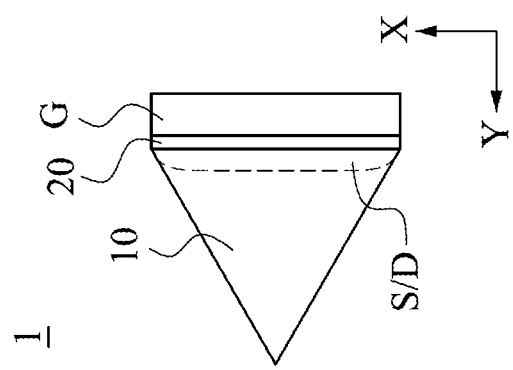
FIG. 1B is a top view of the FanFET as shown in FIG. 1A.
Figure 1A:
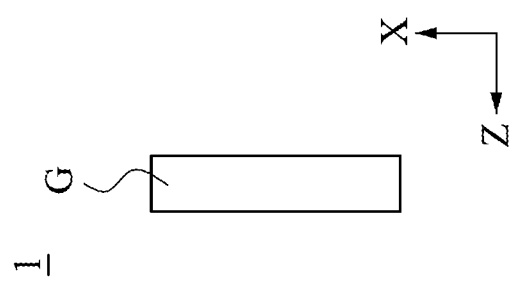
FIG. 1A is a side view of a fan structure field effect transistor (FanFET) in accordance with some embodiments of the present disclosure.

FIGS. 1A to 1C, 2A to 2C, and 3A to 3C are various types of the fan structure field effect transistor (FanFET). FanFET is applied for integrated circuits of transistor and memory cell. FIGS. 1A, 2A, and 3A are side views of various types of FanFET in accordance with some embodiments of the present disclosure. FIGS. 1B, 2B, and 3B each are top views of various types of FanFET in accordance with some embodiments of the present disclosure. FIGS. 1C, 2C, and 3C are cross-sectional views of various types of FanFET in accordance with some embodiments of the present disclosure.

Referring to FIGS. 1A-1C, a FanFET 1 includes a substrate 10, source/drain regions S/D and a channel region C in the substrate 10, a gate G and a dielectric layer 20 (referred to as a gate dielectric layer in this context) between the gate G and the substrate 10. The substrate 10 tapers in a direction away from the dielectric layer 20. The substrate 10 tapers to a point in some embodiments. For example, in the embodiments as illustrated in FIG. 1B, the shape of the substrate 10 may be equilateral triangle, acute triangle and obtuse triangle in top view in some embodiments. The channel region C is between the source/drain regions S/D and doped with a dopant of a different type from that of the source/drain regions S/D. Optionally, a region of the substrate 10 that is away from the channel region C and the source/drain regions S/D can be doped with a suitable dopant. The dielectric layer 20 is in contact with a sidewall proximate the source/drain regions S/D and the channel region C in the substrate 10. The gate G is in contact with the dielectric layer 20.

In some embodiments, the substrate 10 is made of, for example, polysilicon. The source/drain regions S/D are doped with an n-type dopant (e.g., phosphorus or arsenic) or a p-type dopant (e.g., boron). The channel region C is doped with a dopant of a different conductivity from the source/drain regions S/D. A region of the substrate 10 that is away from the channel region C and the source/drain regions S/D can be optionally doped with the same dopant as the channel region C.

In some embodiments, the dielectric layer 20 is a single-layered film or a multi-layered film. For example, the dielectric layer 20 is a single oxide layer in some embodiments, and in other embodiments, the dielectric layer 20 is a two-layered film made of an oxide layer (referred to a tunnel oxide in some embodiments) and a nitride layer between the oxide layer and the gate G. In some embodiments, the dielectric layer 20 is a high-k dielectric layer or a combination with a multi-layered film. For example, the dielectric layer 20 may include one layer of metal oxide or a silicate of Hf, Al, Zr, combinations thereof. Other suitable materials include La, Mg, Ba, Ti, Pb, Zr, in the form of metal oxides, metal alloy oxides, and combinations thereof. Exemplary materials include $MgO_x$, $BaTi_xO_y$, $BaSr_xTi_yO_z$, $PbTi_xO_y$, $PbZr_xTi_yO_z$, SiCN, SiON, SiN, $Al_2O_3$, $La_2O_3$, $Ta_2O_5$, $Y_2O_3$, $HfO_2$, $ZrO_2$, HfSiON, $YGe_xO_y$, $YSi_xO_y$, and $LaAlO_3$, and the like.

In some embodiments, the gate G is made of a conductive material, such as doped polysilicon, tantalum nitride (TaN), other conductive nitride, tungsten, other metal or combinations thereof. For example, the gate G is made of TaN.

FIGS. 2A-2C illustrate another FanFET, FanFET 2, which shares many features of FanFET 1, except for a shape of the substrate 10. In some embodiments as illustrated in FIGS. 2A-2C, the shape of the substrate 10 is trapezoidal in top view in some embodiments. In greater detail, the substrate 10 includes a long base in contact with the dielectric layer 20 and a short base that is shorter than the long base and distal from the dielectric layer 20. As a result of the trapezoidal shape, the substrate 10 as illustrated in FIG. 2B tapers in a direction away from the dielectric layer 20 as well.

FIGS. 3A-3C illustrate another FanFET, FanFET 3, which shares many features of FanFET 1, except for a shape of the substrate 10. In some embodiments as illustrated in FIGS. 3A-3C, the shape of the substrate 10 is semi-sphere, semi-elliptical, semi-cylinder, semi-ellipsoid, semi-ellipsoid cylinder-like (SECL), and the like in some embodiments. As a result of the semi-sphere shape, the substrate 10 as illustrated in FIG. 3B tapers in a direction away from the dielectric layer 20 as well.

Figure 4C:
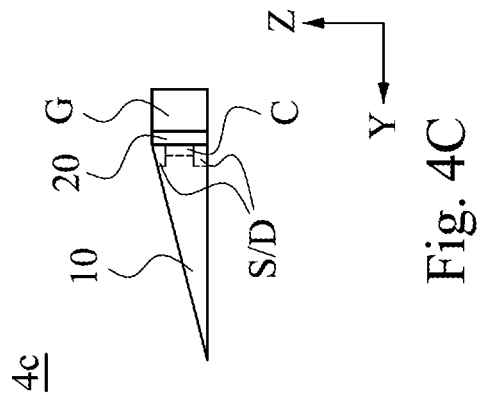
FIGS. 4A, 4B, 4C, 5A, 5B, 6A, 6B and 6C are cross-sectional views of FanFETs in accordance with some embodiments of the present disclosure.
Figure 4B:
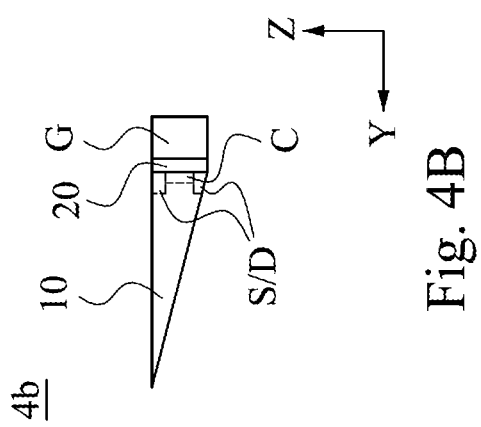
Figure 4A:
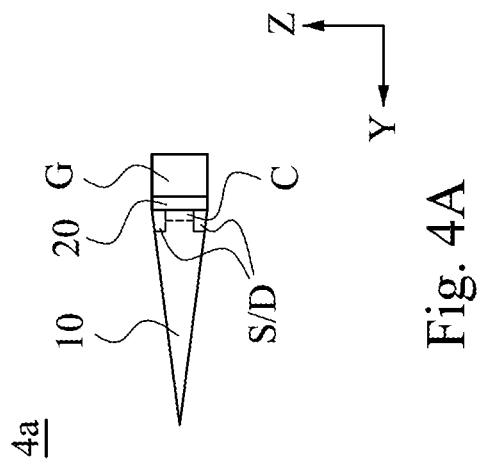

FIGS. 4A to 4C, 5A to 5B, 6A to 6C, and 7 are various types of FanFETs in accordance with some embodiments of the present disclosure. FIG. 4A illustrates another FanFET, FanFET 4a, which shares many features of FanFETs 1, 2, and/or 3 as illustrated in FIGS. 1A-1C, 2A-2C and 3A-3C, except for a shape of the substrate 10 in cross-sectional view. In some embodiments as illustrated in FIG. 4A, the shape of the substrate 10 is triangle in cross-sectional view. In greater detail, the triangular substrate 10 has two sloped sides meeting at a pointed end farthest from the dielectric layer 20 in cross-sectional view. FIG. 4B illustrates another FanFET, FanFET 4b, which shares many features of FanFET 4a, except for a shape of the substrate 10 in cross-sectional view. In greater detail, the triangular substrate 10 has a substantially straight side and a sloped side meeting at a pointed end farthest from the dielectric layer 20, and the substantially straight side is in a position higher than the sloped side in cross-sectional view. FIG. 4C illustrates another FanFET, FanFET 4c, which shares many features of FanFET 4b, except for a shape of the substrate 10 in cross-sectional view. In greater detail, the triangular substrate 10 has a substantially straight side and a sloped side meeting at a pointed end farthest from the dielectric layer 20 in cross-sectional view, and the substantially straight side is in a position lower than the sloped side in cross-sectional view.

Figure 5B:
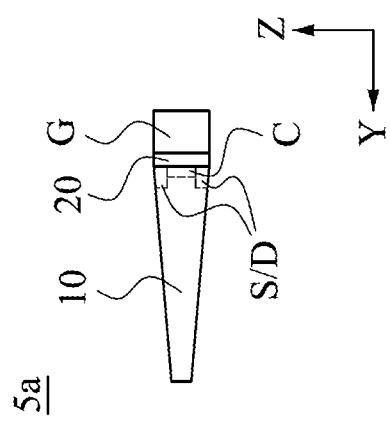
Figure 5A:
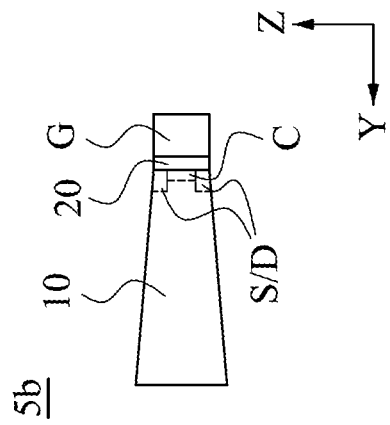

FIG. 5A illustrates another FanFET, FanFET 5a, which shares many features of FanFETs 1, 2 and/or 3 as illustrated in FIGS. 1A-1C, 2A-2C and 3A-3C, except for a shape of the substrate 10 in cross-sectional view. In some embodiments as illustrated in FIG. 5A, the shape of the substrate 10 is trapezoidal in cross-sectional view. In greater detail, the trapezoidal substrate 10 has a long base in contact with the dielectric layer 20 and a short base farthest from the dielectric layer 20 in cross-sectional view. It is understood that if the FanFET 5a has a top view profile as illustrated in FIG. 1B or 3B, the short base of the trapezoidal substrate 10 in cross-sectional view resembles a line in a perspective view. On the contrary, if the FanFET 5a has a top view profile as illustrated in FIG. 2B, the short base of the of the trapezoidal substrate 10 in cross-sectional view resembles a surface in a perspective view.

FIG. 5B illustrates another FanFET, FanFET 5b, which shares many features of FanFET 5a, except for a shape of the substrate 10 in cross-sectional view. In greater detail, the trapezoidal substrate 10 as illustrated in FIG. 5B has a short base in contact with the dielectric layer 20 and a long base farthest from the dielectric layer 20. It is understood that if the FanFET 5b has a top view profile as illustrated in FIG. 1B or 3B, the long base of the trapezoidal substrate 10 in cross-sectional view resembles a line in a perspective view. On the contrary, if the FanFET 5b has a top view profile as illustrated in FIG. 2B, the long base of the trapezoidal substrate 10 in cross-sectional view resembles a surface in perspective view.

Figure 6A:
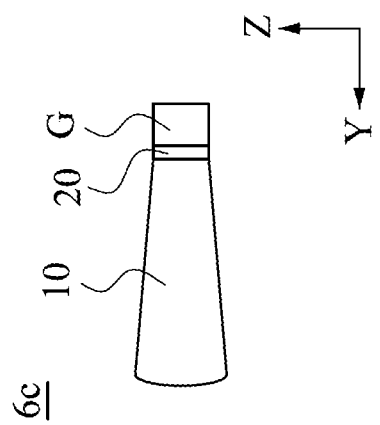
Figure 6B:
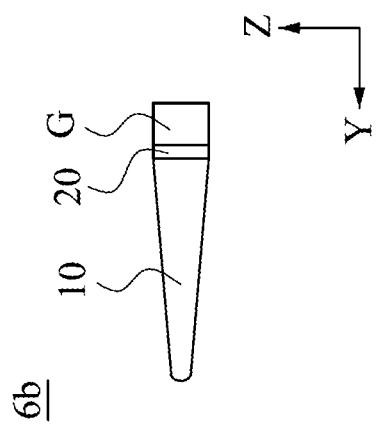
Figure 6C:
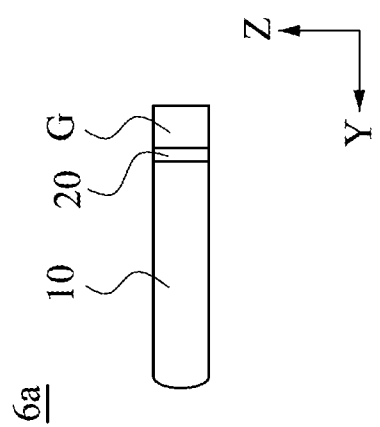

FIG. 6A illustrates another FanFET, FanFET 6a, which shares many features of FanFETs 1, 2 and/or 3 as illustrated in FIGS. 1A-1C, 2A-2C and 3A-3C, except for a shape of the substrate 10 in cross-sectional view. In some embodiments as illustrated in FIG. 6A, the substrate 10 has a curved end farthest from the dielectric layer 20 in cross-sectional view. FIG. 6B illustrates another FanFET, FanFET 6b, which shares many features of FanFET 6a, except for a shape of the substrate 10 in cross-sectional view. In greater detail, the substrate 10 tapers in a direction away from the dielectric layer 20 and also has a curved end farthest from the dielectric layer 20 in cross-sectional view. FIG. 6C illustrates another FanFET, FanFET 6c, which shares many features of FanFET 6a, except for a shape of the substrate 10 in cross-sectional view. In greater detail, the substrate 10 tapers in a direction toward the dielectric layer 20 and also has a curved end farthest from the dielectric layer 20 in cross-sectional view.

Figure 7:
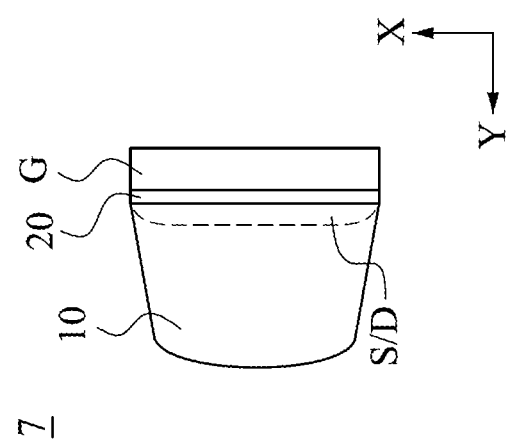
FIG. 7 is a top view of a FanFET in accordance with some embodiments of the present disclosure.

FIG. 7 illustrates another FanFET, FanFET 7, which shares many features of FanFETs 1, 2, 3, 4a-4c, 5a-5b, and/or 6a-6c as illustrated in FIGS. 1A-1C, 2A-2C, 3A-3C, 4A-4C, 5A-5B and 6A-6C, except for a shape of the substrate 10 in top view. In some embodiments as illustrated in FIG. 7, the substrate 10 tapers in a direction away from the dielectric layer 20 and further has a curved end in top view.

It is understood that all geometries illustrated in FIGS. 1A-1C, 2A-2C, 3A-3C, 4A-4C, 5A-5B, 6A-6C and 7 are only examples of the FanFET, not limiting the claimed scope. Any other variation of the FanFET should be included in the claimed scope.

Figure 8:
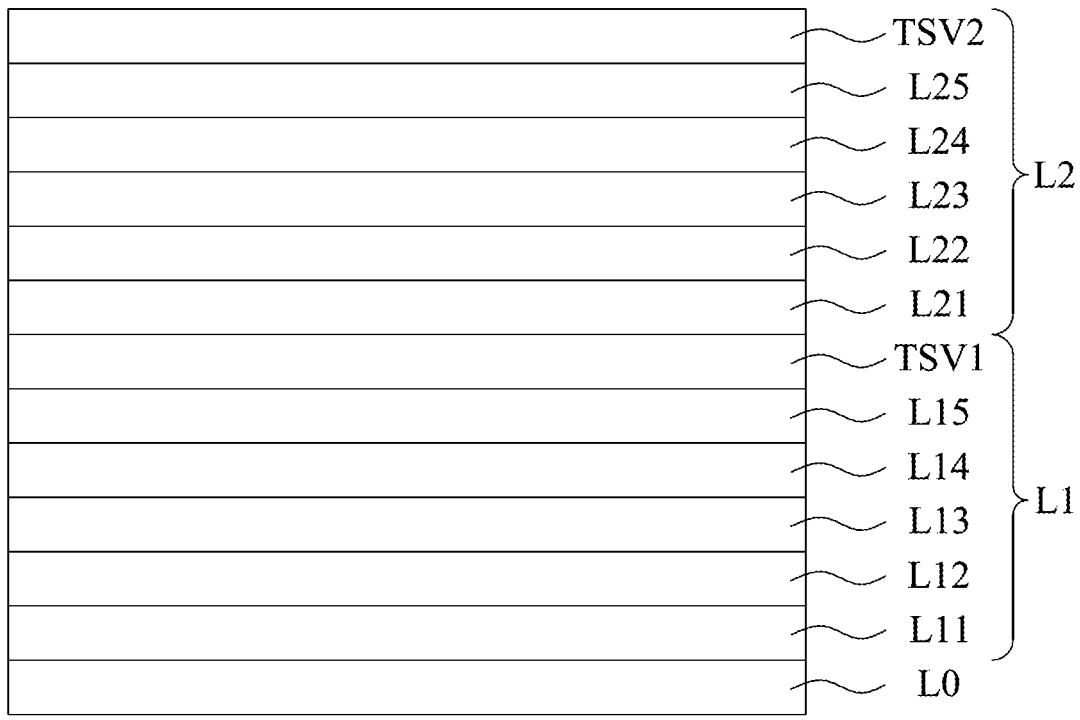
FIG. 8 is a schematic view of a fabrication of a digital circuit stacked set for layer by layer in accordance with some embodiments of the present disclosure.

FIG. 8 is a schematic view of a fabrication of a digital circuit stacked set for layer by layer in accordance with some embodiments of the present disclosure. Referring to FIG. 8, the digital circuit stacked set includes a ground layer L0, a first layer L1 and a second layer L2. The digital circuit stacked set may include more than three layers. The ground layer L0 may include a ground line (GND). The first layer L1 includes a first sub-layer L11, a second sub-layer L12, a third sub-layer L13, a fourth sub-layer L14, a fifth sub-layer L15 and a through-silicon via TSV1. In greater details, a logic gate may include the ground layer L0 and the first layer L1. The first sub-layer L11 may include a first conductive connection element. In some embodiments, the ground layer is vertically connected to the first sub-layer L11. The second sub-layer L12 is disposed over the first sub-layer L11. The third sub-layer L13 is disposed over the second sub-layer L12. The fourth sub-layer L14 is disposed over the third sub-layer L13. The fifth sub-layer L15 is disposed over the fourth sub-layer L14. The through-silicon via TSV1 is disposed over the fifth sub-layer L15. The first sub-layer L11, the second sub-layer L12, the third sub-layer L13, the fourth sub-layer L14, the fifth sub-layer L15 and the through-silicon via TSV1 are stacked in sequence.

The first sub-layer L11 may include a conductive connection element and an output terminal. In greater details, the conductive connection element of the first sub-layer L11 may include a conductive connection line and a conductive connection via. The conductive connection line may include a longitudinal conductive connection line and a transversal conductive connection line. For example, the longitudinal conductive connection line is along X axis, the transversal conductive connection line is along Y axis, and the conductive connection via is along Z axis.

The second sub-layer L12 may include a via. The via of the second sub-layer L12 is vertically connected to the conductive connection element of the first sub-layer L11. In greater details, the via of the second sub-layer L12 is along Z axis which is vertically connected to the conductive connection line and the conductive connection via of the first sub-layer L11.

The third sub-set layer L13 may include a transistor region, a conductive connection element and an input terminal. The via of the second sub-layer L12 is vertically connected to the transistor region of the third sub-set layer L13. The transistor region of the third sub-set layer L13 may include the transistor (FanFET) and have the geometries illustrated in FIGS. 1A-1C, 2A-2C, 3A-3C, 4A-4C, 5A-5B, 6A-6C and 7, which respectively corresponds to the FanFET 1, 2, 3, 4a-4c, 5a, 5b, 6a-6c and 7. The transistors of the transistor region of the third sub-set layer L13 may include the gates G illustrated in FIGS. 1A-1C, 2A-2C, 3A-3C, 4A-4C, 5A-5B, 6A-6C and 7.

Similarly, the conductive connection element of the third sub-set layer L13 may include a conductive connection line and a conductive connection via. The conductive connection line may include a longitudinal conductive connection line and a transversal conductive connection line. For example, the longitudinal conductive connection line is along X axis, the transversal conductive connection line is along Y axis, and the conductive connection via is along Z axis.

The fourth sub-layer L14 may include a via. The via of the fourth sub-layer L14 is vertically connected to the third sub-layer L13. For example, the via of the fourth sub-layer L14 is vertically connected to the transistor region of the third sub-layer L13.

The fifth sub-layer L15 may include a conductive connection element. In greater details, the conductive connection element of the fifth sub-layer L15 may include a conductive connection line and a conductive connection via. The conductive connection line may include a longitudinal conductive connection line and a transversal conductive connection line. For example, the longitudinal conductive connection line is along X axis, the transversal conductive connection line is along Y axis, and the conductive connection via is along Z axis. In some embodiments, the fifth sub-layer L15 may include an output terminal horizontally connected to the conductive connection element of the fifth sub-layer L15.

The through-silicon via TSV1 may be vertically connected to the conductive connection element of the fifth sub-layer L15. In some embodiments, the through-silicon via TSV1 may serve as bias. For example, the through-silicon via TSV1 may include a positive supply voltage (Vdd), a power level, a ground line (GND), a word line, a bit line, or a bit line bar.

In some embodiments, the conductive connection elements of the first sub-layer L11, the third sub-layer L13 and the fifth sub-layer L15 may be made of polysilicon materials. The gate of the transistor region of the third sub-layer L13 may be made of polysilicon materials. The second sub-layer L12 and the fourth sub-layer L14 may include an isolation layer and a conductive via in the isolation layer. The through-silicon via TSV1 may include an isolation layer and a conductive via in the isolation layer.

The second layer L2 includes a first sub-layer L21, a second sub-layer L22, a third sub-layer L23, a fourth sub-layer L24, a fifth sub-layer L25 and a through-silicon via TSV2. Similarly, the second sub-layer L22 is disposed over the first sub-layer L21, the third sub-layer L23 is disposed over the second sub-layer L22, the fourth sub-layer L24 is disposed over the third sub-layer L23, the fifth sub-layer L25 is disposed over the fourth sub-layer L24, and the through-silicon via TSV2 is disposed over the fifth sub-layer L25.

It is to be noted that the configurations of the first sub-layer L21, the second sub-layer L22, the third sub-layer L23, the fourth sub-layer L24, the fifth sub-layer L25 and the through-silicon via TSV2 are respectively similar to the first sub-layer L11, the second sub-layer L12, the third sub-layer L13, the fourth sub-layer L14, the fifth sub-layer L15 and the through-silicon via TSV1, and the description is not repeated hereinafter.

The digital circuit stacked set for layer by layer as shown in FIG. 8 may be applied to logic gate, such as inverter, buffer, OR gate, XOR gate, NOR gate, XNOR gate, AND gate, NAND gate, SRAM, and so on. Further, the aforementioned FanFET can be applied to an analog circuit.

Figure 9A:
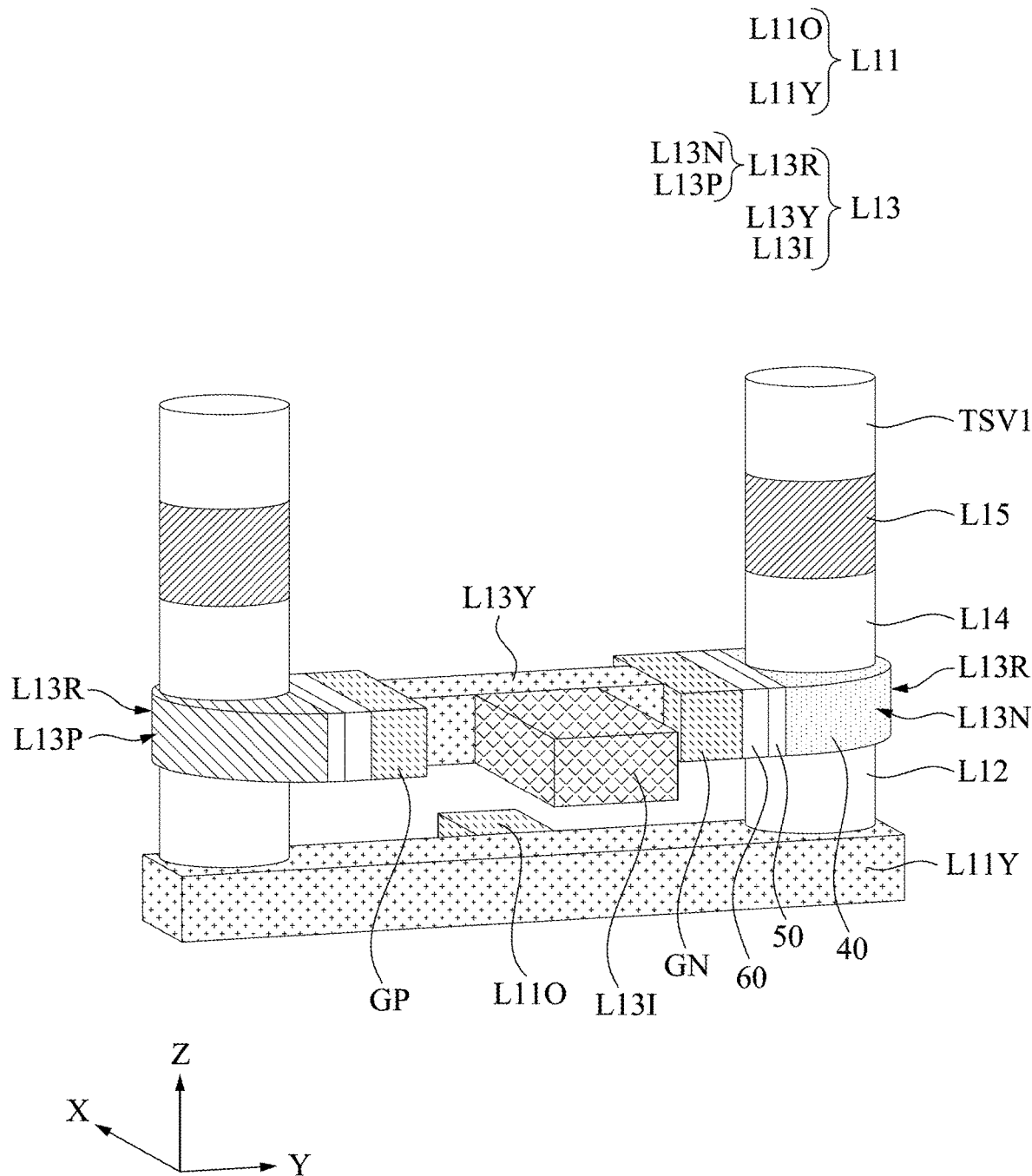
FIG. 9A is a schematic view of an inverter.

FIG. 9A is a schematic view of an inverter. In other words, the structure of FIG. 9A is referred as an equivalent circuit of the inverter. As shown in FIG. 9A, the inverter includes a first sub-layer L11, a second sub-layer L12, a third sub-layer L13, a fourth sub-layer L14, a fifth sub-layer L15, and a through-silicon via TSV1. The first sub-layer L11 may include an output terminal L11O and a conductive connection element. The output terminal L11O is horizontally connected to the conductive connection element. The conductive connection element may include a transversal conductive connection line L11Y along in Y axis. For example, the output terminal L11O is horizontally connected to the transversal conductive connection line L11Y.

The second sub-layer L12 is disposed over the first sub-layer L11. The second sub-layer L12 includes a via. The third sub-layer L13 is disposed over the second sub-layer L12. The third sub-layer L13 may include a transistor region L13R and a conductive connection element. The conductive connection element of the third sub-layer L13 is horizontally connected to the transistor region L13R of the third sub-layer L13. The conductive connection element may include a transversal conductive connection line L13Y along in Y axis. In some embodiments, the third sub-layer L13 further includes an input terminal L13I. The input terminal L13I is horizontally connected to the transversal conductive connection line L13Y of the conductive connection element of the third sub-layer L13. Transistors of the transistor region of the third sub-layer L13 may include a NMOS transistor L13N and a PMOS transistor L13P. The NMOS transistor L13N includes substrate 40, a thin oxide layer 50, a gate dielectric layer 60, and gate GN. It is noted that the NMOS transistor L13N may include the transistor (FanFET) and have the geometries illustrated in FIGS. 1A-1C, 2A-2C, 3A-3C, 4A-4C, 5A-5B, 6A-6C and 7, which respectively corresponds to the FanFET 1, 2, 3, 4a-4c, 5a, 5b, 6a-6c and 7. The gate GN of the NMOS transistor L13N transistors of the transistor region of the third sub-set layer L13 may have the geometries illustrated in FIGS. 1A-1C, 2A-2C, 3A-3C, 4A-4C, 5A-5B, 6A-6C and 7. Similarly, the PMOS transistor L13P have configurations, for example, the substrate, the thin oxide layer, the gate dielectric layer, and a gate GP, similar to that of the NMOS transistor L13N, and the description is not repeated hereinafter. In some embodiments, the gate GP of the PMOS transistor L13P is connected to the gate GN of the NMOS transistor L13N and be referred as inputs (for example, the input terminal L13I). A drain region of the PMOS transistor L13P is connected to a drain region of the NMOS transistor L13N and be referred as outputs (for example, the output terminal L11O).

The fourth sub-layer L14 includes a via vertically connected to the third sub-layer L13. The fifth sub-layer L15 is disposed over the fourth sub-layer L14. The fifth sub-layer L15 may include a conductive connection element vertically connected to the via of the fourth sub-layer L14. For example, the conductive connection element may include a conductive connection via along in Z axis.

The through-silicon via TSV1 is vertically connected to the conductive connection element of the fifth sub-layer L15. The through-silicon via TSV1 may serve as bias. For example, the through-silicon via TSV1 may include a positive supply voltage (Vdd) and a ground line (GND). For example, as shown in FIG. 9A, the through-silicon via TSV1 on the left side may serve as the positive supply voltage (Vdd). The positive supply voltage (Vdd) is disposed over and electrically connected to the PMOS transistor L13P. The through-silicon via TSV1 on the right side may serve as the ground line (GND). The ground line (GND) is disposed over and electrically connected to the NMOS transistor L13P. In greater details, a source region of the PMOS transistor L13P and a source region of the NMOS transistor L13N are respectively connected to the positive supply voltage (the through-silicon via on the left side) and the ground line (the through-silicon via on the right side). In some embodiments, the positive supply voltage (the through-silicon via on the left side) is aligned with the fourth sub-layer L14 and the fifth sub-layer L15. In some embodiments, the ground line (the through-silicon via on the right side) is aligned with the fourth sub-layer L14 and the fifth sub-layer L15.

Figure 9B:
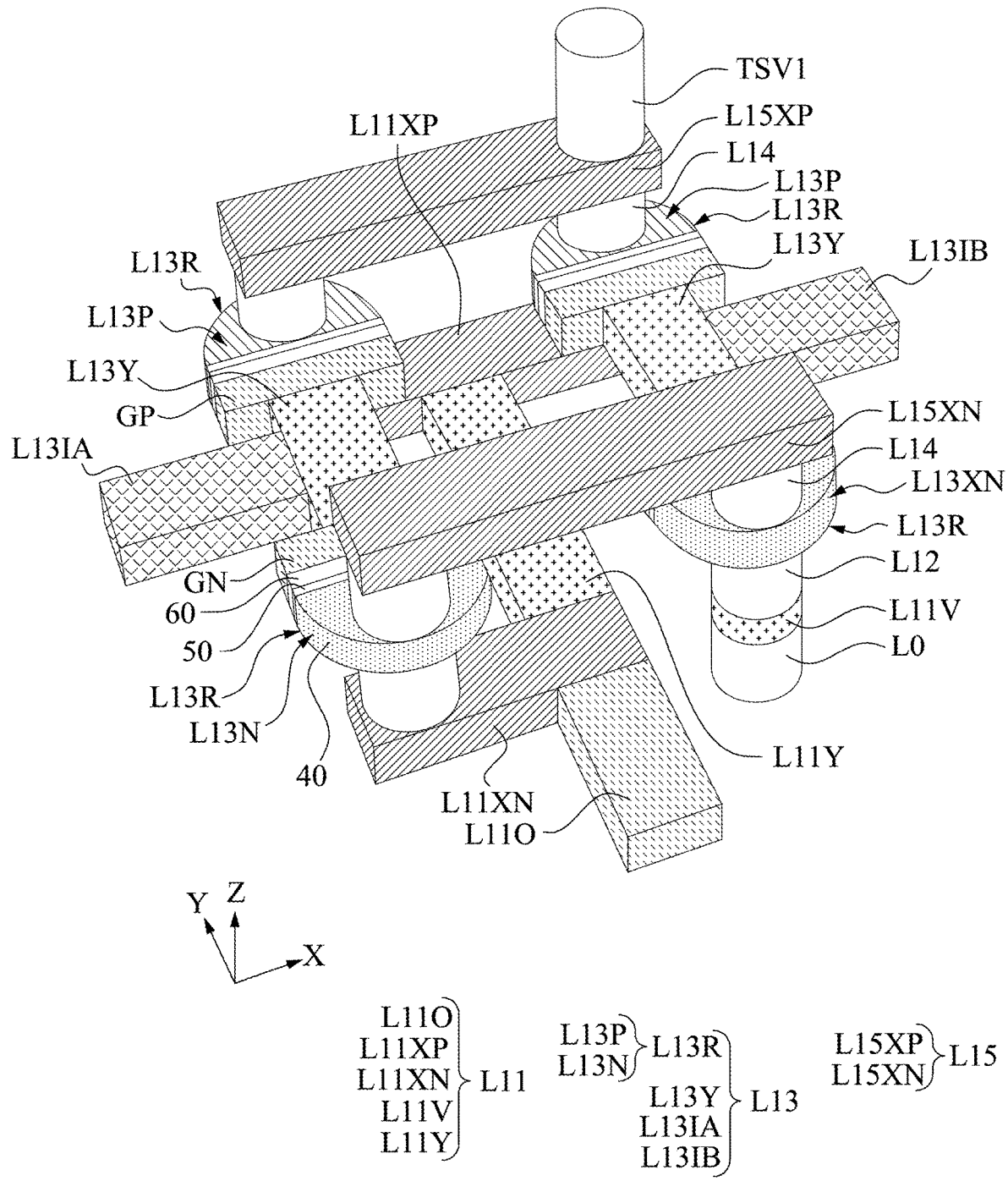
FIG. 9B is a schematic view of a NAND gate.

FIG. 9B is a schematic view of a NAND gate. In other words, the structure of FIG. 9B is referred as an equivalent circuit of the NAND gate. As shown in FIG. 9B, the NAND gate includes a ground layer L0, a first sub-layer L11, a second sub-layer L12, a third sub-layer L13, a fourth sub-layer L14, a fifth sub-layer L15, and a through-silicon via TSV1. The first sub-layer L11 is vertically connected to the ground layer L0. The ground layer L0 may include a ground line (GND). The first sub-layer L11 may include a conductive connection element and an output terminal L11O. The output terminal L11O is horizontally connected to the conductive connection element of the first sub-layer L11. The conductive connection element may include a longitudinal conductive connection lines L11XP and L11XN along in X axis, a transversal conductive connection line L11Y along in Y axis, and a conductive connection via L11V along in Z axis. For example, the output terminal L11O, the longitudinal conductive connection lines L11XP and X11N, and the transversal conductive connection line L11Y are horizontally connected.

The second sub-layer L12 may include a via vertically connected to either the conductive connection element (for example, the longitudinal conductive connection line L11X) of the first sub-layer L11 or the output terminal L11O of the first sub-layer L11. The third sub-layer L13 is disposed over the second sub-layer L12. The third sub-layer L13 may include a transistor region L13R vertically connected to the via of the second sub-layer L12. Further, the third sub-layer L13 includes a conductive connection element and two input terminals L13I horizontally connected to the conductive connection element. The input terminals L13I may include an input terminal L13IA and an input terminal L13IB. The conductive connection element may include a transversal conductive connection line L13Y along in Y axis, and the longitudinal conductive connection line L13X along in X axis. Transistors of the transistor region of the third sub-layer L13 may include at least two PMOS transistors L13P and at least two NMOS transistors L13N. The PMOS transistors L13P are electrically connected in parallel, and the NMOS transistors L13N are electrically connected in series. In greater details, the PMOS transistors L13P are electrically connected in parallel and connected to the through-silicon via TSV1. The NMOS transistors L13N are electrically connected in series and connected to the ground layer L0. A gate GP of one of the PMOS transistors L13P and a gate GN of one of the NMOS transistors L13N are connected through the transversal conductive connection line L13Y and referred as two inputs (the input terminal L13IA and the input terminal L13IB). The two PMOS transistors L13P in parallel and the two NMOS transistors L13N in series are electrically connected and referred as outputs (the output terminal L11O).

The fourth sub-layer L14 may include a via that is vertically connected to the third sub-layer L13. The fifth sub-layer L15 may include a conductive connection element that is vertically connected to the via of the fourth sub-layer L14. For example, the conductive connection element may include longitudinal conductive connection lines L15XP and L15XN along in X axis.

The through-silicon via TSV1 is vertically connected to the fifth sub-layer L15. The through-silicon via TSV1 may serve as bias. For example, the through-silicon via TSV1 may include a positive supply voltage (Vdd).

Figure 9C:
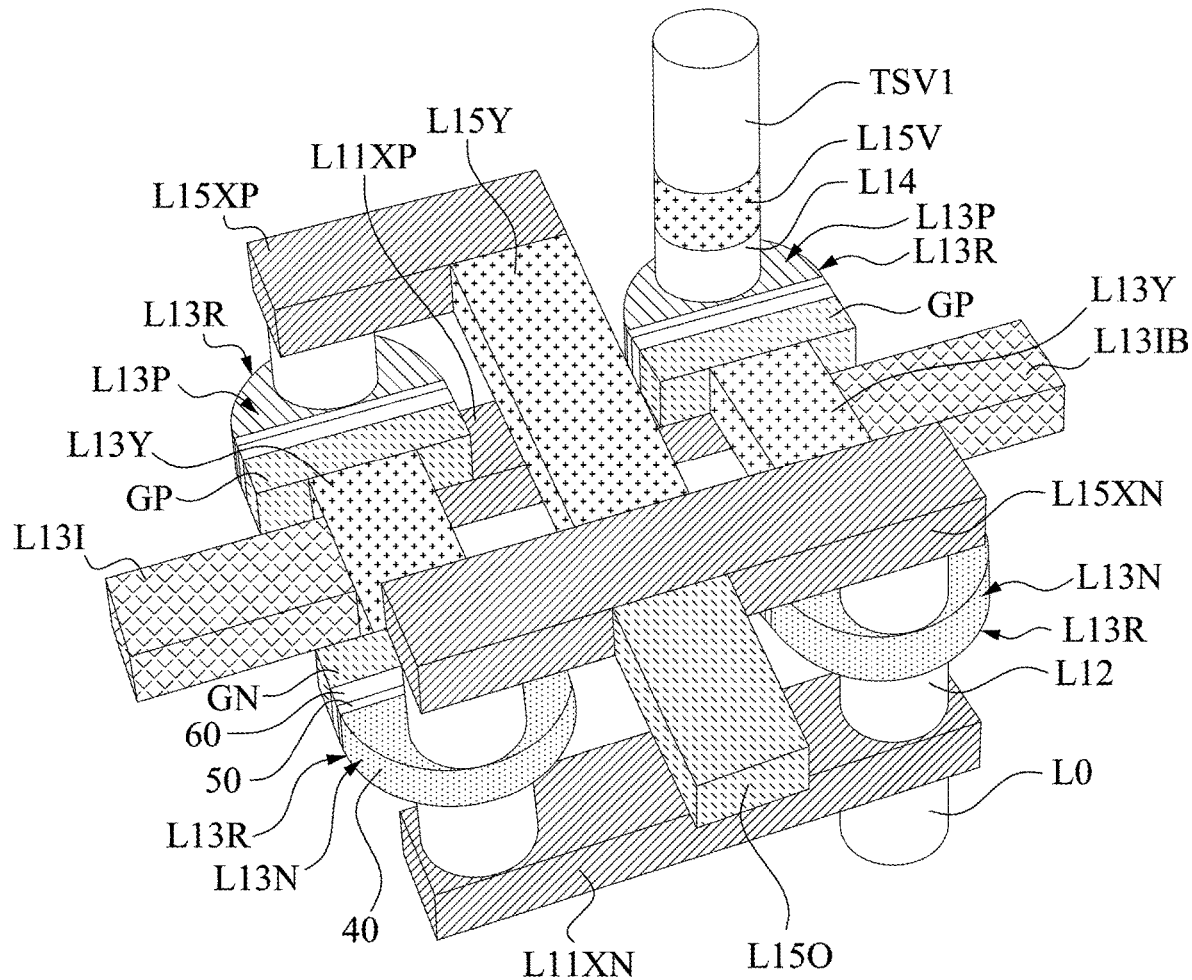
FIG. 9C is a schematic view of a NOR gate.

FIG. 9C is a schematic view of a NOR gate. In other words, the structure of FIG. 9C is referred as an equivalent circuit of the NOR gate. As shown in FIG. 9C, the NOR gate includes a ground layer L0, a first sub-layer L11, a second sub-layer L12, a third sub-layer L13, a fourth sub-layer L14, a fifth sub-layer L15, and a through-silicon via TSV1. The ground layer L0 may include a ground line (GND). The first sub-layer L11 may include a conductive connection element that is vertically connected to the ground layer L0. The conductive connection element may include longitudinal conductive connection lines L11XP and L11XN along in X axis.

The second sub-layer L12 may include a via that is vertically connected to the conductive connection element of the first sub-layer L11. The third sub-layer L13 is disposed over the second sub-layer L12. The third sub-layer L13 may include a transistor region L13R that is vertically connected to the second sub-layer L12. The third sub-layer L13 may further include a conductive connection element and two input terminals L13I horizontally connected to the conductive connection element. The input terminals L13I may include an input terminal L13IA and an input terminal L13IB. The conductive connection element may include a transversal conductive connection line L13Y along in Y axis. Transistors of the transistor region of the third sub-layer L13 may include at least two PMOS transistors L13P and at least two NMOS transistors L13N. The PMOS transistors L13P are electrically connected in series and the NMOS transistors L13N are electrically connected in parallel. In greater details, the PMOS transistors L13P are electrically connected in series and connected to the through-silicon via TSV1. The NMOS transistors L13N are electrically connected in parallel and connected to the ground layer L0 (the ground line). A gate of one of the PMOS transistors L13P and a gate GN of one of the NMOS transistors L13N are electrically connected through the transversal conductive connection line L13Y and referred as two inputs (for example, the input terminal L13IA and the input terminal L13IB). The PMOS transistors L13P in series and the NMOS transistors L13N in parallel are electrically connected and referred as outputs (for example, the output terminal L15O).

The fourth sub-layer L14 may include a via that is vertically connected to the third sub-layer L13. The fifth sub-layer L15 may include a conductive connection element vertically connected to the fourth sub-layer L14. Further, the fifth sub-layer L15 may include an output terminal L15O horizontally connected to the conductive connection element of the fifth sub-layer L15. The conductive connection element may include longitudinal conductive connection lines L15XP and L15XN along in X axis, a transversal conductive connection line L15Y along in Y axis, and a conductive connection via L15V along in Z axis. For example, the output terminal L15O, the longitudinal conductive connection lines L15XP and L15XN, and the transversal conductive connection line L15Y are horizontally connected.

The through-silicon via TSV1 is vertically connected to the conductive connection element of the fifth sub-layer L15. For example, the through-silicon via TSV1 is vertically connected to the conductive connection via L15V. The through-silicon via TSV1 may serve as bias. For example, the through-silicon via TSV1 may include a positive supply voltage (Vdd).

Figure 9E:
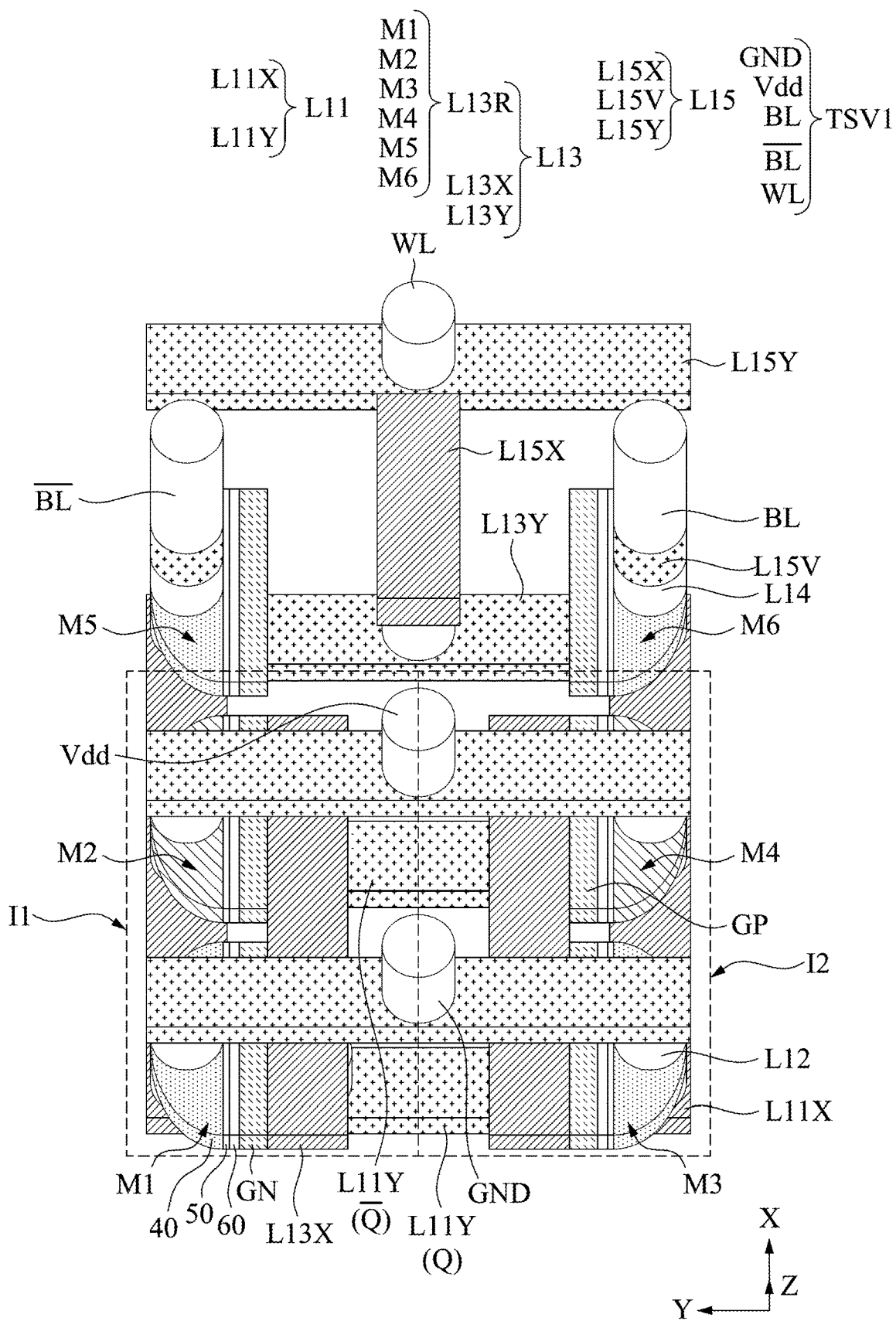

There are various types of the design of SRAM and arrangements of transistors, such as four transistors and two resistors (4T+2R), six transistors (6T), eight transistors (8T), and so on. The present disclosure introduces a SRAM of six transistors (6T SRAM) herein. FIG. 9D and FIG. 9E are schematic views of a SRAM. In other words, the structure of FIG. 9D and FIG. 9E are referred as equivalent circuit of the SRAM. As shown in FIG. 9D and FIG. 9E, the SRAM includes a first sub-layer L11, a second sub-layer L12, a third sub-layer L13, a fourth sub-layer L14, a fifth sub-layer L15, and a through-silicon via TSV1. The first sub-layer L11 may include a conductive connection element. The conductive connection element may include a longitudinal conductive connection line L11X along in X axis and a transversal conductive connection line L11Y along in Y axis. One transversal conductive connection line L11Y is referred as Q, and another transversal conductive connection line L11Y is referred as Q bar ($\overline{Q}$).

The second sub-layer L12 may include a via that is vertically connected to the conductive connection element of the first sub-layer L11. The third sub-layer L13 is disposed over the second sub-layer L12. The third sub-layer L13 may include a transistor region L13R that is vertically connected to the second sub-layer L12. Transistors of the transistor region L13R of the third sub-layer L13 may include a first transistor M1, a second transistor M2, a third transistor M3, a fourth transistor M4, a fifth transistor M5, and a sixth transistor M6. In greater details, the first transistor M1 and the second transistor M2 are configured to a first inverter I1, the third transistor M3 and the fourth transistor M4 are configured to a second inverter I2, and the first inverter I1 and the second inverter I2 are cross-coupled. The transversal conductive connection line L11Y (for example, Q and Q bar) of the first sub-layer L11 is electrically connected to the fifth transistor M5 and the sixth transistor M6 and configured to control a switch. In other words, the first inverter I1 and the second inverter I2 electrically connected to the sixth transistor M6 and the fifth transistor M5 through the first sub-layer L11 and the second sub-layer L12, respectively. In some embodiments, the aforementioned Q may serves as gates of the transistor M1 the transistor M2 electrically connected to a drain region of the transistor M3, a drain region of the transistor M4, and a source region of the transistor M6. The aforementioned Q bar serves as gates of the transistor M3 and the transistor M4 electrically connected to a drain region of the transistor M1 and a drain region of the transistor M2, and a source region of the transistor M5.

In some embodiments, the first transistor M1, the third transistor M3, the fifth transistor M5 and the sixth transistor M6 are referred as NMOS transistor, and the second transistor M2 and the fourth transistor M4 are referred as PMOS transistors. In some embodiments, the third sub-layer L13 may include a conductive connection element. The conductive connection element may include a conductive connection line and/or a conductive connection via. For example, the third sub-layer L13 includes the longitudinal conductive connection line L13X along in X axis and a transversal conductive connection line L13Y along in Y axis. For example, the transversal conductive connection line L13Y is connected to the gates of the transistors M5 and M6.

The fourth sub-layer L14 may include a via that is vertically connected to the third sub-layer L13. The fifth sub-layer L15 may include a conductive connection element that is vertically connected to the fourth sub-layer L14. The conductive connection element may include a conductive connection line and/or a conductive connection via.

The through-silicon via TSV1 is vertically connected to the fifth sub-layer L15. The through-silicon via TSV1 serves as bias. In greater details, the through-silicon via TSV1 may include supply voltage Vdd electrically connected to the source regions of the transistor M2 and the transistor M4 and a ground line GND electrically connected to the source regions of the transistor M1 and the transistor M3. In some embodiments, the through-silicon via TSV1 may include a word line WL, a bit line BL, and a bit line bar $\overline{BL}$. In greater details, the word line WL is electrically connected to the gates of the transistor M5 and the transistor M6. The bit line BL is electrically connected to the drain region of the transistor M6. The bit line bar $\overline{BL}$ is electrically connected to the drain region of the transistor M5. The two NMOS transistors (the transistors M5 and M6) of the SRAM are configured to control the reading and writing of the data. The word line (WL) is configured to determine the switch of the NMOS transistors (the transistors M5 and M6). The bit lines (the bit line BL and the BL bar $\overline{BL}$) are configured to read and write the data.

Figure 10:
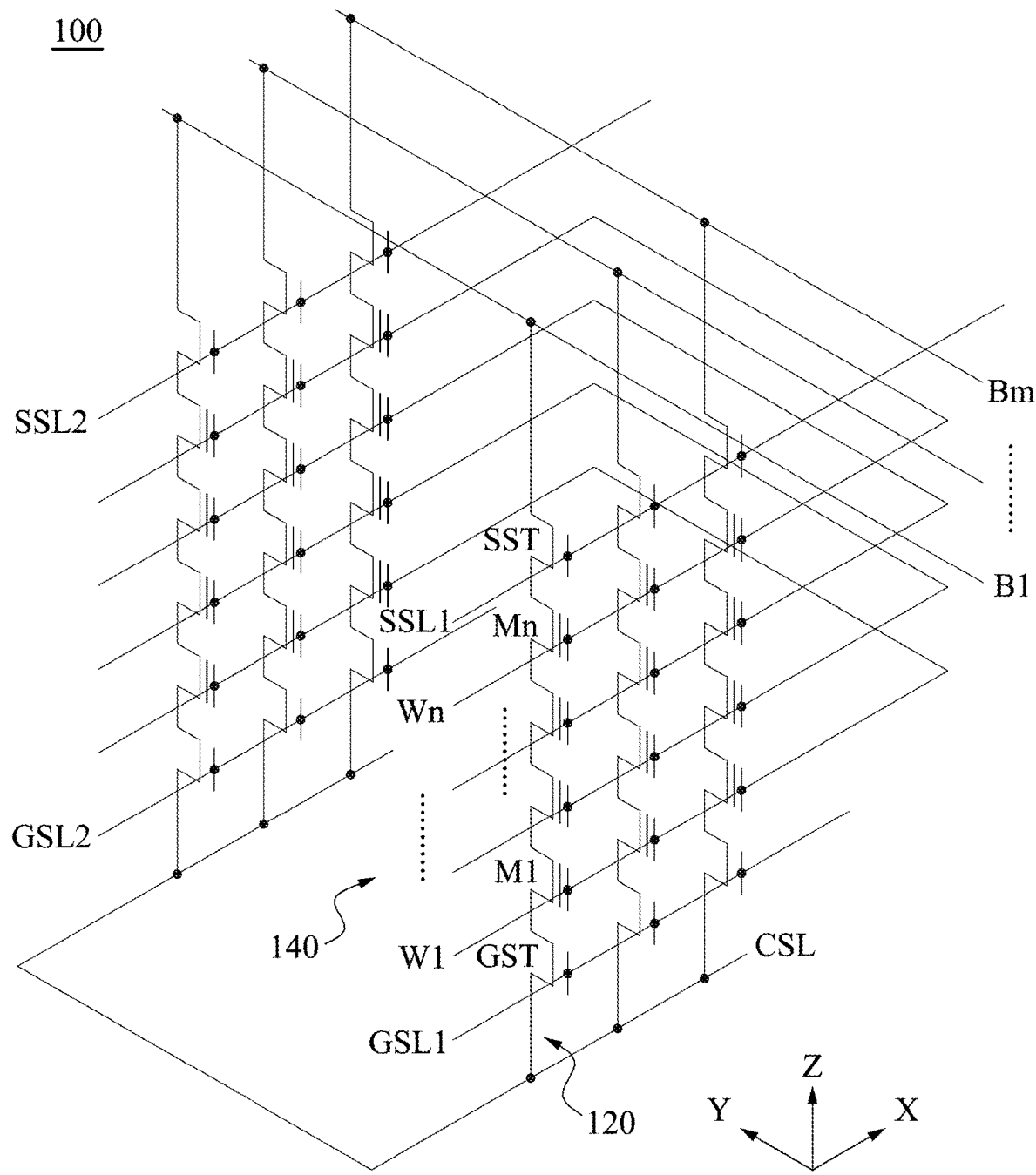
FIG. 10 is an equivalent circuit diagram of a memory cell array of a nonvolatile memory device in accordance with some embodiments of the present disclosure.

FIG. 10 is an equivalent circuit diagram of memory cell array 100 of a nonvolatile memory device in accordance with some embodiments of the present disclosure. In greater detail, FIG. 10 is an equivalent circuit diagram of a 3D-NAND flash memory device having a vertical channel (VC) structure.

Referring to FIG. 10, the memory cell array 100 includes a plurality of memory cell strings 120 in a vertical direction, i.e., Z direction. A plurality of memory cell strings 120 may constitute a memory cell block 140 which is connected to a plurality of word lines W1 to Wn. Each of the memory cell strings 120 may include a string selection transistor SST, a plurality of memory cells M1 to Mn, and a ground selection transistor GST. The string selection transistor SST, the plurality of memory cells M1 to Mn, and the ground selection transistor GST may be disposed in series in the Z direction. The plurality of word lines W1 to Wn may be respectively connected to the plurality of memory cells M1 to Mn, so as to control the respective memory cells M1 to Mn. The number of memory cells M1 to Mn may be adjusted according to the capacity of a semiconductor memory device.

A plurality of bit lines B1 to Bm extending in the Y direction may be connected to a top side of the memory cell strings 120 at first column to mth column, for example, to a drain of the string selection transistor SST. Moreover, a common source line CSL may be connected to a bottom side of the memory cell strings 120, for example, to a source of ground selection transistor GST. In some embodiments, each memory cell string 120 may include a plurality of memory cells (for example, from 4 memory cells to 8192 memory cells). The above number of the memory cells is only exemplary, not used to limit the claimed scope.

A word line extending in the X direction may be connected in common to gate electrodes of memory cells arranged in the same layer (for example, the memory cells arranged in the same layer as M1), among the memory cells M1 to Mn of the memory cell strings 120. According to the driving of the word lines W1 to Wn, data may be programmed/read or erased into/from the memory cells M1 to Mn.

The string selection transistor SST may be disposed between the bit line (for example, B1) and the uppermost memory cell Mn in each memory cell string 120. Each string selection transistor SST in the memory cell block 140 may control data transmission between the bit lines B1 to Bm and the memory cells M1 to Mn by a string selection line SSL connected to the gate of the string selection transistor SST.

The ground selection transistor GST may be disposed between the lowermost memory cell M1 and the common source line CSL. Each ground selection transistor GST in the memory cell block 140 may control data transmission between the common source line CSL and the memory cells M1 to Mn by a ground selection line GSL connected to a gate of the ground selection transistor GST.

Figure 11:
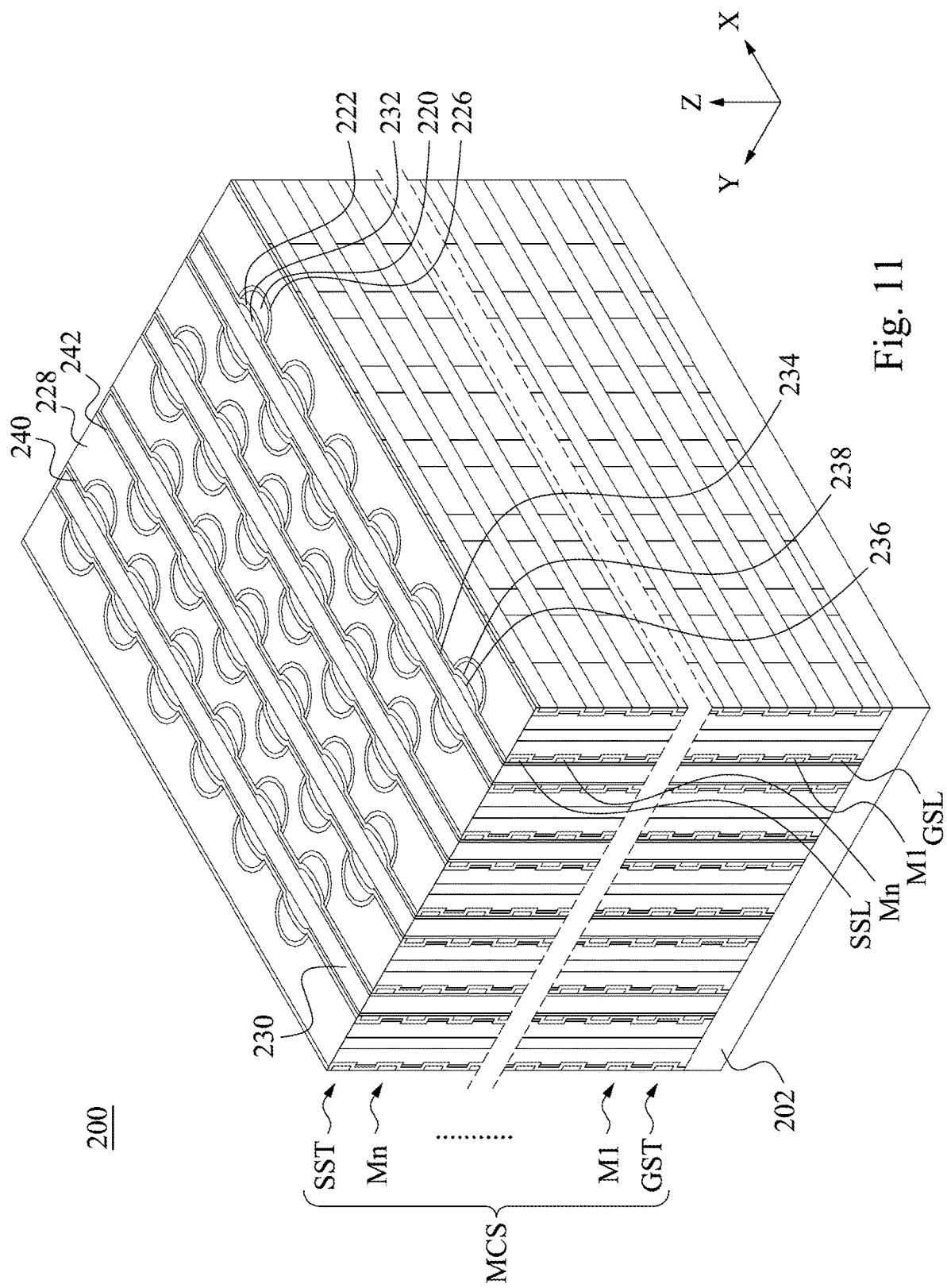
FIGS. 11 to 13 are schematic perspective views of a 3D structure of memory cell strings of a nonvolatile memory device in accordance with some embodiments of the present disclosure.
Figure 12:
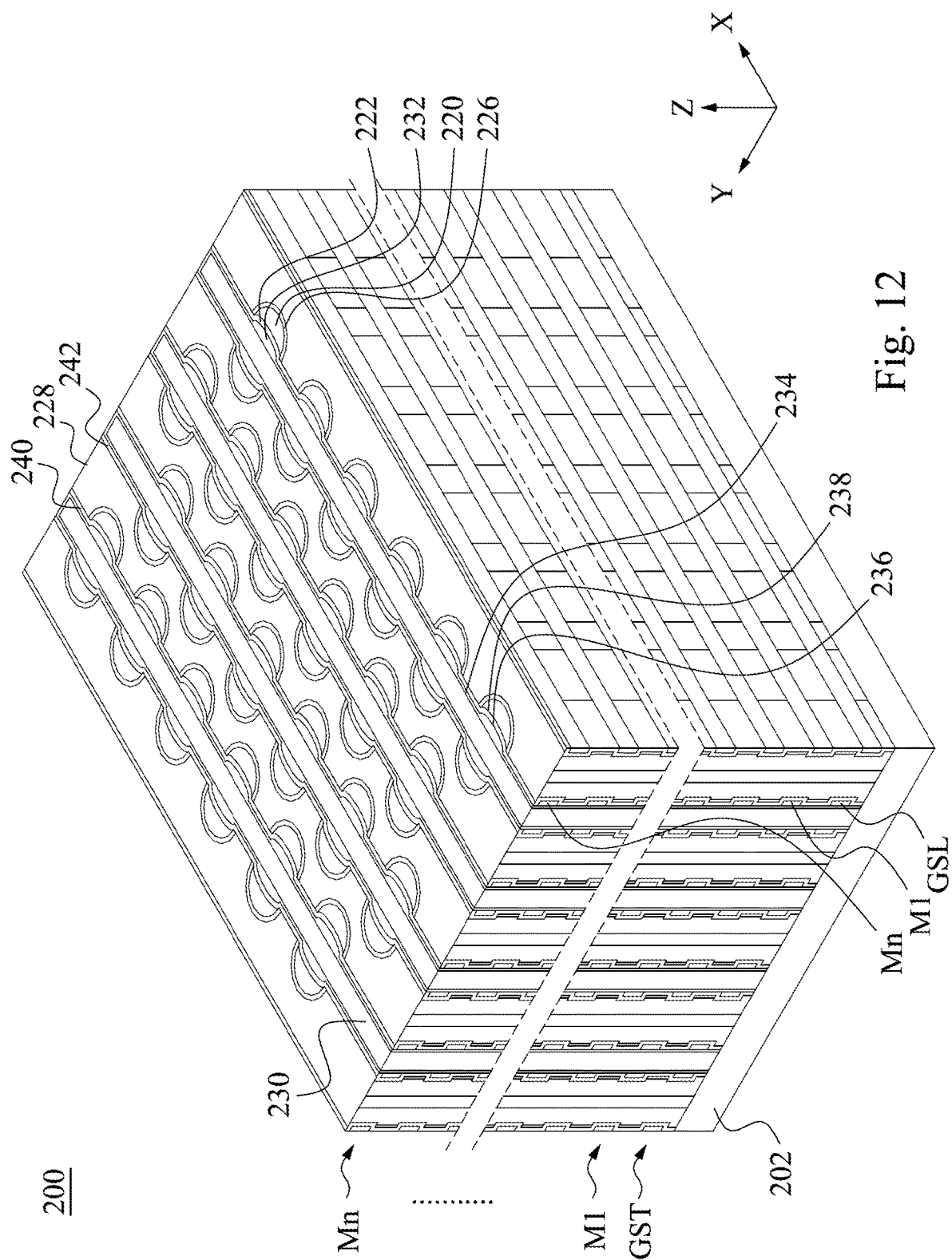
Figure 13:
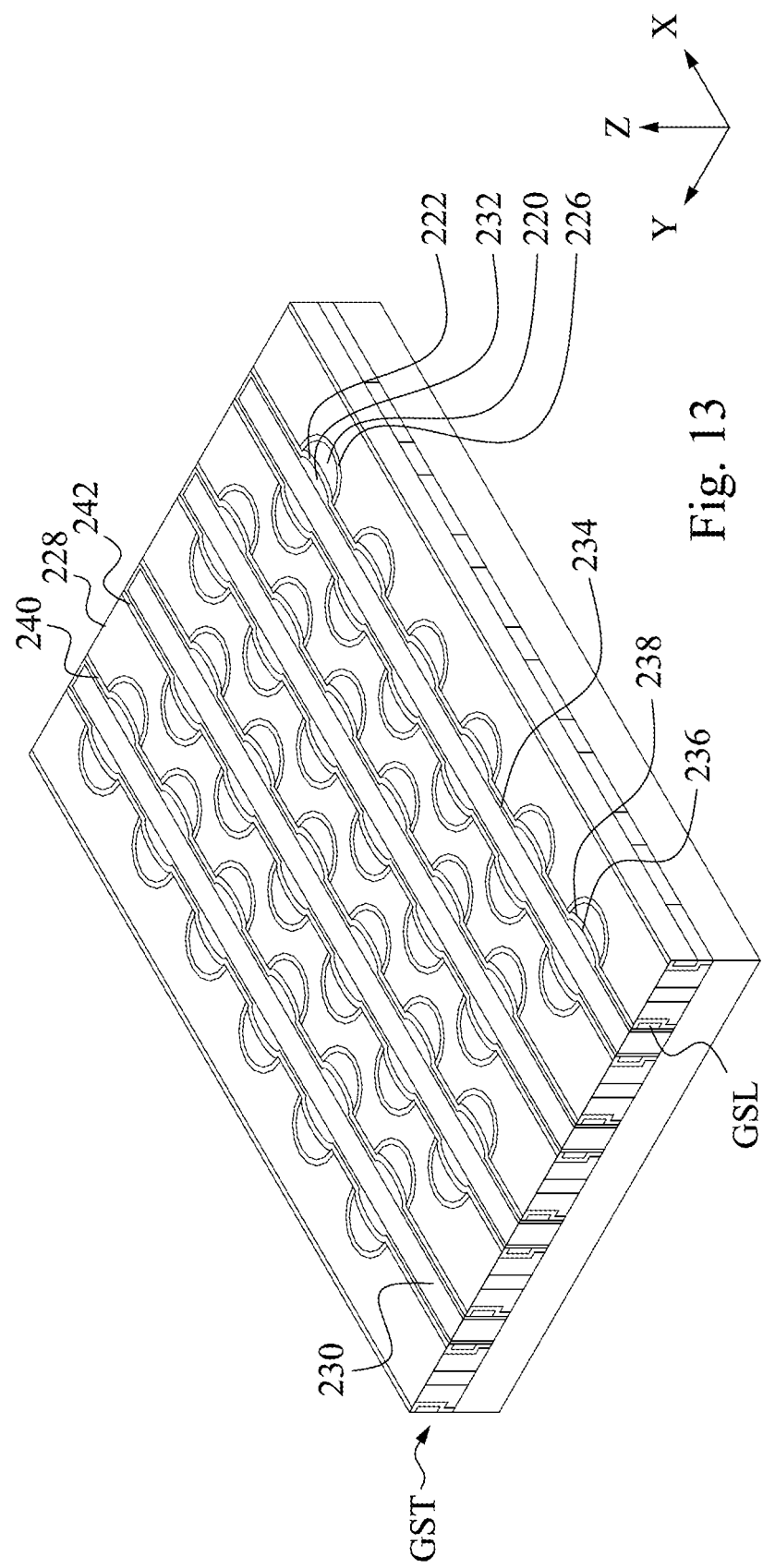

FIGS. 11 to 13 are schematic perspective views of memory cell strings 120 (shown in FIG. 10) of a nonvolatile memory device 200 in accordance with some embodiments of the present disclosure. In particular, FIG. 11 illustrates strings of ground selection transistor GST, memory cells M1 to Mn and string selection transistor SST, FIG. 12 illustrates substantially the same structure as FIG. 11 except for omission of the string selection transistors SST, and FIG. 13 illustrates substantially the same structure as FIG. 11, except for omission of the string selection transistors SST and memory cells M1 to Mn. In FIGS. 11 to 13, the illustrations of some elements constituting the memory cell strings 120 of FIG. 10 are omitted.

Referring to FIG. 11, the nonvolatile memory device 200 may include a plurality of memory cell strings MCS each including a vertical channel 220 extending in the Z direction. The vertical channels 220 each have a string of memory cell with semi-ellipsoid cylinders-like shape. The plurality of memory cell strings MCS extending in the Z direction from the substrate 202 and arranged along the X-Y plane. The string memory cell strings MCS correspond to the memory cell strings 120 of FIG. 10. Each memory cell strings MCS may include a ground selection transistor GST, a plurality of memory cells M1 to Mn, and a string selection transistor SST. Ground selection lines GSL, word lines W1 to Wn, and string selection lines SSL that are electrically connected to the memory cell strings MCS are illustrated as well.

A main surface of the substrate 202 may extend in the X-Y plane. The substrate 202 is a silicon substrate in the present embodiment. Alternatively, the substrate 202 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 202 is a semiconductor-on-insulator (SOI) such as having a buried layer.

The vertical channels 220 having a semi-elliptical profile may extend in the Z direction that is perpendicular to the direction of the main surface of the substrate 202. The vertical channels 220 may be disposed and separated from each other. In greater detail, the vertical channels 220 embedded in opposite sides of an isolation layer 228 are misaligned with each other along the Y direction.

A gate dielectric layer 222 may be embedded in the vertical channels 220. The gate dielectric layer 222 may be placed on X-Y plane and extended in the Z direction, which is perpendicular to the substrate 202. In some embodiments, the gate dielectric layer 222 is a multi-layered film in the memory cells M1-Mn. For example, the gate dielectric layer 222 in the memory cells M1-Mn may be a two-layered film including a silicon oxide layer (referred to as tunnel oxide in some embodiments) and a silicon nitride layer. In some embodiments, the gate dielectric layer 222 in the ground selection transistor GST and the string selection transistor SST is a single-layered film. For example, the gate dielectric layer 222 in the ground selection transistor GST and the string selection transistor SST is a single silicon oxide layer.

In some embodiments, the gate dielectric layer 222 includes silicon oxide, silicon nitride, high-k dielectric materials or combinations thereof. In other embodiments, the gate dielectric layer 222 may include high-k dielectric materials. For example, the gate dielectric layer 222 may include one or more layers of a metal oxide or a silicate of Hf, Al, Zr, combinations thereof. Other suitable materials include La, Mg, Ba, Ti, Pb, Zr, in the form of metal oxides, metal alloy oxides, and combinations thereof. Exemplary materials include $MgO_x$, $BaTi_xO_y$, $BaSr_xTi_yO_z$, $PbTi_xO_y$, $PbZr_xTi_yO_z$, SiCN, SiON, SiN, $Al_2O_3$, $La_2O_3$, $Ta_2O_5$, $Y_2O_3$, $HfO_2$, $ZrO_2$, HfSiON, $YGe_xO_y$, $YSi_xO_y$, and $LaAlO_3$, and the like. The formation methods of gate dielectric layer 222 may include molecular-beam epitaxy (MBE), atomic layer deposition (ALD), physical vapor deposition (PVD), chemical vapor deposition (CVD) (e.g., metal organic CVD (MOCVD), plasma enhanced CVD (PECVD), atmospheric pressure CVD (APCVD), low-pressure CVD (LPCVD), ultrahigh vacuum CVD (UHCVD), microwave plasma CVD (MPCVD), remote plasma CVD (RPCVD), rapid-thermal CVD (RTCVD)), and the like.

String selection line SSL, word lines W1 to Wn and ground selection line GSL are embedded in different regions of the gate dielectric layer 222 that are vertically arranged, as illustrated in FIGS. 11 to 13. The string selection line SSL, word lines W1 to Wn and the ground selection line GSL each include embedded portions 232 embedded in the vertical channels 220. In some embodiments, the string selection line SSL, the word lines W1 to Wn, and the ground selection line GSL each further include a plurality of connecting portions 234 alternating arranged with the embedded portions 232. The connecting portions 234 are thinner than the embedded portions 232. In some embodiments, the embedded portions 232 of said one of the word lines W1 to Wn are respectively embedded in a plurality of the vertical channels 220. The word lines W1 to Wn may be a doped polysilicon, or other conductive material such as tantalum nitride or other conductive nitride, tungsten or other metal, or a combination of the foregoing. For example, the word lines W1 to Wn may use tantalum nitride (TaN) as material in the depicted embodiments.

In some embodiments, an optional liner layer 226 may be formed on a sidewall of the vertical channel 220 opposite to the gate dielectric layer 222. The liner layer 226 may include silicon oxide, silicon nitride, the like, or combinations thereof.

The gate dielectric layer 222 may be interposed between the vertical channel 220 and the string selection line SSL, between the vertical channel 220 and the word lines W1 to Wn, and between the vertical channel 220 and the ground selection line GSL. In some embodiments, the gate dielectric layer 222 is between the embedded portions 232 and the vertical channel 220. The string selection line SSL, the vertical channel 220 and the gate dielectric layer 222 adjacent to the string selection line SSL collectively form or define the string selection transistor SST as shown in FIG. 10. The word lines W1 to Wn, the vertical channel 220 and the gate dielectric layer 222 adjacent to the word lines W1 to Wn collectively form or define the memory cell M1 to Mn as shown in FIG. 10. The ground selection line GSL, the vertical channel 220 and the gate dielectric layer 222 adjacent to the ground selection line GSL collectively form or define the ground selection transistor GST as shown in FIG. 10. In some embodiments, the embedded portion 232 may include a convex surface 236 interfaced with the gate dielectric layer 222. Moreover, the vertical channel 220 may include a concave surface 238 interfaced with the gate dielectric layer 222. In greater detail, each embedded portion 232 and each vertical channel 220 may respectively include a convex surface 236 and a concave surface 238, and the gate dielectric layer 222 is between the convex surface 236 and the concave surface 238.

An isolation layer 228 may be formed to separate different regions of a word line (e.g., Wn), the string selection line SSL or the ground selection line GSL. A portion of the isolation layer 228 used to separate the word lines can be referred to as a deep trench isolation (DTI) layer. A top portion of the isolation layer 228 used to separate the string selection lines SSL can be referred to as a shallow trench isolation (STI) layer. A bottom portion of the isolation layer 228 used to separate the ground selection lines GSL can be referred to as a STI layer as well. In some embodiments, the isolation layer 228 may be formed over the substrate 202 and has opposite sides 240 and 242 that are asymmetrical. The vertical channels 220 are respectively embedded in the asymmetrical sides 240 and 242. In greater detail, the isolation layer 228 with asymmetrical sides 240 and 242 has a serpentine profile in top view, and the vertical channels 220 are respectively embedded in the asymmetrical sides 240 and 242 of the isolation layer 228. The isolation layer 228 may be formed by depositing a silicon oxide layer, silicon nitride layer or a silicon oxynitride layer, the like, or combinations thereof. For example, the isolation layer 228 may be formed by depositing tetraethoxysilane (TEOS). The formation methods of the isolation layer 228 include physical vapor deposition (PVD), chemical vapor deposition (CVD), and the like.

Another isolation layer 230 may be formed in parallel to the isolation layer 228. The isolation layer 230 has a different shape from the isolation layer 228. For example, the isolation layer 230 has a stripe shape in top view, and the isolation layer 228 has a serpentine shape in top view. A portion of the isolation layer 230 used to separate the word lines can be referred to as a deep trench isolation (DTI) layer. A top portion of the isolation layer 230 used to separate the string selection lines SSL can be referred to as a shallow trench isolation (STI) layer. A bottom portion of the isolation layer 230 used to separate the ground selection lines GSL can be referred to as a STI layer as well. The isolation layer 230 may be formed by depositing a silicon oxide layer, silicon nitride layer or a silicon oxynitride layer, and the like. For example, the isolation layer 230 may be formed by depositing TEOS. The formation methods of isolation layer 230 include physical vapor deposition (PVD), chemical vapor deposition (CVD), and the like.

Referring to FIG. 12, shown therein is a schematic perspective view of a portion of nonvolatile memory device 200. This embodiment is similar to the one shown in FIG. 11 except that string selection transistors SST are not shown in FIG. 12, so as to show a top view profile of the memory cells Mn. Other aspects of this embodiment are omitted for the purpose of simplicity.

Referring to FIG. 13, shown therein is a schematic perspective view of a portion of nonvolatile memory device 200. This embodiment is similar to the one shown in FIG. 11 except that the string selection transistors SST and memory cells M1-Mn are not shown in FIG. 13, so as show a top view profile of the ground selection transistors GST. Other aspects of this embodiment are omitted for the purpose of simplicity.

FIGS. 14A, 15A, 16A, 17A and 18A are schematic top views at various stages during the fabrication of memory device. FIGS. 14B, 15B, 16B, 17B and 18B are cross-section views taken along line B-B of FIGS. 14A, 15A, 16A, 17A and 18A respectively in accordance with some embodiments of the present disclosure. FIGS. 19A, 20A, 21A, 22A, 23A and 24A are horizontally cross-sectional views of the memory device taken along a level of one of removed silicon nitride layers in accordance with some embodiments of the present disclosure. FIGS. 19B, 20B, 21B, 22B, 23B, 24B are cross-sectional views taken along line B-B of FIGS. 19A, 20A, 21A, 22A, 23A and 24A in accordance with some embodiments of the present disclosure. FIGS. 16C, 18C, 19C, 20C, 22C, 23C and 24C are cross-section views taken along line C-C of FIGS. 16A, 18A, 19A, 20A, 22A, 23A and 24A in accordance with some embodiments of present disclosure. FIG. 21C is a partially enlarged view of FIG. 21B. FIGS. 16D, 18D, 19D, 20D, 21D, 22D, 23D and 24D are cross-sectional views taken along line D-D of FIGS. 16A, 18A, 19A, 20A, 21A, 22A, 23A and 24A in accordance with some embodiments of present disclosure. FIG. 21E is cross-sectional views taken along line E-E of FIG. 21A in accordance with some embodiments of the present disclosure.

Figure 14A:
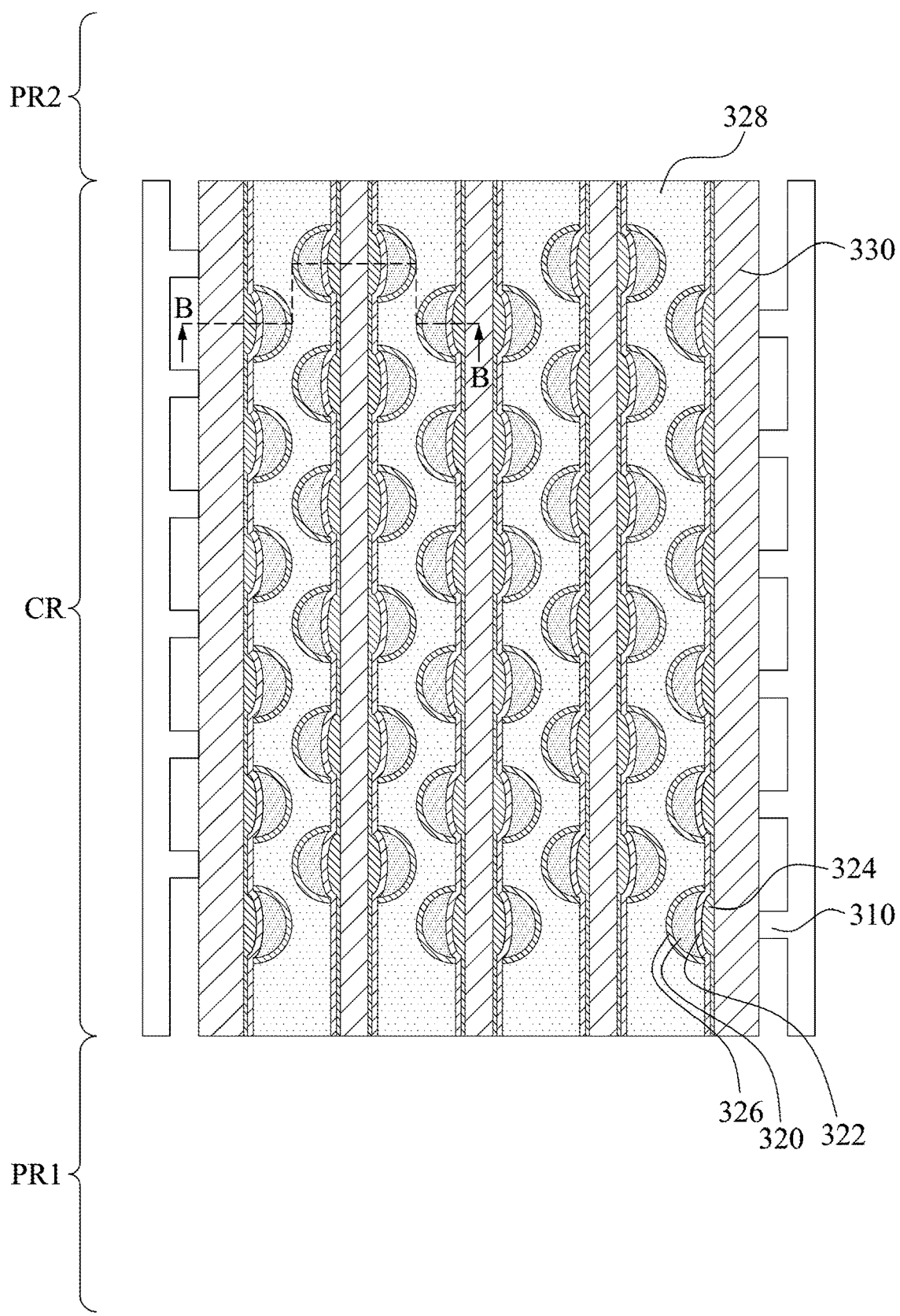
FIGS. 14A, 15A, 16A, 17A, and 18A are schematic top views of various stages in the fabrication of memory device in accordance with some embodiments of the present disclosure.
Figure 14B:
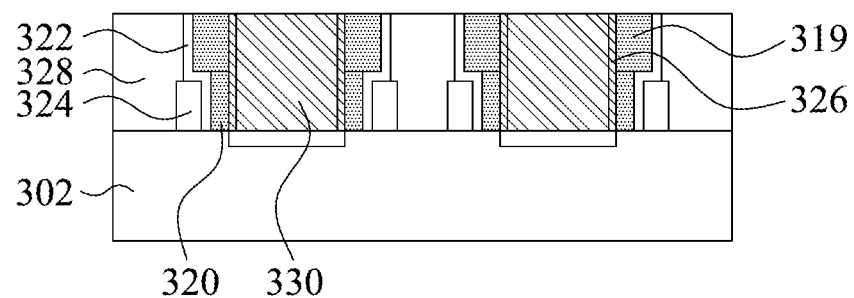
FIG. 14B is a cross-sectional view taken along line B-B of FIG. 14A in accordance with some embodiments of the present disclosure.

Referring to FIGS. 14A and 14B, these figures show an exemplary top view and a cross-section view of fabrication of ground selection transistor of memory device. It is understood that additional operations can be provided before, during, and after processes shown by FIGS. 14A and 14B, and some of the operations described below can be replaced or eliminated, for additional embodiments of the method. The order of the operations/processes may be interchangeable. The detail fabrication method of ground selection transistor and string selection transistor (as shown in FIG. 11) are omitted here and will be described with following embodiments.

A ground line 310 is formed on a substrate 302 using suitable lithography, etching and/or deposition techniques. A first polysilicon layer 319 and silicon nitride layer (not shown) are formed on a substrate 302. The substrate 302 is a silicon substrate in the present embodiment. Alternatively, the substrate 302 may include another elementary semiconductor, such as germanium; a compound semiconductor including silicon carbide, gallium arsenic, gallium phosphide, indium phosphide, indium arsenide, and/or indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 302 is a SOI such as having a buried layer.

After the first polysilicon layer 319 and the silicon nitride later are formed, shallow trench isolation (STI) etching process is performed. The first liner layer 326 may be formed on the sidewall of the first polysilicon layer 319 and silicon nitride layer. The first liner layer 326 may include typical interconnect barrier liner layer materials, such as tantalum, tantalum nitride, and combinations thereof or titanium, titanium nitride and combinations thereof. In some embodiments, a CMP process is performed to remove excess materials.

In some embodiments, another STI etching process is performed and the silicon nitride layer is removed. After the silicon nitride layer is removed, a second polysilicon layer 320 with impurity dopant is filled. In some embodiments, different regions of second polysilicon layer 320 can be doped with suitable dopants to serve as source/drain regions and channel regions of ground selection transistors.

A first gate dielectric layer 322 may be formed as embedded in the second polysilicon layer 320. In some embodiments, the first gate dielectric layer 322 may be silicon oxide or silicon nitride, and in other embodiments, the first gate dielectric layer 322 may include high-k dielectric materials. For example, the first gate dielectric layer 322 may include one layer of metal oxide or a silicate of Hf, Al, Zr, combinations thereof. Other suitable materials include La, Mg, Ba, Ti, Pb, Zr, in the form of metal oxides, metal alloy oxides, and combinations thereof. Exemplary materials include $MgO_x$, $BaTi_xO_y$, $BaSr_xTi_yO_z$, $PbTi_xO_y$, $PbZr_xTi_yO_z$, SiCN, SiON, SiN, $Al_2O_3$, $La_2O_3$, $Ta_2O_5$, $Y_2O_3$, $HfO_2$, $ZrO_2$, HfSiON, $YGe_xO_y$, $YSi_xO_y$, and $LaAlO_3$, and the like.

A ground selection line 324 may be formed as embedded in the first gate dielectric layer 322. The ground selection line 324 may be a doped polysilicon, or other conductive material such as tantalum nitride or other conductive nitride, tungsten or other metal, or a combination of the foregoing. For example, the ground selection line 324 may use TaN, silicide or self-aligned silicide (salicide) in the embodiment.

After STI etching process is performed again, a shallow trench isolation (STI) layer 328 may be formed to separate each of the first polysilicon layer 319 and the second polysilicon layer 320 to define the ground selection line 324 as the conductive layer. The STI layer 328 may be formed by depositing a silicon oxide layer, silicon nitride layer or a silicon oxynitride layer, and the like. For example, the STI layer 328 may be TEOS. The STI layer 328 has a serpentine shape in top view and thus has asymmetrical opposite sides, and portions of the second polysilicon layers 320 are respectively embedded in the asymmetrical sides. Moreover, another STI layer 330 may be formed in parallel to the STI layer 328. The STI layer 330 may be formed by depositing a silicon oxide layer, silicon nitride layer or a silicon oxynitride layer, and the like. For example, the STI layer 330 may be TEOS.

Referring to FIG. 14A, the first polysilicon layer 319, the second polysilicon layer 320, the first gate dielectric layer 322, and the ground selection line 324 are formed in a cell region CR to serve as ground selection transistors. In such a way, embedded portions of the ground selection line 324 opposite and embedded in the first polysilicon layer 319 and the second polysilicon layer 320 can serve as gates of the ground selection transistors. Peripheral regions PR1 and PR2 are on opposite sides of the cell region CR, and free of the ground selection transistors. Fabrication of the ground selection transistors is similar to fabrication of the memory cells as described with reference with FIGS. 15A-25 below.

Figure 15A:
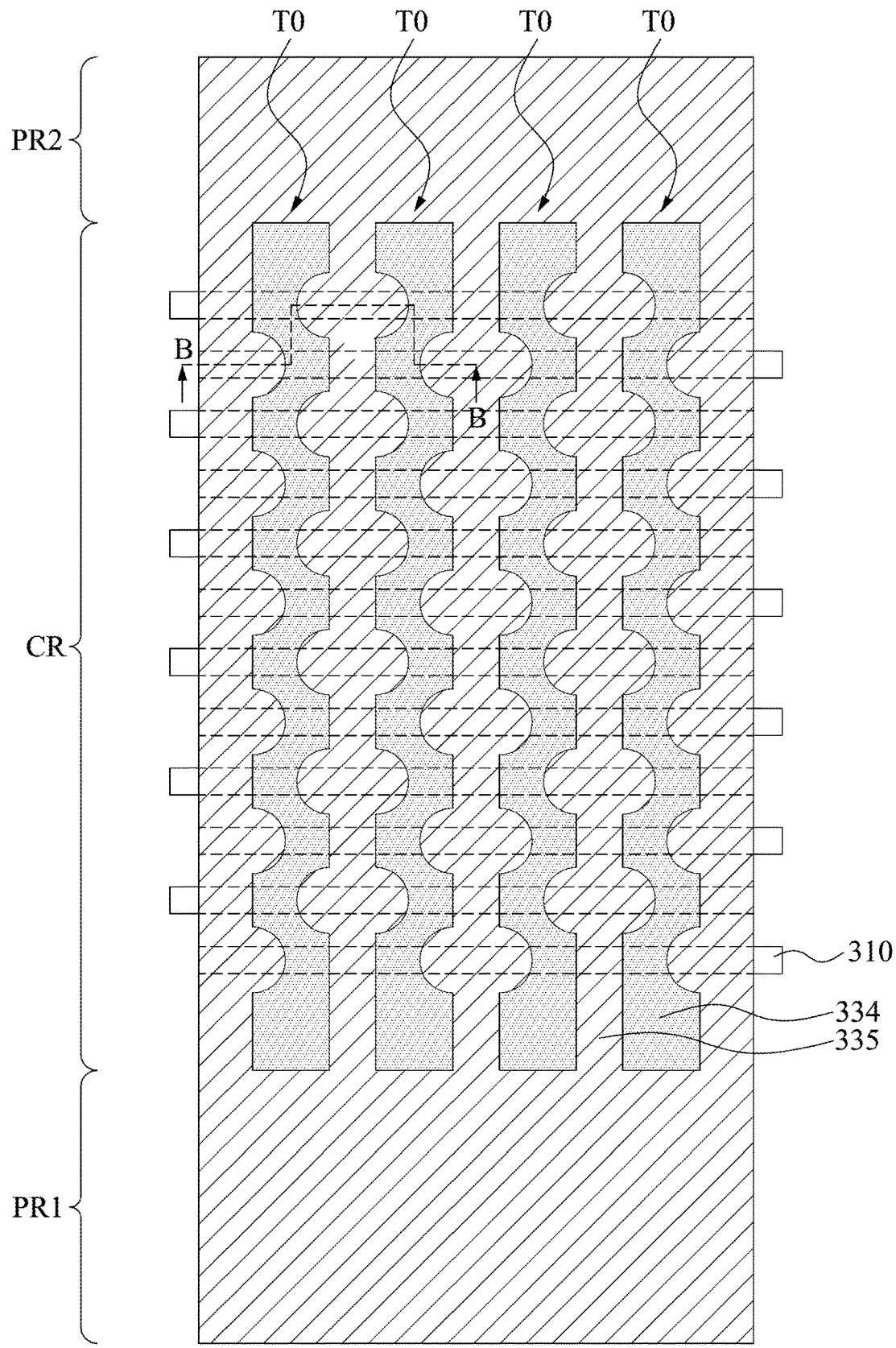
Figure 15B:
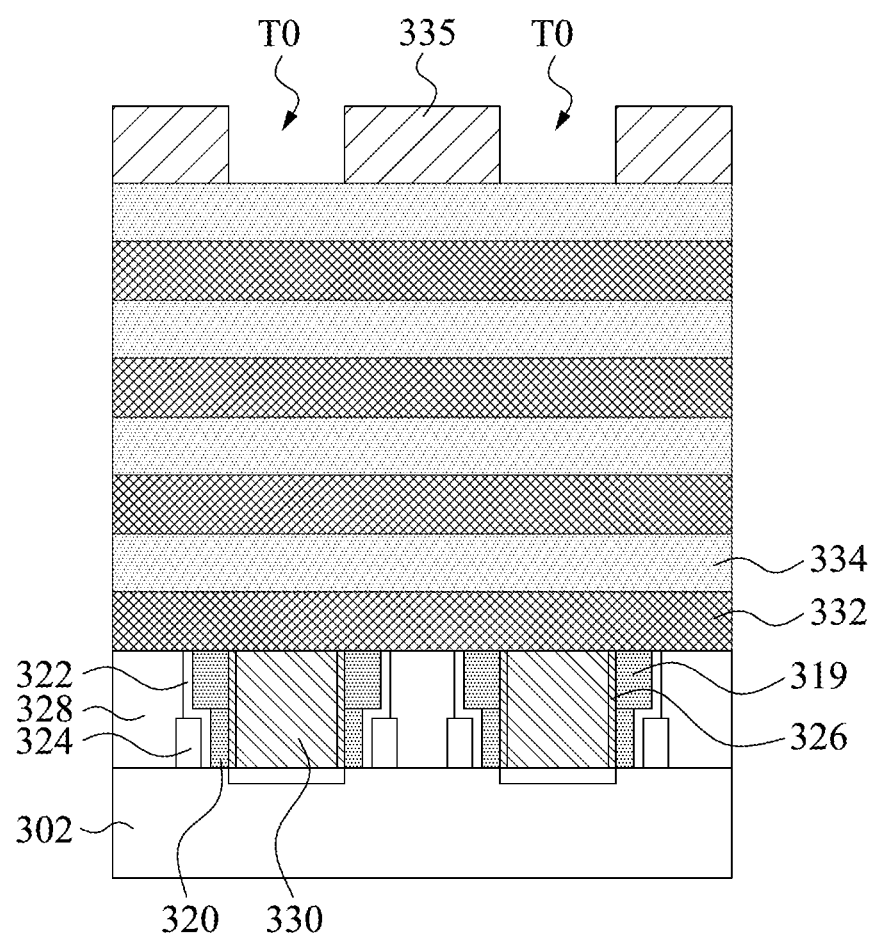
FIG. 15B is a cross-sectional view taken along line B-B of FIG. 15A in accordance with some embodiments of the present disclosure.

Referring to FIGS. 15A and 15B, a plurality of silicon nitride layers 332 and third polysilicon layers 334 are alternatingly stacked on the ground selection transistors and across the cell region CR and the peripheral regions PR1 and PR2. A patterned hard mask layer 335 is formed over the stack of third polysilicon layers 334 and silicon nitride layers 332. The patterned hard mask layer 335 may include photoresist, silicon dioxide, silicon carbon nitride, silicon oxynitride, silicon nitride, or the like, but other suitable dielectric films may be used. For example, silicon nitride may be used in the embodiment. The patterned hard mask layer 335 may be formed using suitable deposition, lithography, and/or etching techniques. Patterning the hard mask layer 335 results in serpentine trenches T0 in the patterned hard mask layer 335 arranged in parallel. The serpentine trenches T0 expose underlying materials (e.g., the third polysilicon layer 334) in the cell region CR. Peripheral regions PR1 and PR2 are covered by the hard mask layer 335 so as to protect the stack of third polysilicon layers 334 and silicon nitride layers 332 in the peripheral regions PR1 and PR2.

Figure 16A:
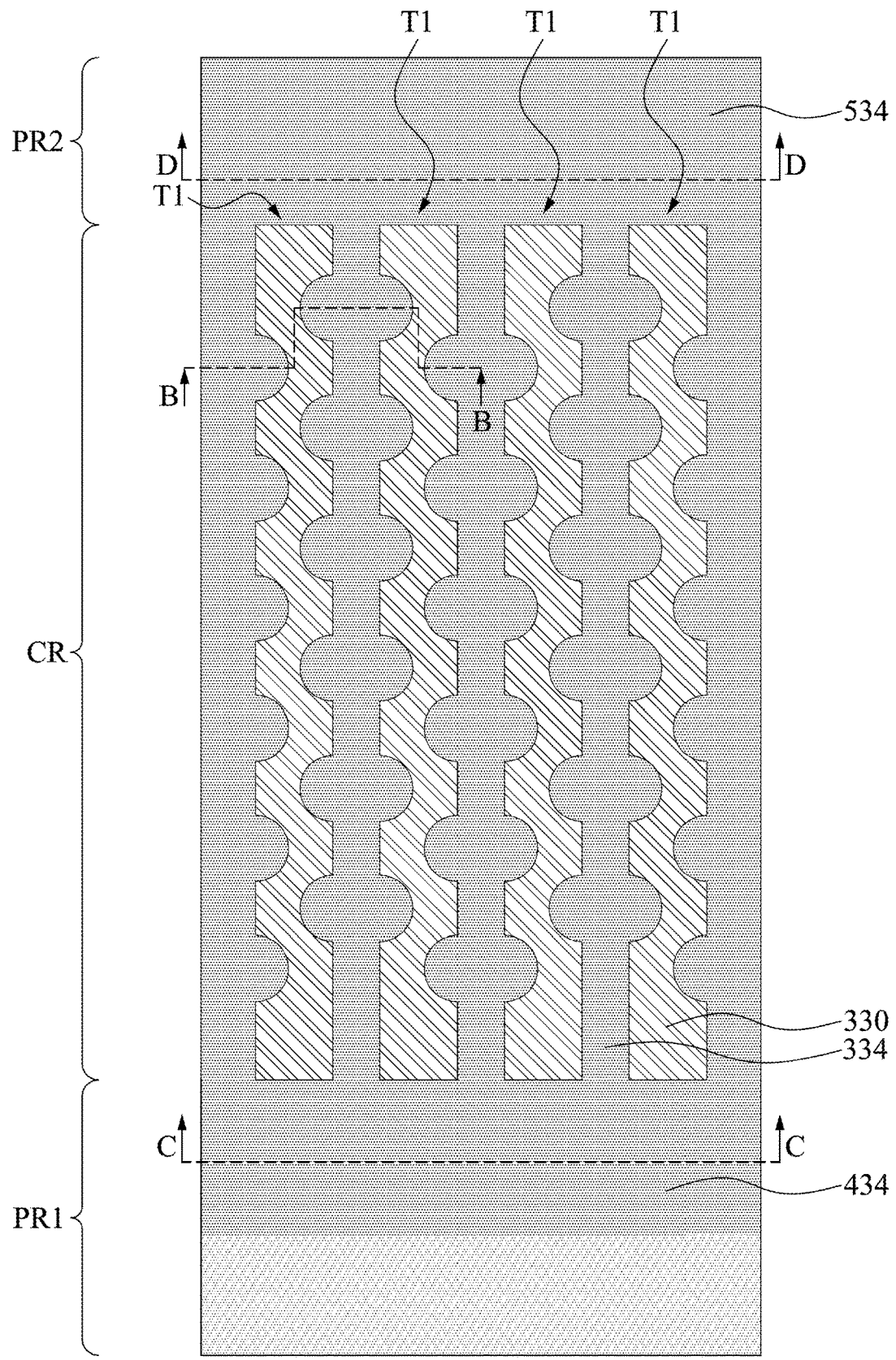
Figure 16B:
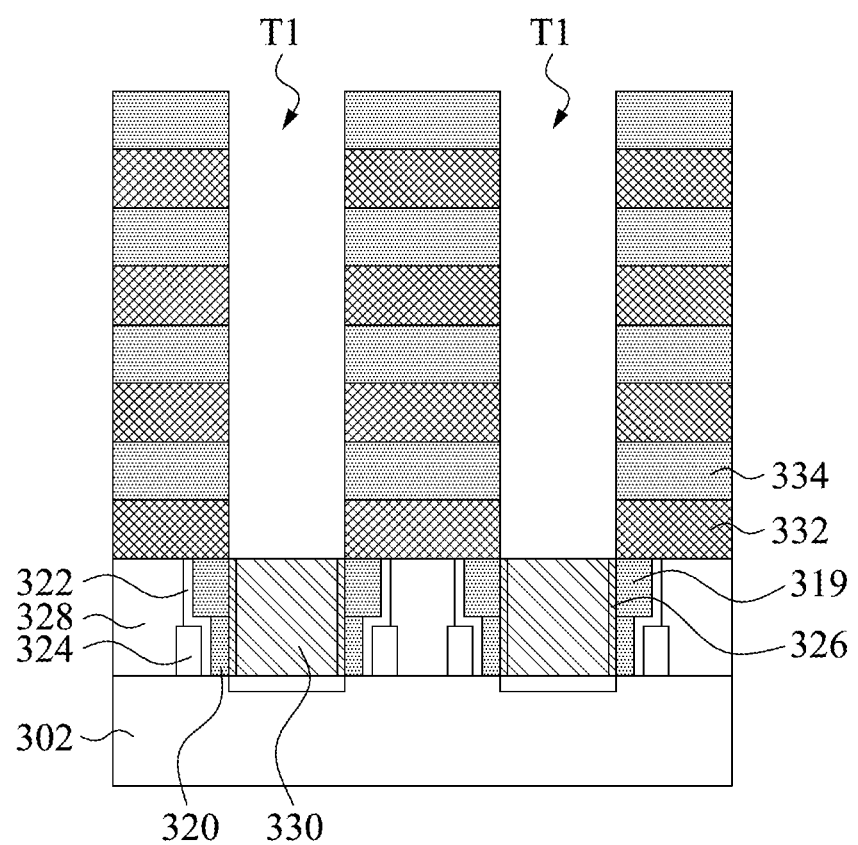
FIG. 16B is a cross-sectional view taken along line B-B of FIG. 16A in accordance with some embodiments of the present disclosure.
Figure 16C:
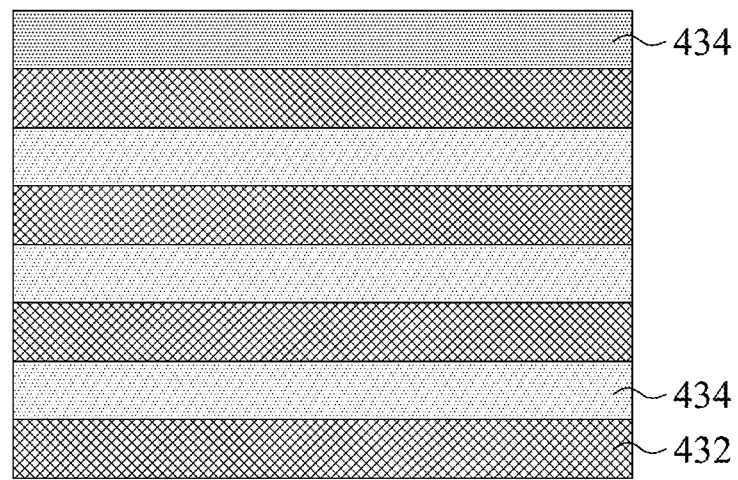
FIG. 16C is a cross-sectional view taken along line C-C of FIG. 16A in accordance with some embodiments of the present disclosure.
Figure 16D:
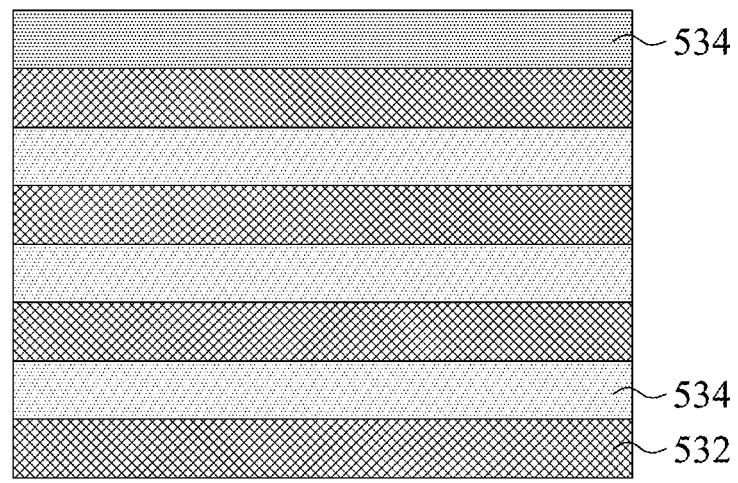
FIG. 16D is a cross-sectional view taken along line D-D of FIG. 16A in accordance with some embodiments of the present disclosure.

Referring to FIGS. 16A and 16B, the DTI etching is performed to the exposed materials uncovered by the patterned hard mask layer 335 using the patterned hard mask layer 335 as an etch mask, so that the pattern of serpentine trenches T0 are transferred to the stack of the silicon nitride layers 332 and the third polysilicon layers 334, resulting in etching trenches T1 into the stack of the silicon nitride layers 332 and the third polysilicon layers 334. The DTI etching terminates at the STI layer 330. In some embodiments, an end point detection technique may be used in determining stopping of the DTI etching process. The etching process may use either dry or wet etching. When dry etching is used, the process gas may include $CF_4$, $CHF_3$, $NF_3$, $SF_6$, $Br_2$, HBr, $Cl_2$, or combinations thereof. Diluting gases such as $N_2$, $O_2$, or Ar may optionally be used. When wet etching is used, the etching solution (etchant) may include $NH_4OH:H_2O_2:H_2O$ (APM), $NH_2OH$, KOH, $HNO_3:NH_4F:H_2O$, and/or the like. The hard mask layer 335 is removed from the cell region CR, and the peripheral regions PR1 and PR2. Referring to FIGS. 16C and 16D, a plurality of silicon nitride layers 432 and third polysilicon layers 434 are alternatingly stacked on the peripheral region PR1. The silicon nitride layers 432 continuously extend from the corresponding silicon nitride layers 332 in the cell region CR, and the third polysilicon layers 434 continuously extend from the corresponding third polysilicon layers 334 in the cell region CR as well. A plurality of the silicon nitride layers 532 and the third polysilicon layer 534 are alternatingly stacked on the peripheral region PR2 as well. The silicon nitride layers 532 continuously extend from the corresponding silicon nitride layers 332 in the cell region CR, and the third polysilicon layers 534 continuously extend from the corresponding third polysilicon layers 334 in the cell region CR as well.

Figure 17A:
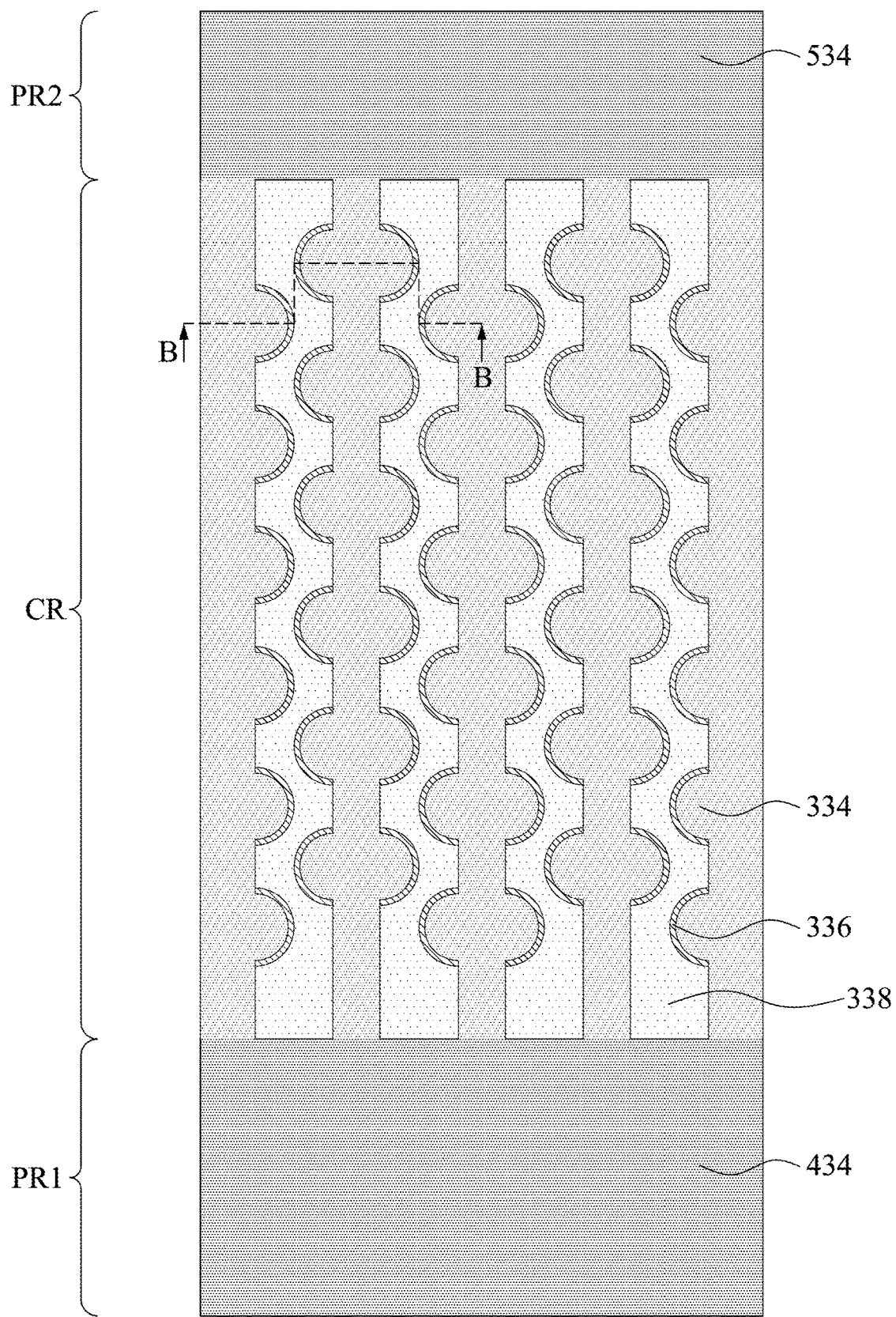
Figure 17B:
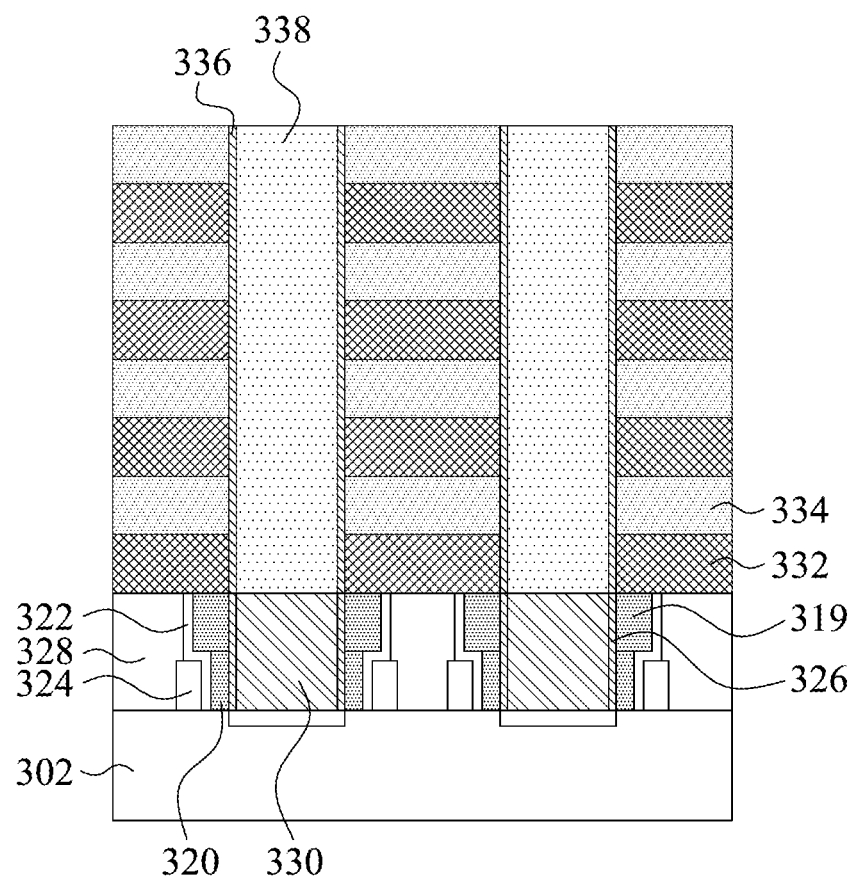
FIG. 17B is a cross-sectional view taken along line B-B of FIG. 17A in accordance with some embodiment of the present disclosure.

Referring to FIGS. 17A and 17B, the second liner layers 336 is formed on the exposed sidewall of the stack of the silicon nitride layer 332 and the third polysilicon layers 334. After sidewalls of the trenches T1 are lined by the second liner layers 336, the trenches T1 are then filled with insulating materials to form first DTI layers 338 in the respective trenches T1. In some embodiments, the first DTI layers 338 include silicon oxide layer, silicon nitride layer or silicon oxynitride layer, and the like. The first DTI layers 338 may be formed by CVD, PECVD, ALD, or FCVD. A planarization process, such as a CMP process, may be performed to remove excess materials of second liner layers 336 and/or first DTI layers 338.

Figure 18A:
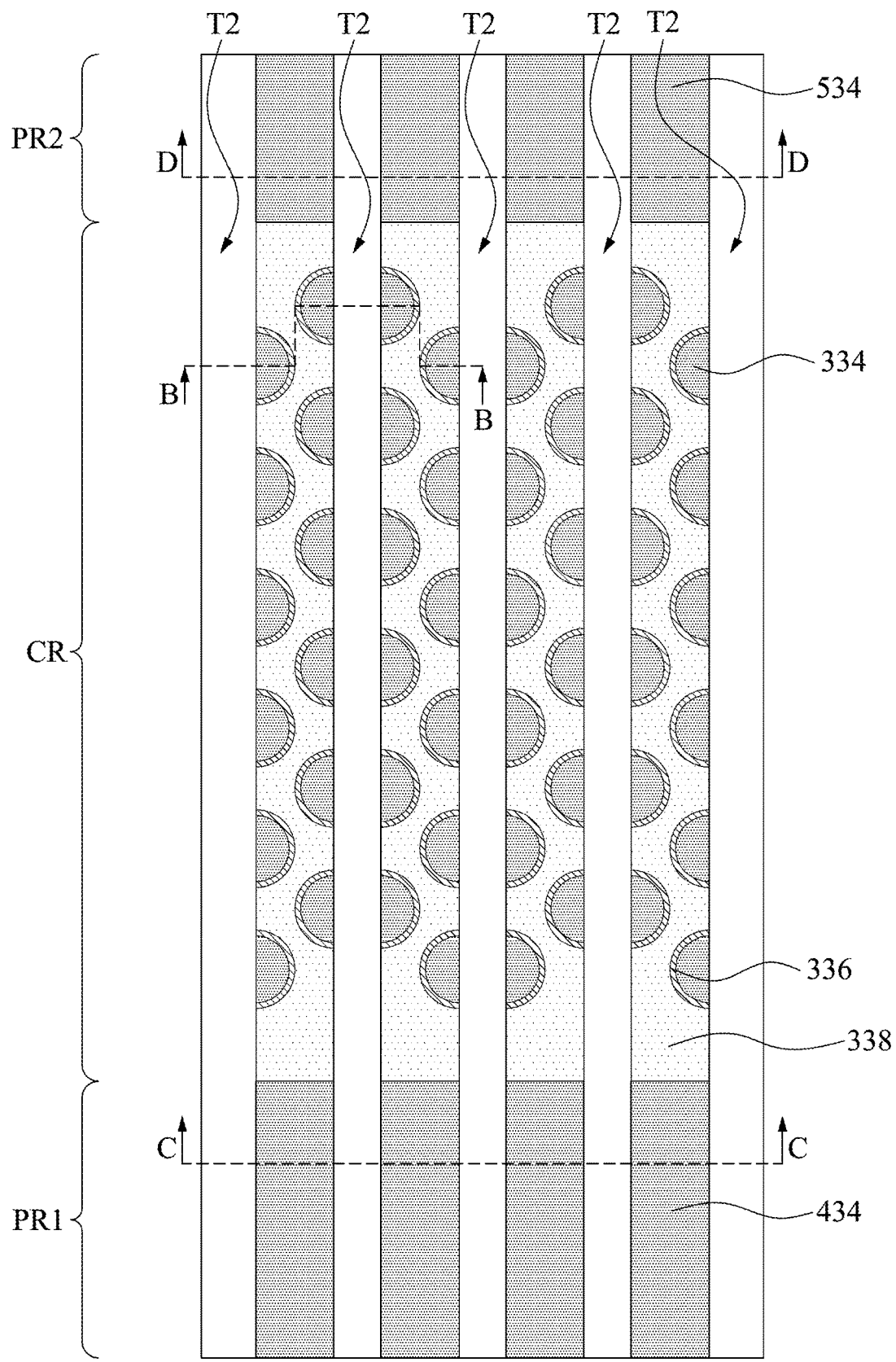
Figure 18B:
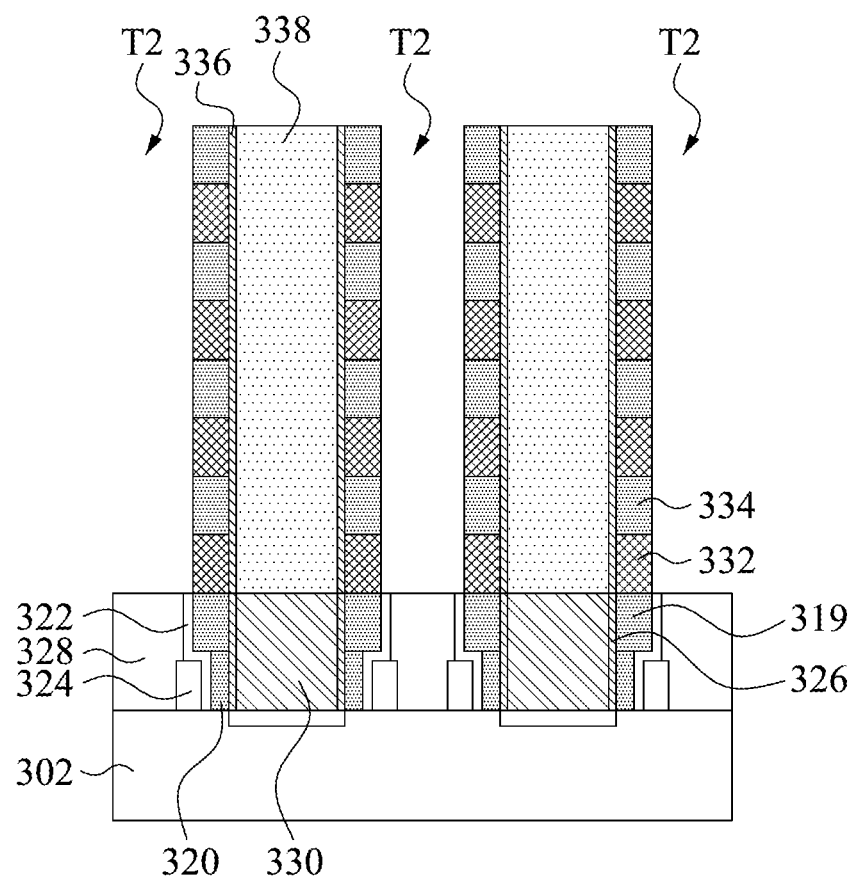
FIG. 18B is a cross-sectional view taken along line B-B of FIG. 18A in accordance with some embodiments of the present disclosure.
Figure 18C:
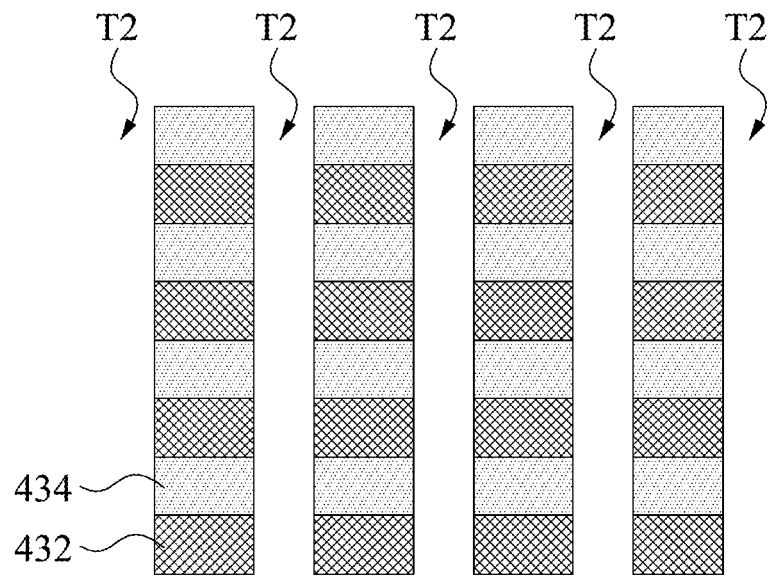
FIG. 18C is a cross-sectional view taken along line C-C of FIG. 18A in accordance with some embodiments of the present disclosure.
Figure 18D:
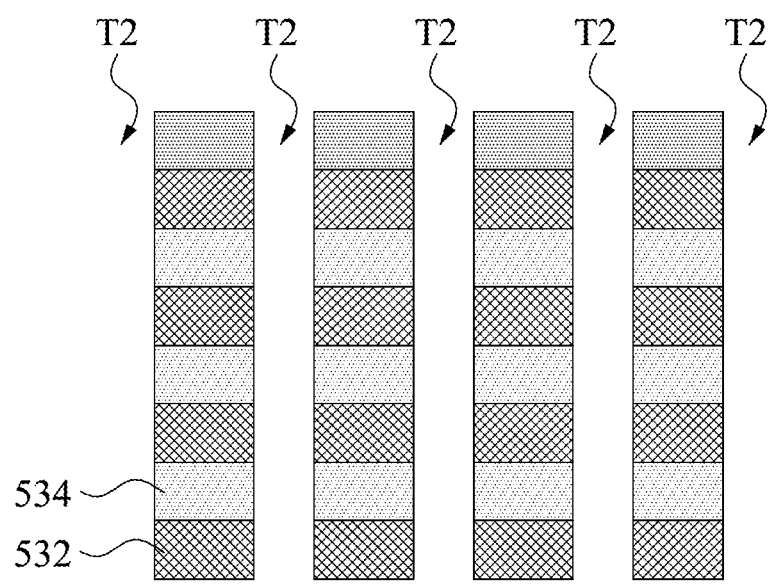
FIG. 18D is a cross-sectional view taken along line D-D of FIG. 18A in accordance with some embodiments of the present disclosure.

Referring to FIGS. 18A to 18D, another DTI etching process is performed to etch trenches T2 into the stack of silicon nitride layers 332 and third polysilicon layers 334 so as to form active area. The trenches T2 are alternatingly arranged with the first DTI layers 338. The trenches T2 have a stripe shape, different from the serpentine shape of the first DTI layers 338. The trenches T2 extends across the cell region CR and the peripheral regions PR1 and PR2, so that the trenches T2 are also etched into the stack of silicon nitride layers 432 and third polysilicon layers 434 in the peripheral region PR1 (as shown in FIG. 18C), and the trenches T2 are also etched into the stack of silicon nitride layers 532 and third polysilicon layers 534 in the peripheral region PR2 (as shown in FIG. 18D). An end point detection technique may be used in determine stopping of the DTI etching process. The etching process may use either dry or wet etching. When dry etching is used, the process gas may include $CF_4$, $CHF_3$, $NF_3$, $SF_6$, $Br_2$, HBr, $Cl_2$, or combinations thereof. Diluting gases such as $N_2$, $O_2$, or Ar may optionally be used. When wet etching is used, the etching solution (etchant) may include $NH_4OH:H_2O_2:H_2O$ (APM), $NH_2OH$, KOH, $HNO_3:NH_4F:H_2O$, and/or the like.

Figure 19A:
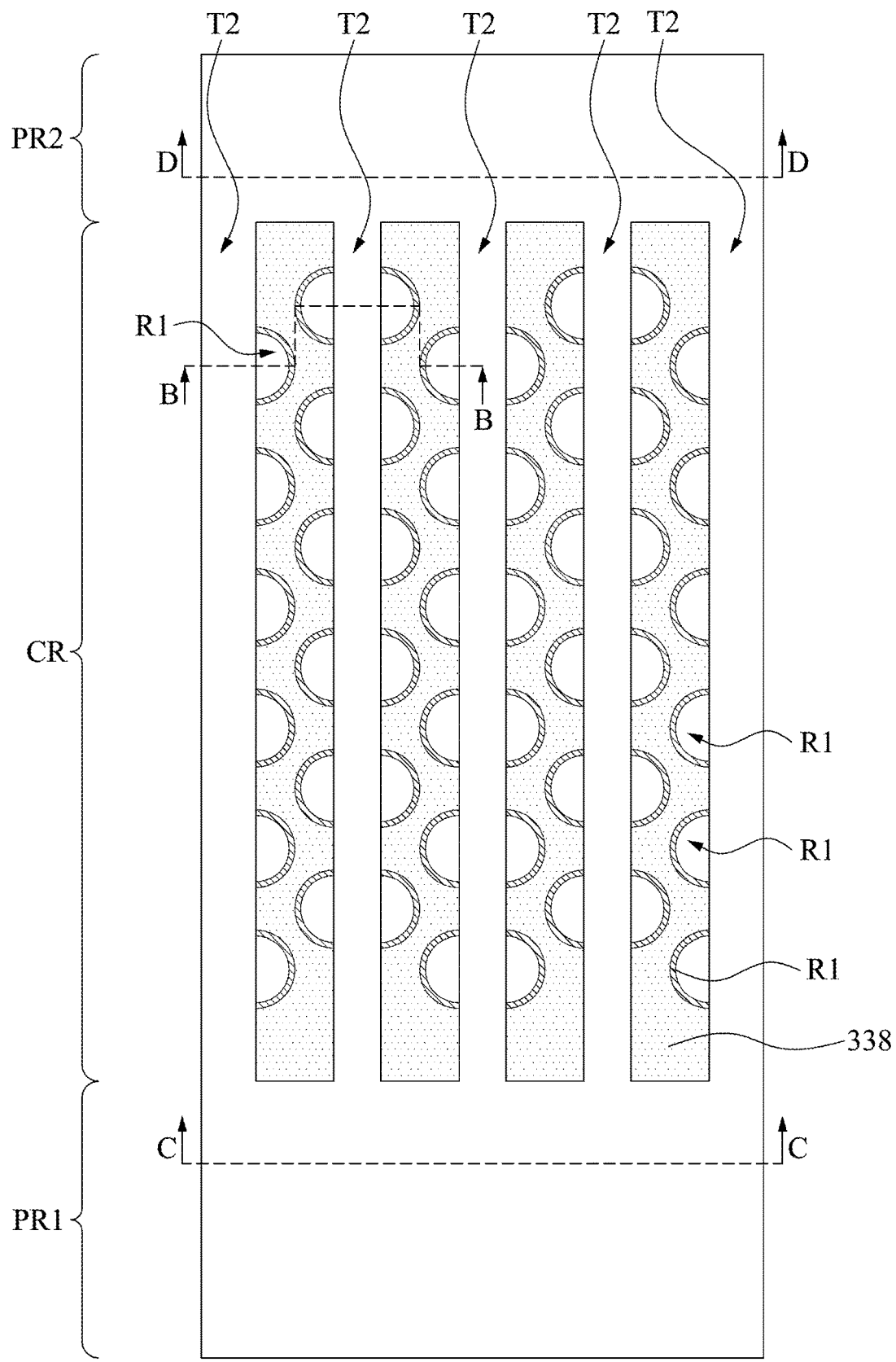
FIGS. 19A, 20A, 21A, 22A, 23A, 24A and 25 are horizontally cross-sectional views of the memory device taken along a level of one of removed silicon nitride layers in accordance with some embodiments of the present disclosure.
Figure 19B:
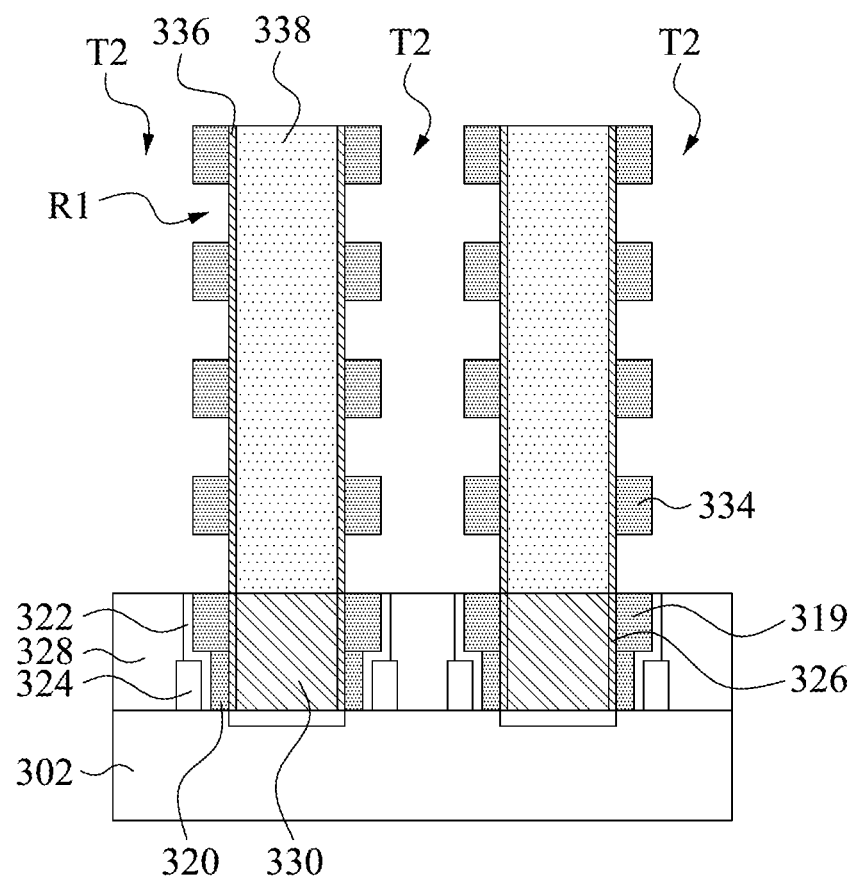
FIG. 19B is a cross-section view taken along line B-B of FIG. 19A in accordance with some embodiments of the present disclosure.
Figure 19C:
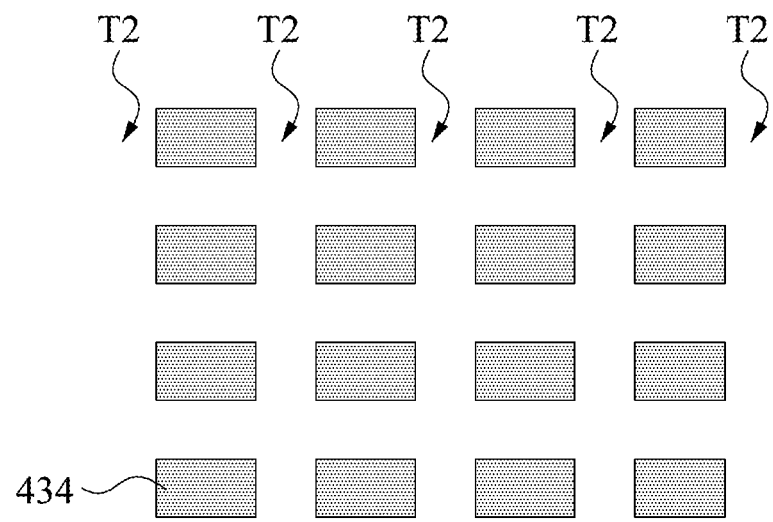
FIG. 19C is a cross-sectional view taken along line C-C of FIG. 19A in accordance with some embodiments of the present disclosure.
Figure 19D:
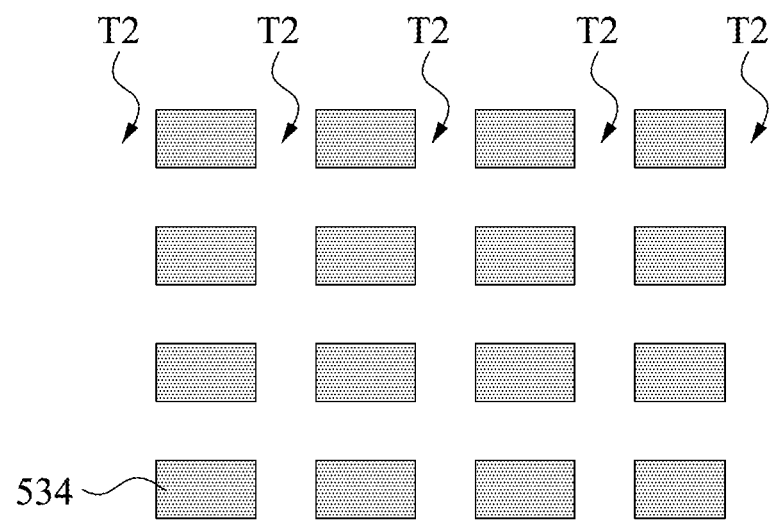
FIG. 19D is a cross-sectional view taken along line D-D of FIG. 19A in accordance with some embodiments of the present disclosure.

Referring to FIGS. 19A and 19B, the silicon nitride layers 332 are removed. After the silicon nitride layers 332 are removed, recesses R1 are formed between the vertically arranged third polysilicon layers 334 in the cell region CR. It is understood that FIG. 19A and following FIGS. 20A, 21A, 22A, 23A, 24A and 25 are horizontally cross-sectional views of the memory device taken along a level of one of removed silicon nitride layers. Moreover, as shown in FIGS. 19C and 19D, the silicon nitride layers 432 and 532 are removed from the polysilicon/nitride stacks in the peripheral regions PR1 and PR2 as well, which in turn results in the third polysilicon layers 434 without intervening silicon nitride layers in the peripheral region PR1, and the third polysilicon layers 534 without intervening silicon nitride layers in the peripheral region PR2.

Figure 20A:
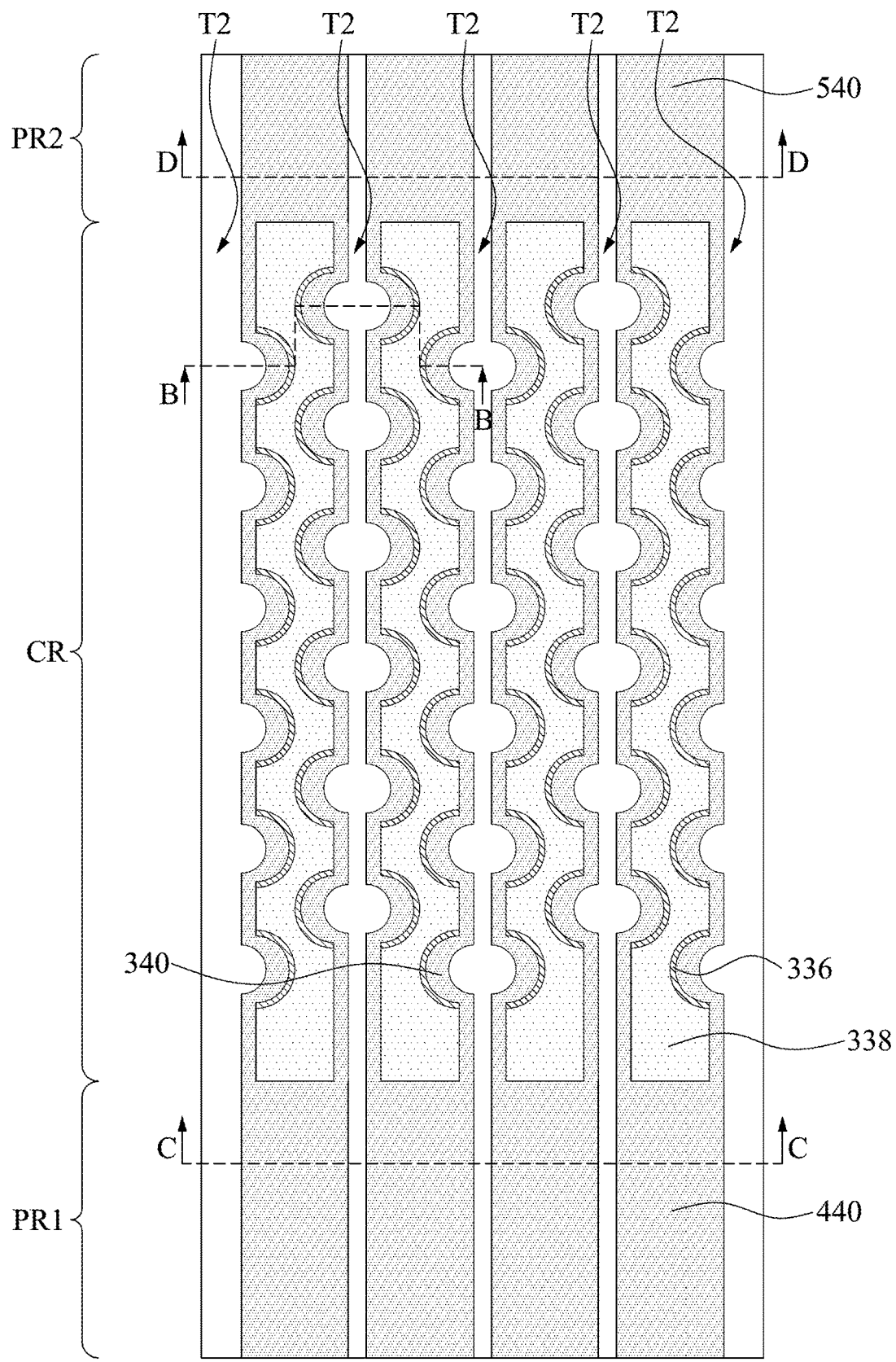
Figure 20B:
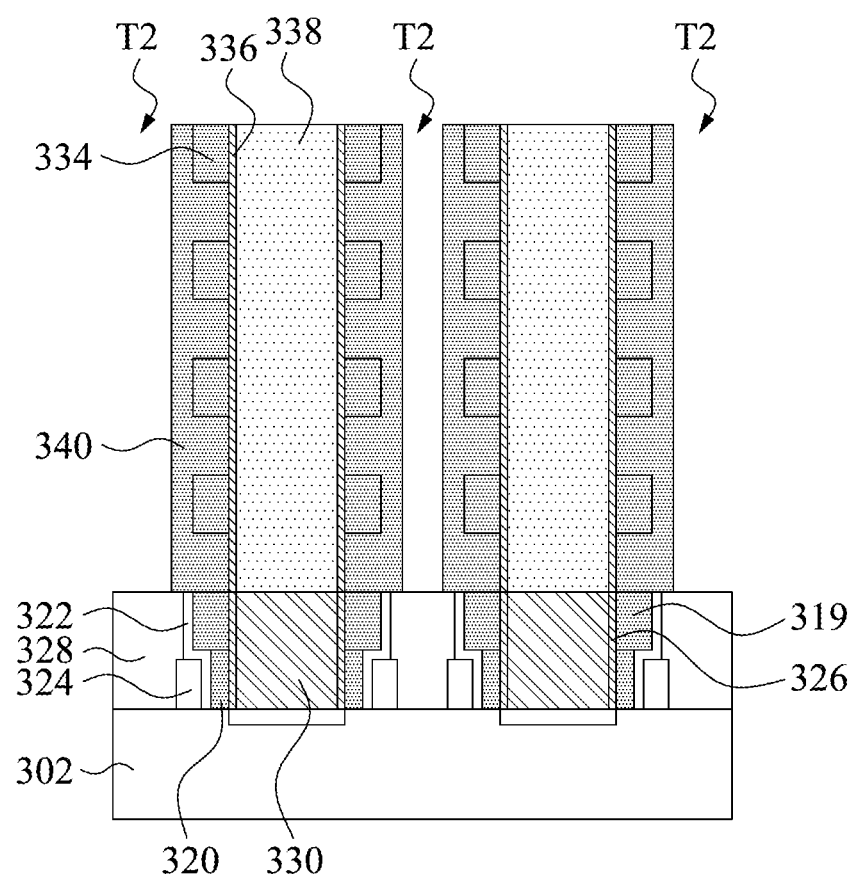
FIG. 20B is a cross-sectional view taken along line B-B of FIG. 20A in accordance with some embodiments of the present disclosure.
Figure 20C:
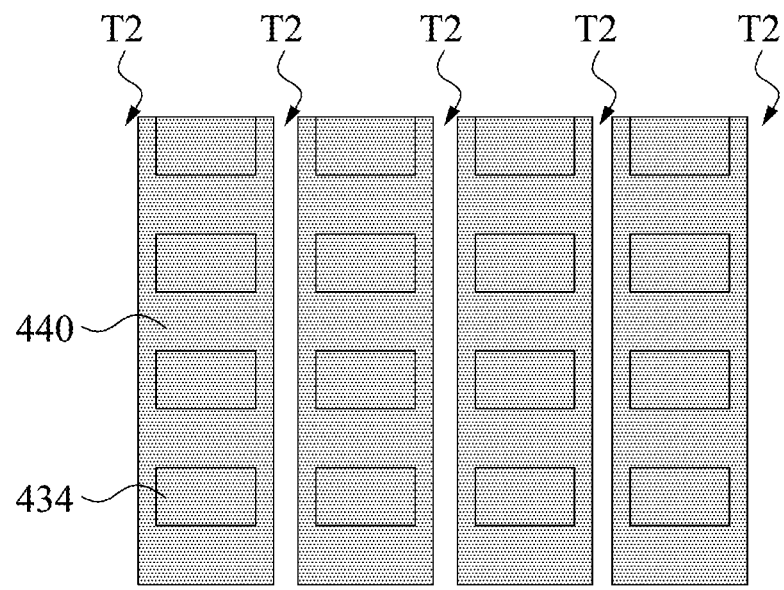
FIG. 20C is a cross-sectional view taken along line C-C of FIG. 20A in accordance with some embodiments of the present disclosure.
Figure 20D:
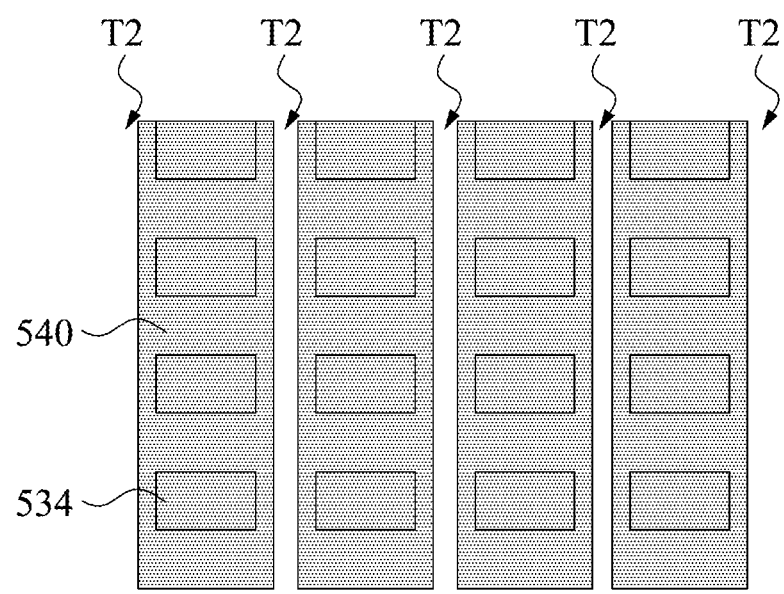
FIG. 20D is a cross-sectional view taken along line D-D of FIG. 20A in accordance with some embodiments of the present disclosure.

Referring to FIGS. 20A and 20B, recessed cell integration (RCI) process is performed. That is, after the recesses R1 are formed, the recesses R1 are filled with a fourth polysilicon layer 340 with impurity dopant. After the fourth polysilicon layer 340 is formed, a thermal annealing process is performed. As shown in FIGS. 20C and 20D, the fourth polysilicon layers 440 and 540 are formed on the peripheral regions PR1 and PR2, respectively.

Referring to FIGS. 21A to 21E, implant processes are performed to the fourth polysilicon layer 340, followed by an anneal process to active the implanted dopants. The third polysilicon layer 334 and the fourth polysilicon layer 340 are defined as vertical channel 350. Each of the fourth polysilicon layers 340 is alternatingly stacked on the third polysilicon layer 334. That is, the vertical channel 350 has an undulating sidewall 351. In some embodiments, the undulating sidewall 351 of the vertical channel 350 includes a plurality of peaks 351$p$ and troughs 351$t$ alternating arranged.

Figure 21A:
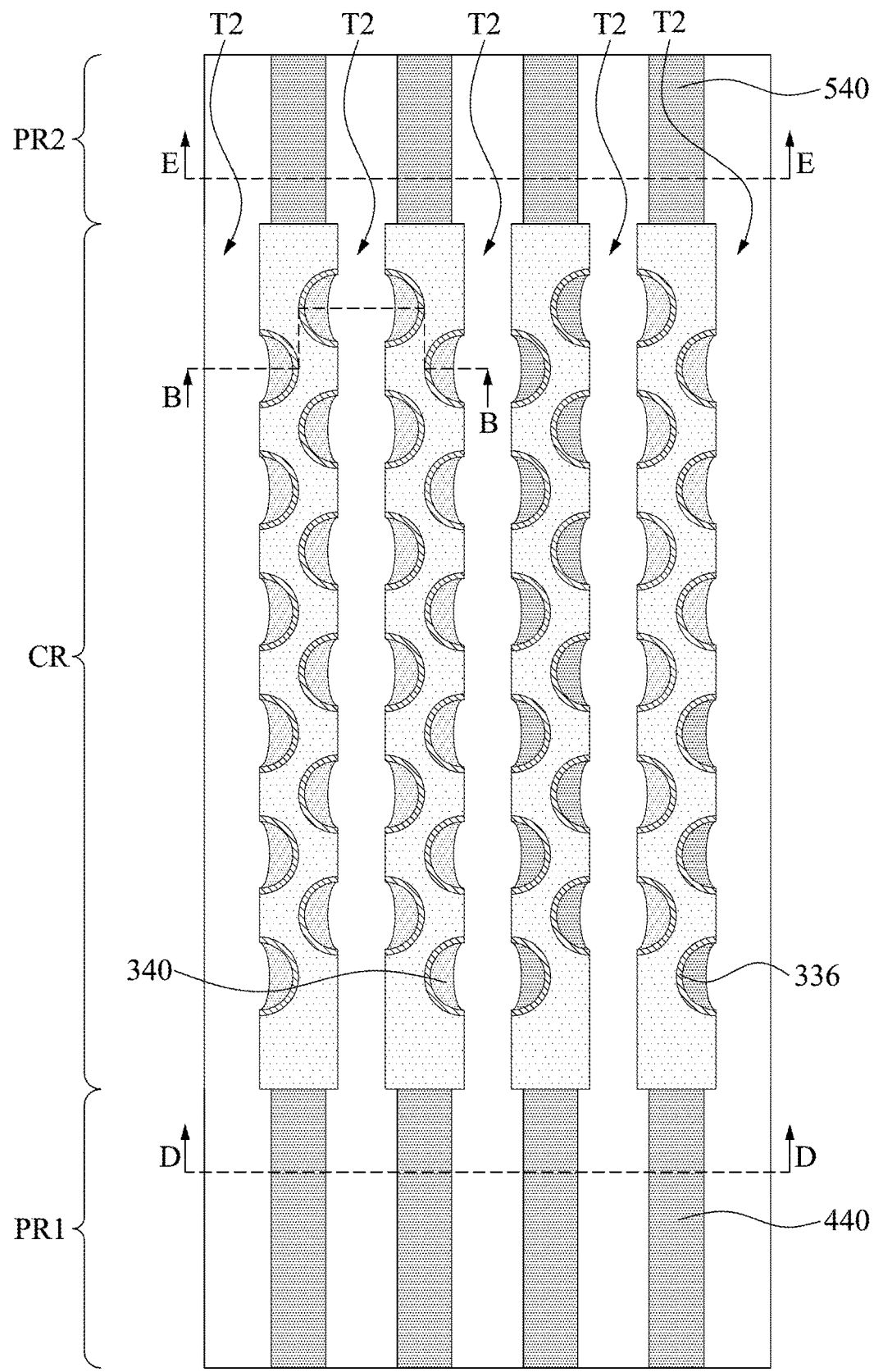
Figure 21B:
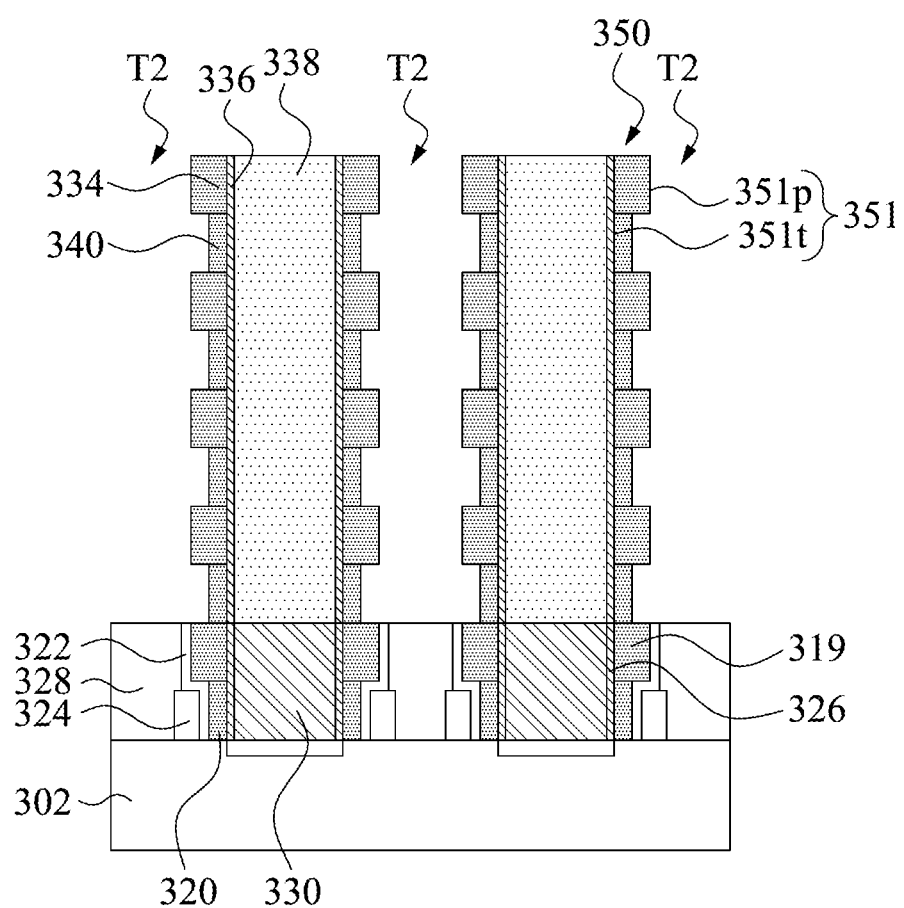
FIG. 21B is a cross-sectional view taken along line B-B of FIG. 21A in accordance with some embodiments of the present disclosure.
Figure 21C:
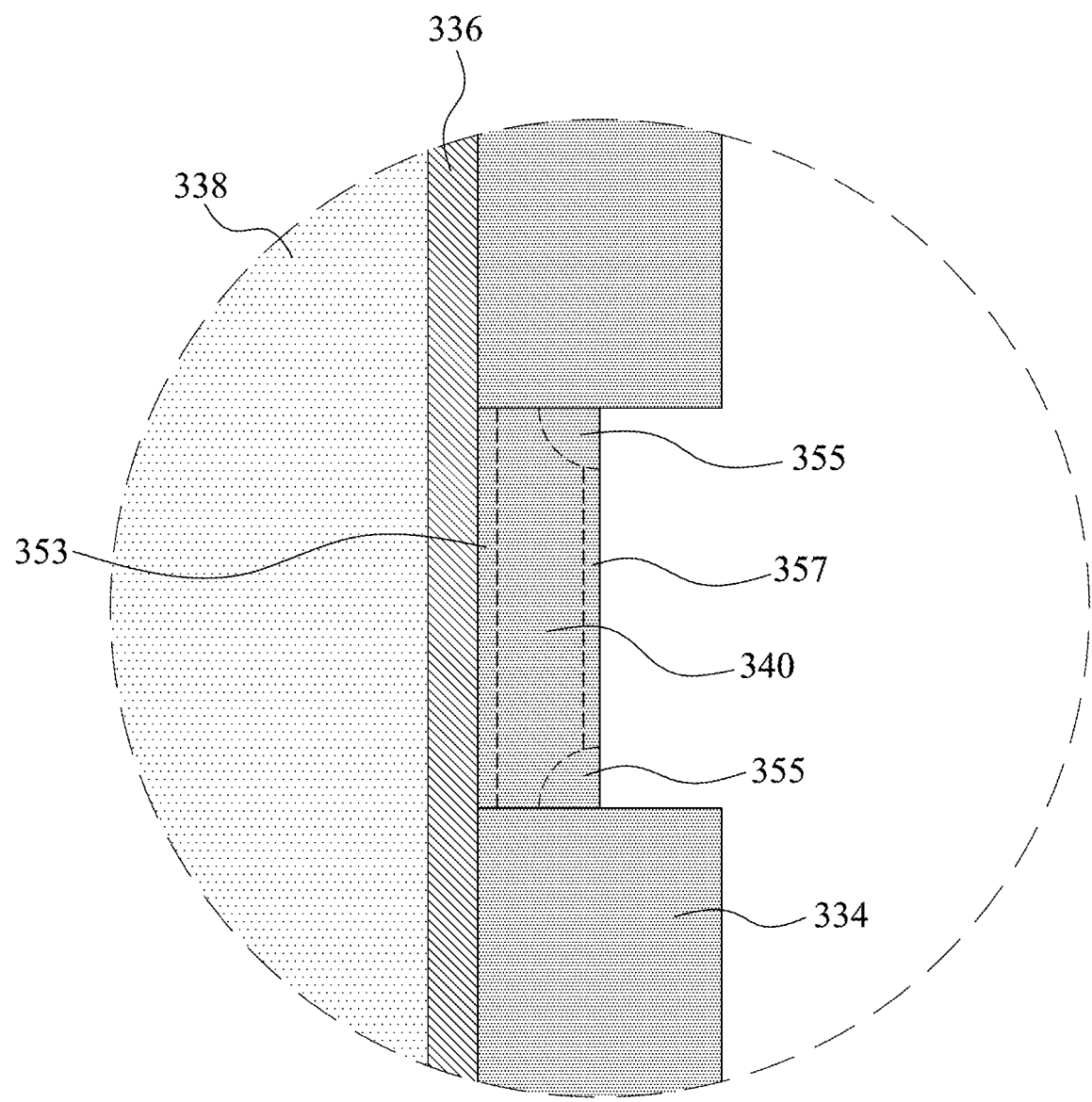
FIG. 21C is a partially enlarged view of FIG. 21B.
Figure 21D:
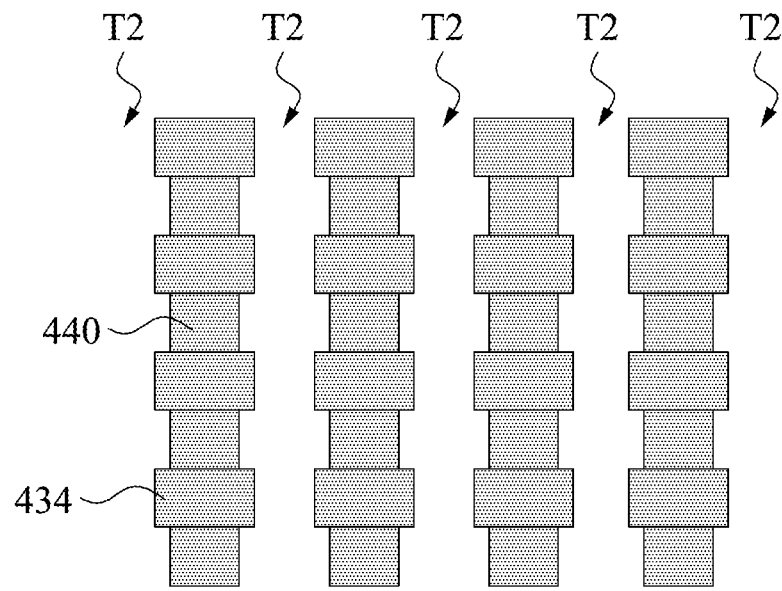
FIG. 21D is a cross-sectional view taken along line D-D of FIG. 21A in accordance with some embodiments of the present disclosure.
Figure 21E:
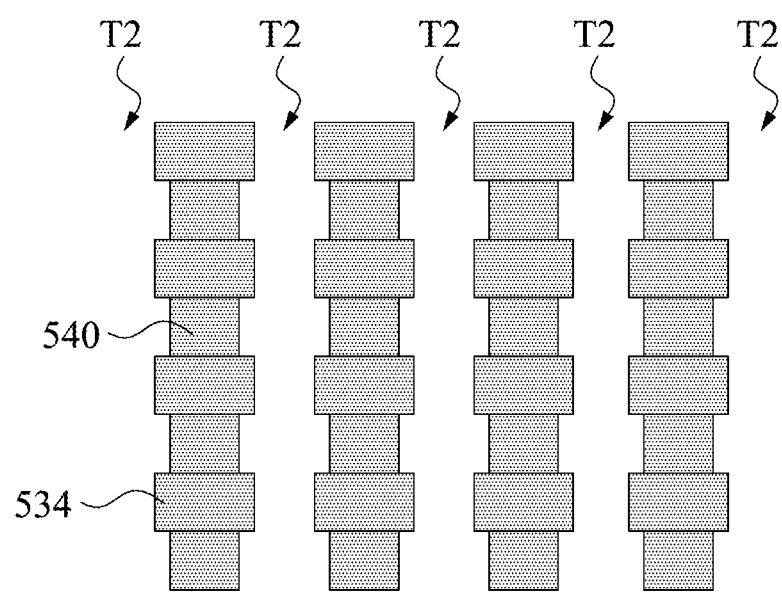
FIG. 21E is a cross-sectional view taken along line E-E of FIG. 21A in accordance with some embodiments of the present disclosure.

FIG. 21C is partially enlarged view of FIG. 21B. Referring to FIG. 21C, source/drain regions 355 are formed in the fourth polysilicon layers 340 by controlling dopants of ion implantation with a specific angle. The implant processes results in a substrate implant region 353, source/drain regions 355, and a channel region 357 in each fourth polysilicon layer 340. The channel region 357 is present between the source/drain regions 355. The dopant type of ion implantation may include P-type dopants or N-type dopants. For example, P-type dopants may be boron or $BF_2$, and N-type dopants may be phosphorous or arsenic. In some embodiment, a P-type dopant is implanted in the substrate implant region 353, an N-type dopant is in the source/drain regions 355, and a P-type dopant or N-type dopant is implanted in the channel region 357. In other words, the substrate implant region 353, the source/drain regions 355, and the channel region 357 can be doped with suitable dopants according to their electrical properties. As a result of the implantation processes, the source/drain regions 355 and the channel region 357 between the source/drain regions 355 can serve as a transistor that acts as a memory cell.

In some embodiments, the anneal process performed after the implant processes is a rapid thermal annealing (RTA) process performed at a temperature ranging between about 700 Celsius and about 1200 Celsius for a duration ranging between about 30 seconds and about 90 seconds. In further embodiments, conventional furnace annealing (CFA) process may be performed at a temperature ranging between about 900 Celsius and about 1200 Celsius for a duration ranging between about 30 minutes and about 2 hours.

Referring to FIGS. 22A to 22D, a second gate dielectric layer 342 is formed on the sidewall of the fourth polysilicon layer 340. The second gate dielectric layer 342 is conformal to the undulating sidewall 351 of the vertical channel 350. In some embodiments, the second gate dielectric layer 342 is made of silicon oxide or silicon nitride, and in other embodiments, the second gate dielectric layer 342 may include high-k dielectric materials. For example, the second gate dielectric layer 342 may include one or more layers of metal oxide or a silicate of Hf, Al, Zr, combinations thereof. Other suitable materials include La, Mg, Ba, Ti, Pb, Zr, in the form of metal oxides, metal alloy oxides, and combinations thereof. Exemplary materials include $MgO_x$, $BaTi_xO_y$, $BaSr_xTi_yO_z$, $PbTi_xO_y$, $PbZr_xTi_yO_z$, SiCN, SiON, SiN, $Al_2O_3$, $La_2O_3$, $Ta_2O_5$, $Y_2O_3$, $HfO_2$, $ZrO_2$, HfSiON, $YGe_xO_y$, $YSi_xO_y$, and $LaAlO_3$, and the like.

After the second gate dielectric layer 342 is formed, a conductive layer 344 is formed as embedded in the second gate dielectric layer 342 using suitable deposition techniques. The conductive layer 344 is doped polysilicon, or other conductive material such as tantalum nitride or other conductive nitride, tungsten or other metal, or the combination of the foregoing. For example, the conductive layer 344 uses TaN as material in the embodiment. The conductive layer 344 can serve as a gate for a transistor. In embodiments that the transistor acts as a memory cell, the conductive layer 344 acts as a word line.

Figure 22A:
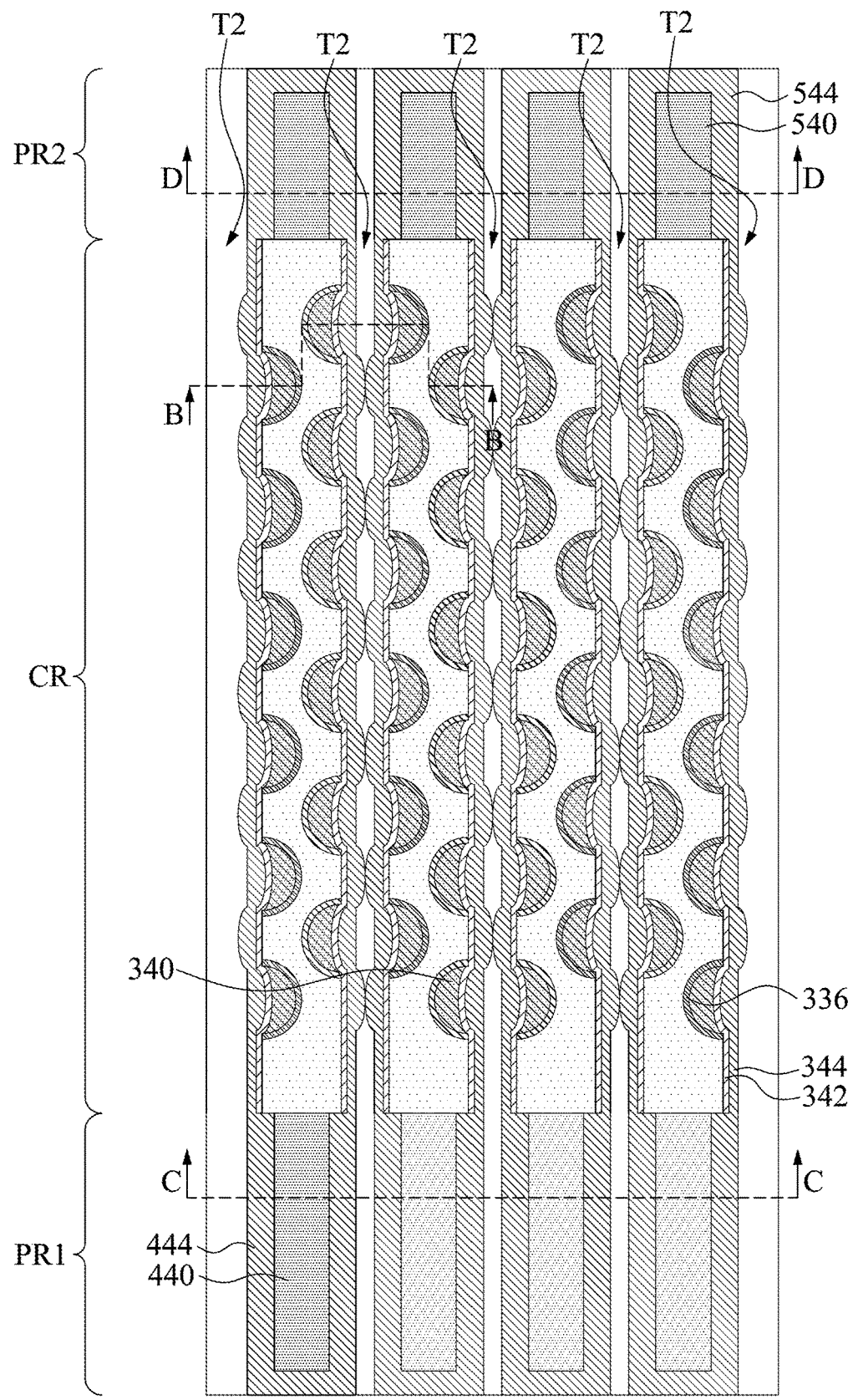
Figure 22B:
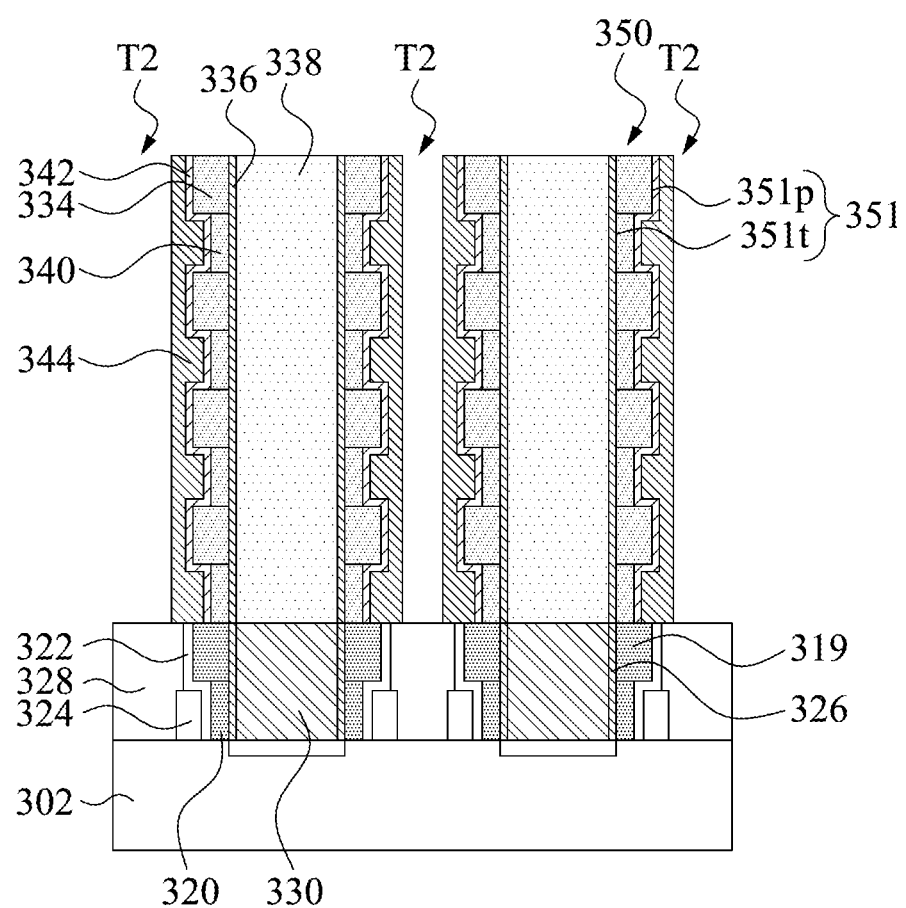
FIG. 22B is a cross-sectional view taken along line B-B of FIG. 22A in accordance with some embodiments of the present disclosure.
Figure 22C:
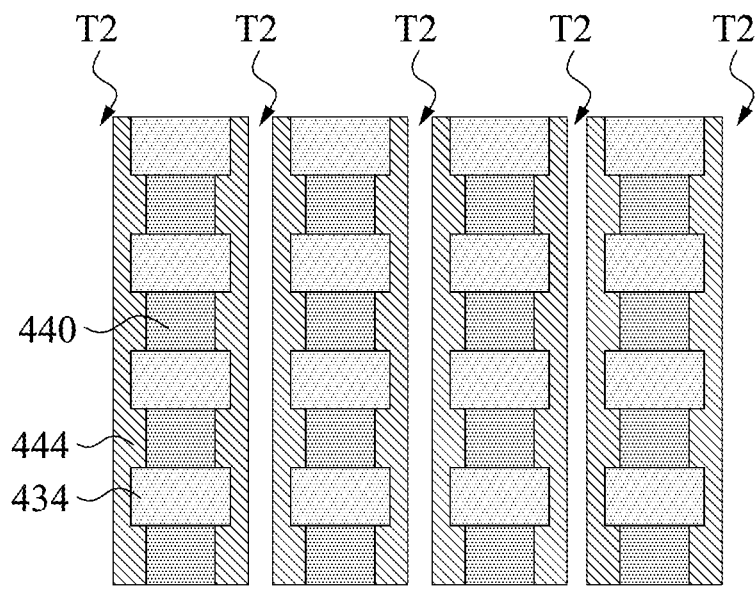
FIG. 22C is a cross-sectional view taken along line C-C of FIG. 22A in accordance with some embodiments of the present disclosure.
Figure 22D:
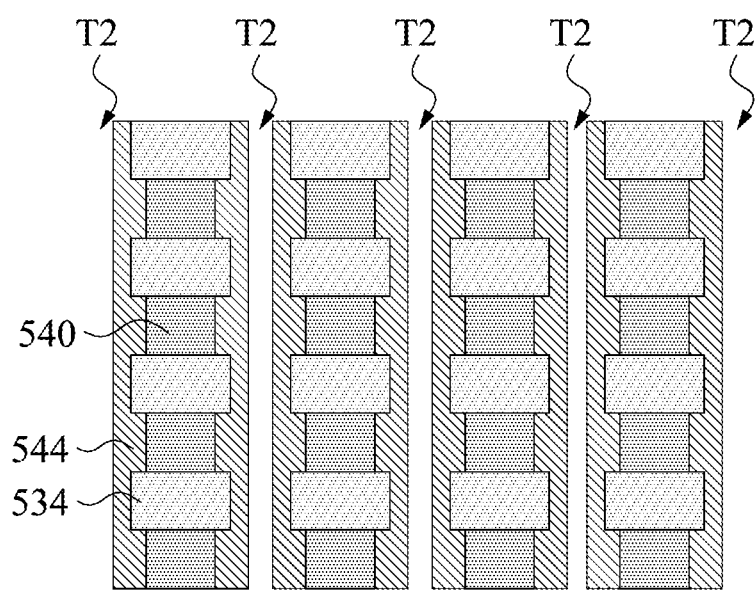
FIG. 22D is a cross-sectional view taken along line D-D of FIG. 22A in accordance with some embodiments of the present disclosure.
Figure 23A:
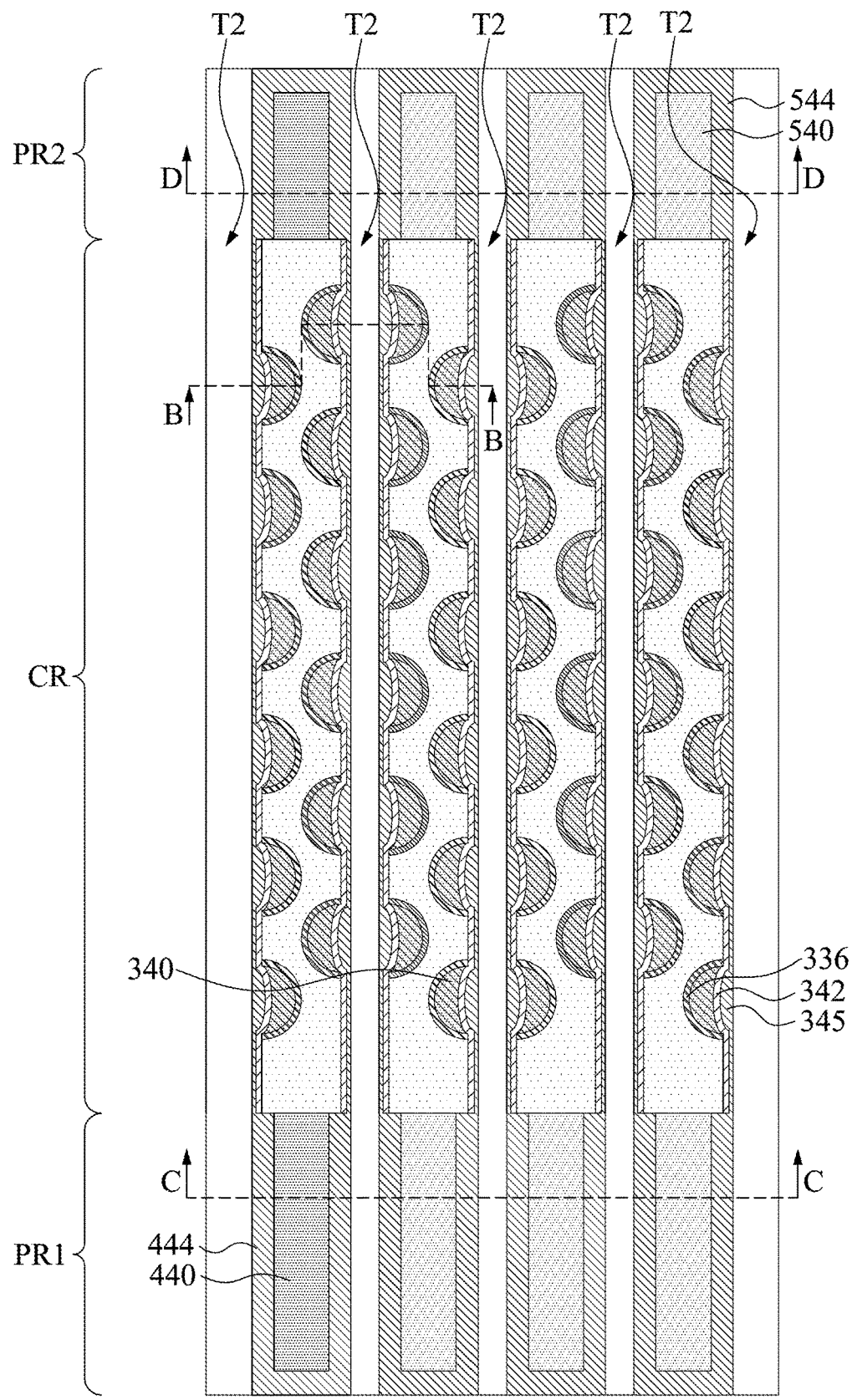
Figure 23B:
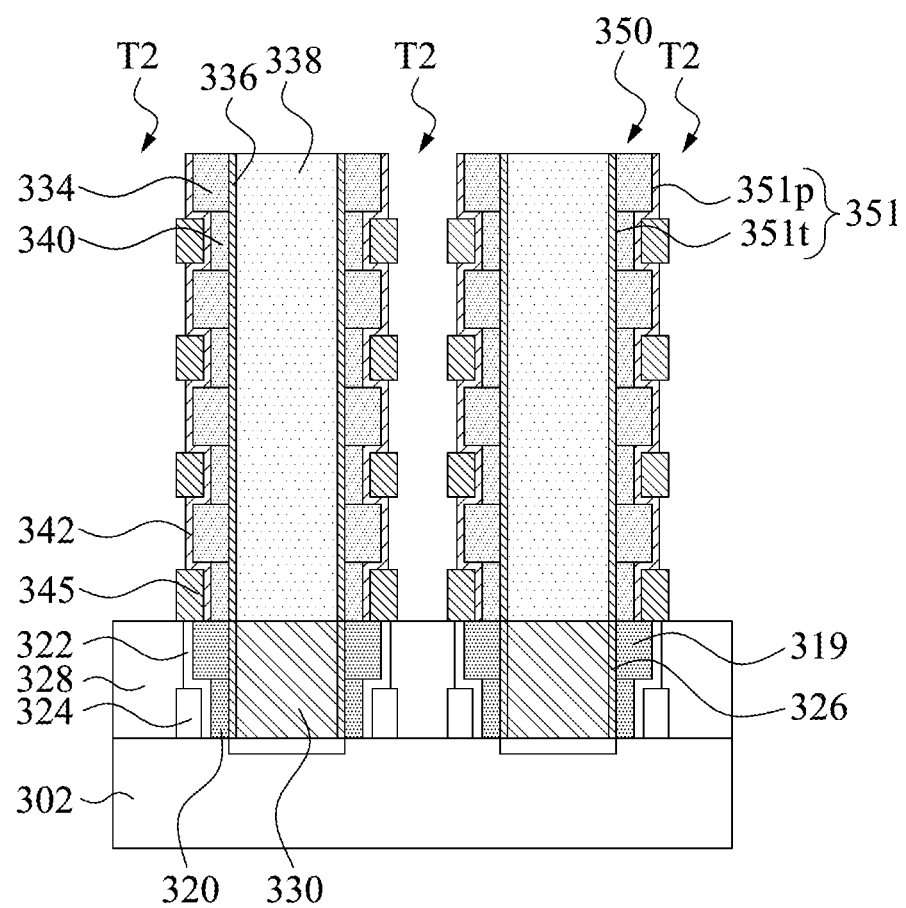
FIG. 23B is a cross-sectional view taken along line B-B of FIG. 23A in accordance with some embodiments of the present disclosure.
Figure 23C:
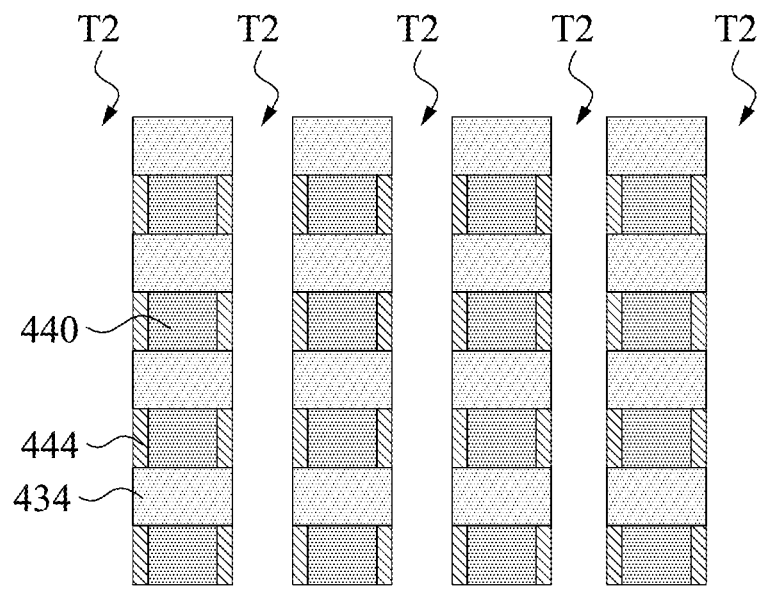
FIG. 23C is a cross-sectional view taken along line C-C of FIG. 23A in accordance with some embodiments of the present disclosure.
Figure 23D:
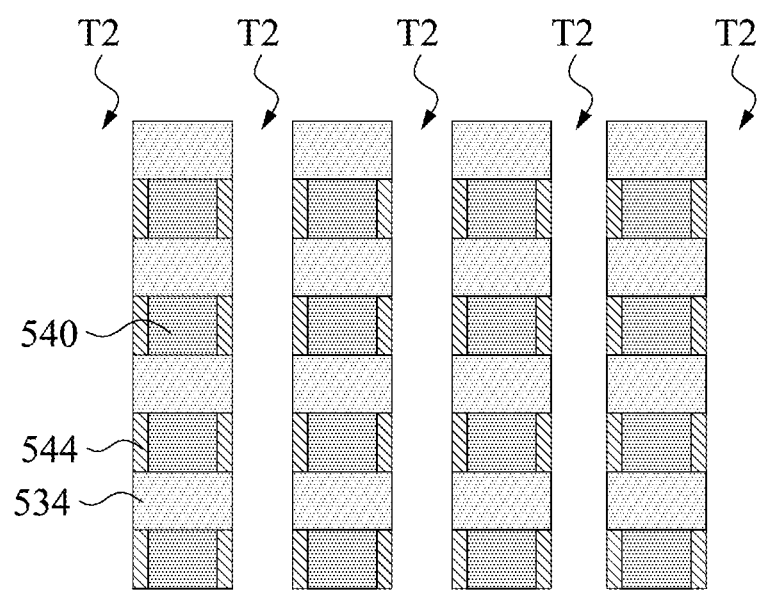
FIG. 23D is a cross-sectional view taken along line D-D of FIG. 23A in accordance with some embodiments of the present disclosure.

Referring to FIG. 22A, depositing the conductive layer 344 also results in depositing the conductive layer 444 wrapping around the fourth polysilicon layer 440 in the peripheral region PR1 to form a U-shaped structure in top view, and depositing the conductive layer 544 wrapping around the fourth polysilicon layer 540 in the peripheral region PR2 to form a reversed U-shaped structure in top view.

Referring to FIGS. 23A to 23D, an DTI etching process is performed such that portions of the conductive layer 344 outside the recesses R1 between vertically neighboring third polysilicon layers 334 are removed, while remaining portions of the conductive layer 344 in the recesses R1 to serve as word lines 345 vertically arranged in an alternating manner with the third polysilicon layers 334 so as to form flash memory cell. In some embodiments, the embedded portions of the word lines 345 are alternatingly arranged with the peaks 351$p$. In some embodiments, the etching process may use either dry or wet etching. When dry etching is used, the process gas may include $CF_4$, $CHF_3$, $NF_3$, $SF_6$, $Br_2$, HBr, $Cl_2$, or combinations thereof. Diluting gases such as $N_2$, $O_2$, or Ar may optionally be used. When wet etching is used, the etching solution (etchant) may include $NH_4OH$:$H_2O_2$:$H_2O$ (APM), $NH_2OH$, KOH, $HNO_3$:$NH_4F$:$H_2O$, and/or the like.

Figure 24A:
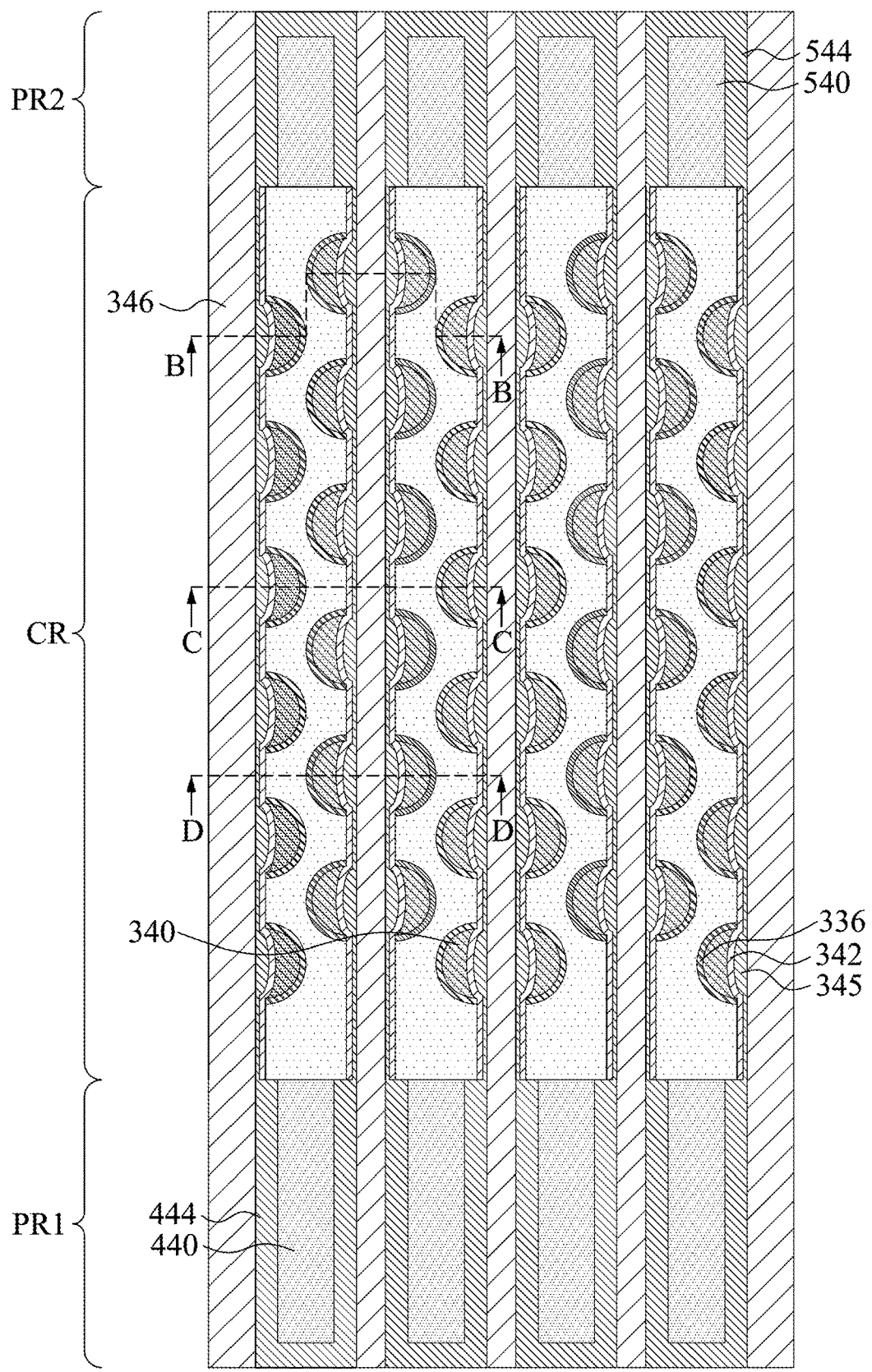
Figure 24B:
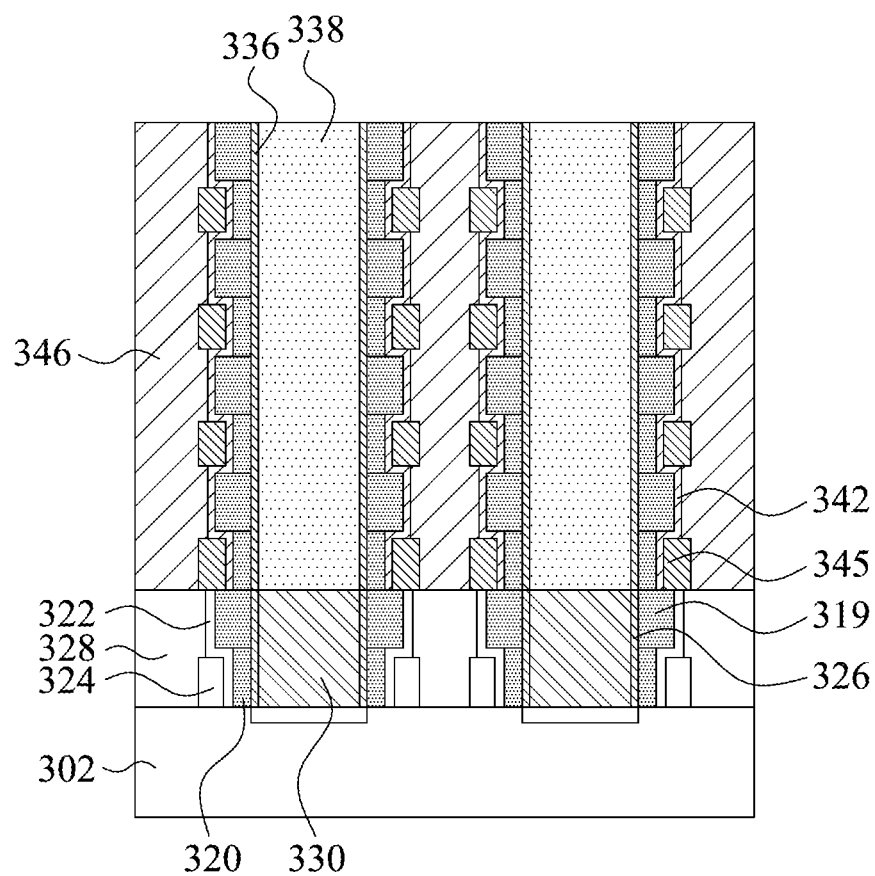
FIG. 24B is a cross-sectional view taken along line B-B of FIG. 24A in accordance with some embodiments of the present disclosure.
Figure 24C:
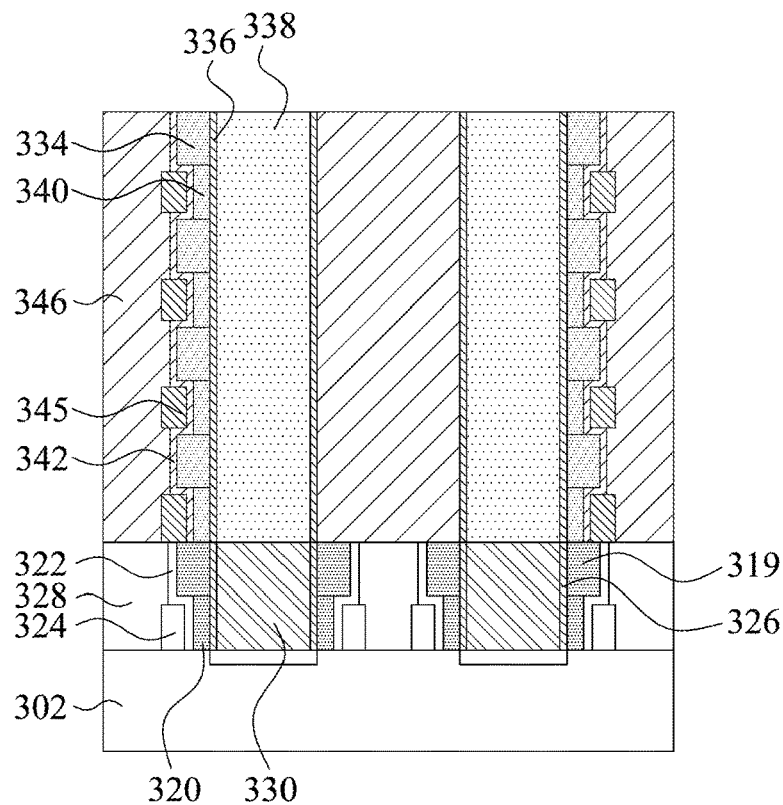
FIG. 24C is a cross-sectional view taken along line C-C of FIG. 24A in accordance with some embodiments of the present disclosure.
Figure 24D:
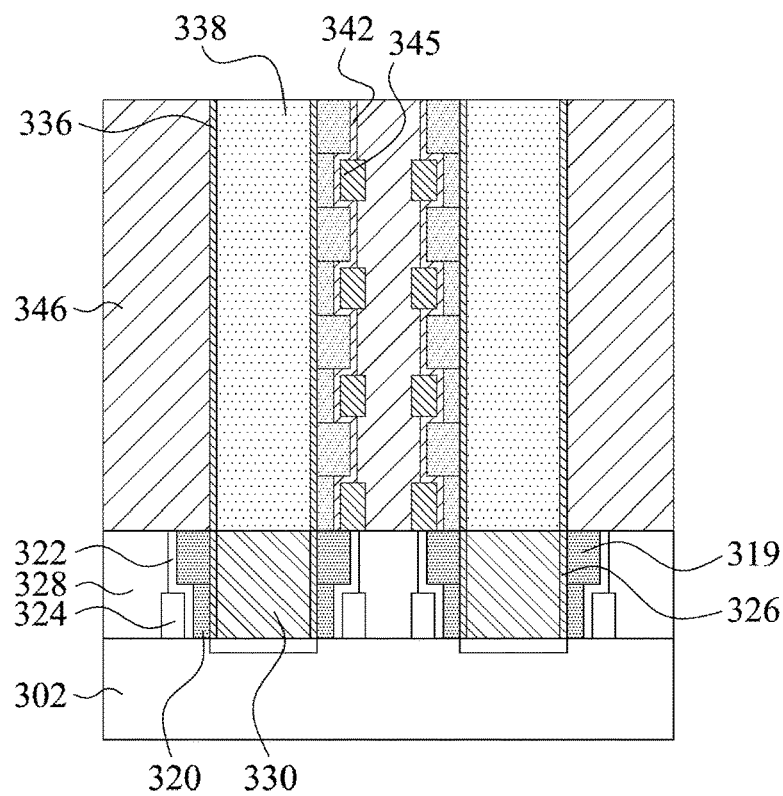
FIG. 24D is a cross-sectional view taken along line D-D of FIG. 24A in accordance with some embodiments of the present disclosure.

Referring to FIGS. 24A and 24B, the trenches T2 are filled with insulating materials to form another second DTI layer 346 in the trenches extending to the peripheral regions PR1 and PR2. In some embodiments, the second DTI layer 346 may include silicon oxide layer, silicon nitride layer or silicon oxynitride layer, and the like. The second DTI layer 346 may be formed by CVD, PECVD, ALD, or FCVD. A planarization process, such as a CMP process, may be performed to remove excess materials of the second DTI layer 346.

In some embodiments, the fabrication of string selection transistor SST is performed and the fabrication method of string selection transistor SST is the same as ground selection transistor GST (as shown in FIGS. 14A and 14B) by using several STI etching and forming a fifth polysilicon layer (not shown) and a sixth polysilicon layer (not shown). The detail fabrication method of string selection transistor SST is omitted here. Example string selection transistors SST are illustrated in FIG. 11 and discussed previously with respect to FIG. 11.

Figure 25:
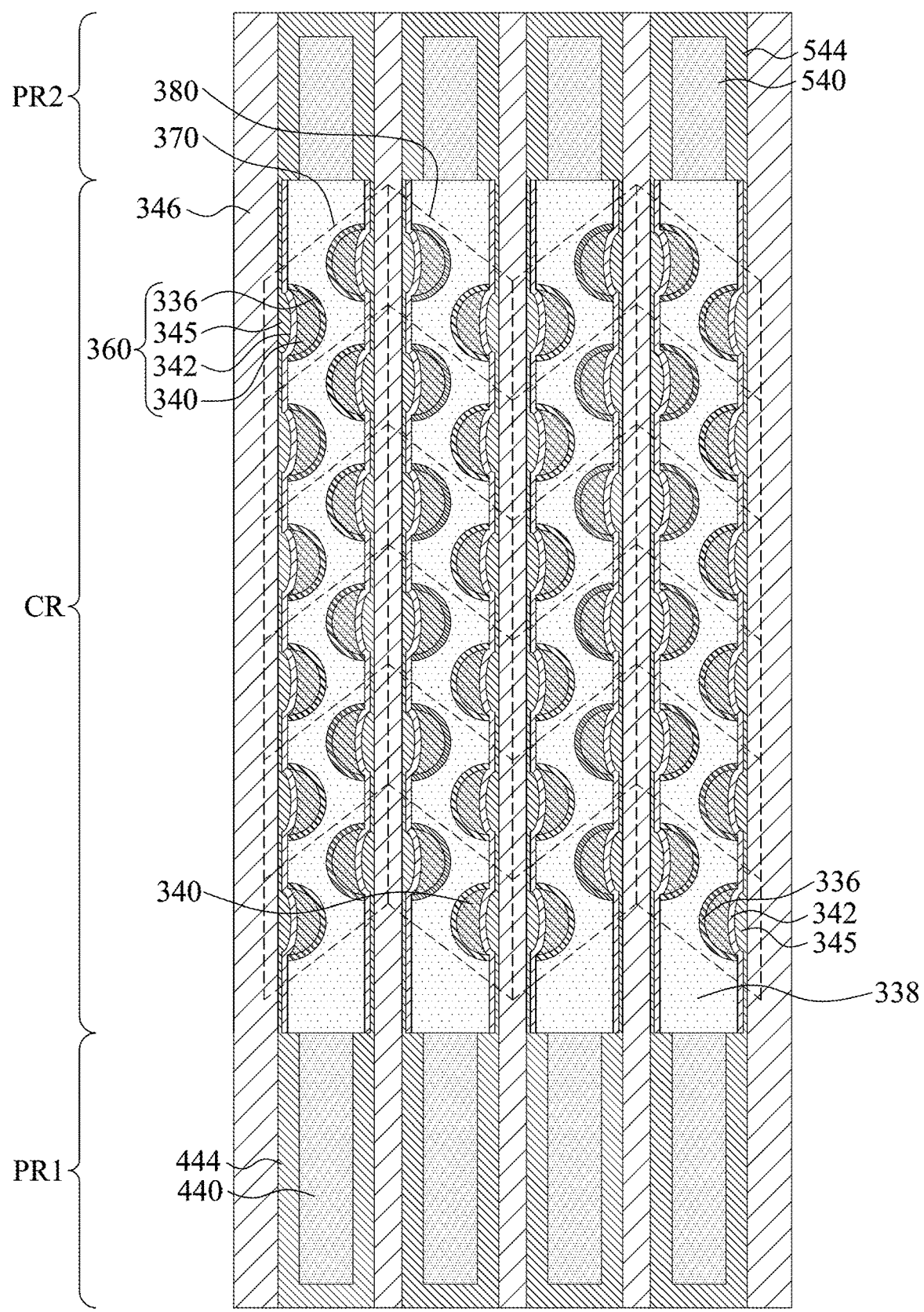

FIG. 25 illustrates a vertical transistor structure and arranges as asymmetrical structure in some embodiments. As shown in FIG. 25, a 3D-NAND flash includes a plurality of FanFET cells 360. Each FanFET cell 360 includes the second liner layers 336, the fourth polysilicon layer 340, the second gate dielectric layer 342, and the word lines 345. Each first unit 370 and each second unit 380 respectively include two FanFET cells 360 which are asymmetrical with each other. In some embodiments, the FanFET cells 360 may arrange asymmetrical with each other so as to improve its structure density. In further embodiments, FanFET may also arrange as compound hexagon (combined with six FanFET cells 360) so as to form the densest structure of FanFET which is called asymmetrical compound hexagon technology (ACHT). It is understood that the 3D-NAND flash is only one exemplary application of the FanFET cells 360 in some embodiments. In other embodiments, the FanFET cells 360 can be used in other applications, such as MRAM, ReRAM (RRAM), NAND, DRAM, NOR, and logic devices with/without specific materials.

Figure 26A:
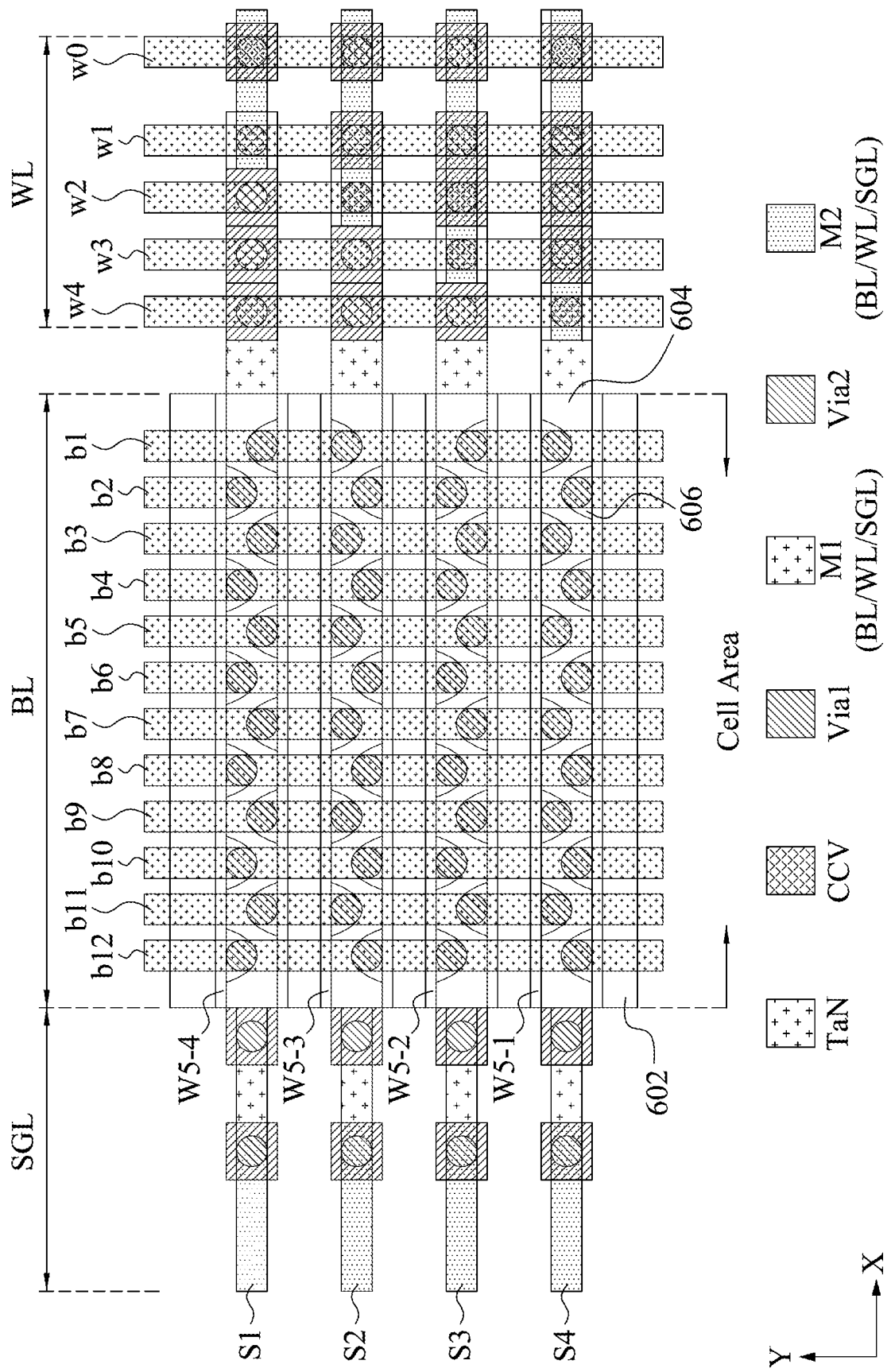
FIG. 26A is a top view of layout of back end of line (BEOL) of memory device in accordance with some embodiments of the present disclosure.
Figure 26B:
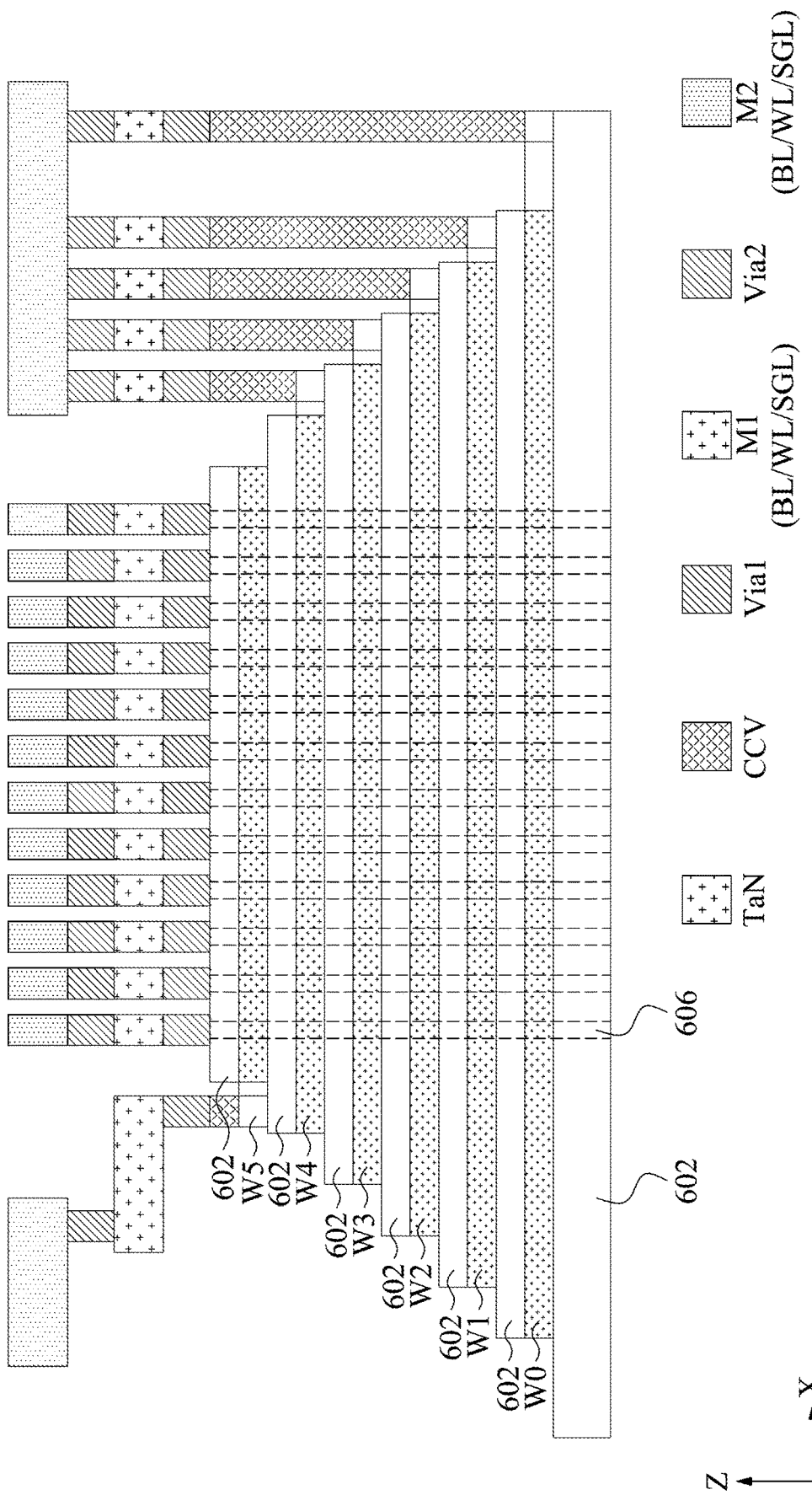
FIG. 26B is a cross-sectional view of memory device of BEOL in accordance with some embodiments of the present disclosure.

FIGS. 26A and 26B are a top view of layout and a cross-sectional view of back end of line (BEOL) of VC type of 3D-NAND flash in accordance with some embodiments of the present disclosure. As illustrated in FIGS. 26A and 26B, the BEOL of VC type of 3D-NAND flash includes a plurality of stripe shaped isolation layers 602, serpentine-shaped isolation layers 604, polysilicon layers 606, word lines (WL) w0 to w5, bit lines (BL) b1 to b12, select gate lines (SGL) s1 to s4, and metal layers M1 and M2. A plurality of word lines are formed on the both side of the serpentine-shaped isolation layers 604. The metal layers M1 and M2 may include a plurality of bit lines, word lines and select gate lines.

A plurality of vias, such as staircase via (also called cascade contact via, CCV), via 1, and via 2, may provide electrical connectivity between the metal layers including BL, WL, and SGL. Referring to FIG. 26A, the via 1 may provide electrical connectivity between SGL and WL. Then metal layer M1 may be designed as BL, for example, bit line b5. The via 1 may provide electrical connectivity between the metal layers including BL, WL, and SGL. For example, the via 1 may provide electrical connectivity between metal layer M1 and WL. The via 2 may also provide electrical connectivity between the metal layers including BL, WL, and SGL. For example, the via 2 may provide electrical connectivity between the metal layer M2 and WL.

Referring to FIG. 26B, the cascade contact via CCV may electrically connect from WL to via 1 of the metal layer M1, and then electrically connect to the metal layer M2 through via 2. For example, the uppermost word line w5 may electrically connect to the metal layer M1 through the cascade contact via CCV and via 1, and then electrically connect to SGL of the metal layer M2 through via 2.

In some embodiments, copper process BEOL of VC type of 3D-NAND flash is similar to the BEOL process as shown in FIGS. 26A and 26B. The cascade contact via CCV may electrically connect between SGL and WL. The double damascene (DD1) may include via 1 and the metal layer M1. Another double damascene (DD2) may include via 2 and the metal layer M2.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the invention. In view of the foregoing, it is intended that the present disclosure cover modifications and variations of this invention provided they fall within the scope of the following claims.

What is claimed is:

1. A transistor, comprising:
a substrate having a plurality of source/drain regions and a channel region between the source/drain regions;
a gate; and
a gate dielectric layer between the gate and the substrate, wherein the substrate tapers in a direction away from the gate dielectric layer in top view, and wherein the gate is embedded in the gate dielectric layer.

2. The transistor of claim 1, wherein the gate dielectric layer, the substrate and the gate form a semi-elliptical profile in top view.

3. The transistor of claim 1, wherein the gate dielectric layer is embedded in the substrate.

4. The transistor of claim 1, wherein the gate comprises a convex surface interfaced with the gate dielectric layer.

5. The transistor of claim 1, wherein the substrate comprises a concave surface interfaced with the gate dielectric layer.

6. The transistor of claim 1, wherein the gate and the substrate respectively comprise a convex surface and a concave surface, and the gate dielectric layer is between the convex surface and the concave surface.

7. The transistor of claim 1, further comprising:
a first isolation layer in which the substrate is embedded, wherein the first isolation layer has a serpentine shape in top view.

8. The transistor of claim 7, further comprising:
a second isolation layer, wherein the gate is between the second isolation layer and the gate dielectric layer, and the second isolation layer has a different shape from the first isolation layer in top view.

9. The transistor of claim 8, wherein the second isolation layer has a stripe shape in top view.

10. The transistor of claim 1, wherein the substrate tapers to a point.

11. A logic gate, comprising:
a first sub-layer comprising a first conductive connection element;
a second sub-layer over the first sub-layer, wherein the second sub-layer comprising a first via vertically connected to the first conductive connection element;
a third sub-layer over the second sub-layer and comprising a transistor region and a second conductive connection element horizontally connected to the transistor region, wherein the first via is vertically connected to the transistor region, and the transistor region comprises a plurality transistors of claim 1;
a fourth sub-layer comprising a second via vertically connected to the third sub-layer;
a fifth sub-layer over the fourth sub-layer and comprising a third conductive connection element, wherein the second via is vertically connected to the third conductive connection element; and
a through-silicon via vertically connected to the third conductive connection element.

12. The logic gate of claim 11, wherein the first sub-layer, the second sub-layer, the third sub-layer, the fourth sub-layer, the fifth sub-layer, and the through-silicon via are stacked in sequence.

13. The logic gate of claim 11, wherein the third sub-layer further comprises an input terminal that is horizontally connected to the second conductive connection element.

14. The logic gate of claim 13, wherein the transistors comprise a PMOS transistor and a NMOS transistor, a gate of the PMOS transistor is electrically connected to a gate of the NMOS transistor through the second conductive connection element, wherein the gate of the PMOS transistor and the gate of the NMOS transistor are as inputs.

15. The logic gate of claim 14, wherein the first sub-layer comprises an output terminal horizontally connected to the first conductive connection element, wherein a drain region of the PMOS transistor and a drain region of the NMOS transistor are as outputs.

16. The logic gate of claim 13, wherein the transistors comprise at least two PMOS transistors and at least two NMOS transistors, and wherein the PMOS transistors are electrically connected in parallel and the NMOS transistors are electrically connected in series.

17. The logic gate of claim 16, wherein the first sub-layer comprises an output terminal horizontally connected to the first conductive connection element.

18. The logic gate of claim 13, wherein the transistors comprise at least two PMOS transistors and at least two NMOS transistors, and wherein the PMOS transistors are electrically connected in series and the NMOS transistors are electrically connected in parallel.

19. The logic gate of claim 18, wherein the fifth sub-layer comprises an output terminal horizontally connected to the third conductive connection element.

20. The logic gate of claim 11, wherein the transistors of the third sub-layer comprise a first transistor, a second transistor, a third transistor, a fourth transistor, a fifth transistor, and a sixth transistor,
   wherein the first transistor and the second transistor define a first inverter, the third transistor and the fourth transistor define a second inverter, and the first inverter is electrically cross-coupled to the second inverter,
   wherein the first inverter and the second inverter electrically connected to the sixth transistor and the fifth transistor through the first sub-layer and the second sub-layer, respectively.

\* \* \* \* \*